(12) United States Patent
Tokunaga et al.

(10) Patent No.: US 9,865,746 B2
(45) Date of Patent: Jan. 9, 2018

(54) SEMICONDUCTOR DEVICE

(71) Applicant: Semiconductor Energy Laboratory Co., Ltd., Atsugi-shi, Kanagawa-ken (JP)

(72) Inventors: Hajime Tokunaga, Yokohama (JP); Junichi Koezuka, Tochigi (JP); Kenichi Okazaki, Tochigi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/071,723

(22) Filed: Mar. 16, 2016

(65) Prior Publication Data

US 2016/0197200 A1 Jul. 7, 2016

Related U.S. Application Data

(63) Continuation of application No. 14/089,085, filed on Nov. 25, 2013, now Pat. No. 9,324,810.

(30) Foreign Application Priority Data

Nov. 30, 2012 (JP) .................................. 2012-261919

(51) Int. Cl.
| | |
|---|---|
| *H01L 29/786* | (2006.01) |
| *H01L 29/22* | (2006.01) |
| *H01L 29/24* | (2006.01) |

(52) U.S. Cl.
CPC ........ *H01L 29/78696* (2013.01); *H01L 29/22* (2013.01); *H01L 29/247* (2013.01); (Continued)

(58) Field of Classification Search
CPC ............. H01L 29/78696; H01L 29/247; H01L 29/78693; H01L 29/78606; H01L 29/78648; H01L 29/7869; H01L 29/22
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| (Continued) | | |

FOREIGN PATENT DOCUMENTS

| | | |
|---|---|---|
| CN | 102656691 A | 9/2012 |
| CN | 102668098 A | 9/2012 |
| (Continued) | | |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Michael Jung
*Assistant Examiner* — Charles R Peters
(74) *Attorney, Agent, or Firm* — Robinson Intellectual Property Law Office; Eric J. Robinson

(57) ABSTRACT

A highly reliable semiconductor device having stable electrical characteristics is provided. Oxide films each containing one or more kinds of metal elements included in an oxide semiconductor film are formed in contact with an upper side and a lower side of the oxide semiconductor film where a channel is formed, whereby interface states are not easily generated at an upper interface and a lower interface of the oxide semiconductor film. A material which has a lower electron affinity than the oxide semiconductor film is used for the oxide films in contact with the oxide semiconductor film, whereby electrons flowing in the channel hardly move in the oxide films and mainly move in the oxide semiconductor film. Thus, even when an interface state exists between the oxide film and an insulating film formed on the outside of the oxide film, the state hardly influences the movement of electrons.

18 Claims, 31 Drawing Sheets

(52) U.S. Cl.
CPC .... *H01L 29/7869* (2013.01); *H01L 29/78606* (2013.01); *H01L 29/78648* (2013.01); *H01L 29/78693* (2013.01)

(56) References Cited

U.S. PATENT DOCUMENTS

| | | |
|---|---|---|
| 6,197,625 B1 | 3/2001 | Choi |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,598,670 B2 | 10/2009 | Kumaki et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,910,490 B2 | 3/2011 | Akimoto et al. |
| 7,932,521 B2 | 4/2011 | Akimoto et al. |
| 7,977,255 B1 | 7/2011 | Scheer et al. |
| 7,994,500 B2 | 8/2011 | Kim et al. |
| 8,049,225 B2 | 11/2011 | Yamazaki et al. |
| 8,058,645 B2 | 11/2011 | Jeong et al. |
| 8,058,647 B2 | 11/2011 | Kuwabara et al. |
| 8,129,719 B2 | 3/2012 | Yamazaki et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,247,276 B2 | 8/2012 | Kondo et al. |
| 8,274,077 B2 | 9/2012 | Akimoto et al. |
| 8,274,078 B2 | 9/2012 | Itagaki et al. |
| 8,344,387 B2 | 1/2013 | Akimoto et al. |
| 8,466,463 B2 | 6/2013 | Akimoto et al. |
| 8,502,221 B2 | 8/2013 | Yamazaki |
| 8,530,285 B2 | 9/2013 | Yamazaki et al. |
| 8,629,438 B2 | 1/2014 | Yamazaki |
| 8,686,425 B2 | 4/2014 | Yamazaki et al. |
| 8,692,252 B2 | 4/2014 | Takata et al. |
| 8,728,883 B2 | 5/2014 | Yamazaki et al. |
| 8,748,886 B2 | 6/2014 | Yamazaki et al. |
| 8,772,768 B2 | 7/2014 | Yamazaki |
| 8,890,152 B2 | 11/2014 | Yamazaki et al. |
| 8,901,557 B2 | 12/2014 | Yamazaki |
| 8,987,731 B2 | 3/2015 | Yamazaki |
| 9,054,134 B2 | 6/2015 | Yamazaki et al. |
| 9,059,295 B2 | 6/2015 | Yamazaki |
| 9,142,648 B2 | 9/2015 | Yamazaki |
| 9,281,358 B2 | 3/2016 | Yamazaki et al. |
| 9,472,659 B2 | 10/2016 | Noh et al. |
| 9,601,602 B2 | 3/2017 | Yamazaki |
| 9,634,082 B2 | 4/2017 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0047785 A1 | 3/2003 | Kawasaki et al. |
| 2003/0189401 A1 | 10/2003 | Kido et al. |
| 2003/0218222 A1 | 11/2003 | Wager, III et al. |
| 2003/0228760 A1 | 12/2003 | Shiraishi et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0044714 A1 | 3/2007 | White |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0191204 A1 | 8/2008 | Kim et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0206332 A1 | 8/2009 | Son et al. |
| 2009/0236655 A1 | 9/2009 | Choi et al. |
| 2009/0239335 A1 | 9/2009 | Akimoto et al. |
| 2009/0250693 A1 | 10/2009 | Jeong et al. |
| 2009/0278120 A1 | 11/2009 | Lee et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |

(56) References Cited

U.S. PATENT DOCUMENTS

| | | |
|---|---|---|
| 2009/0321731 A1 | 12/2009 | Jeong et al. |
| 2009/0321732 A1 | 12/2009 | Kim et al. |
| 2010/0032668 A1 | 2/2010 | Yamazaki et al. |
| 2010/0038641 A1 | 2/2010 | Imai |
| 2010/0051937 A1 | 3/2010 | Kaji et al. |
| 2010/0065837 A1 | 3/2010 | Omura et al. |
| 2010/0065842 A1 | 3/2010 | Yamazaki et al. |
| 2010/0065844 A1 | 3/2010 | Tokunaga |
| 2010/0073268 A1 | 3/2010 | Matsunaga et al. |
| 2010/0092800 A1 | 4/2010 | Itagaki et al. |
| 2010/0109002 A1 | 5/2010 | Itagaki et al. |
| 2010/0117078 A1 | 5/2010 | Kuwabara et al. |
| 2010/0133530 A1 | 6/2010 | Akimoto et al. |
| 2010/0136743 A1 | 6/2010 | Akimoto et al. |
| 2010/0155716 A1 | 6/2010 | Cheong et al. |
| 2010/0181565 A1 | 7/2010 | Sakata et al. |
| 2010/0200843 A1 | 8/2010 | Arai et al. |
| 2010/0219410 A1 | 9/2010 | Godo et al. |
| 2010/0224873 A1 | 9/2010 | Sakata et al. |
| 2010/0264412 A1 | 10/2010 | Yamazaki et al. |
| 2010/0295041 A1 | 11/2010 | Kumomi et al. |
| 2010/0320458 A1 | 12/2010 | Umeda et al. |
| 2010/0320459 A1 | 12/2010 | Umeda et al. |
| 2011/0049508 A1 | 3/2011 | Kawamura et al. |
| 2011/0065216 A1 | 3/2011 | Kaji et al. |
| 2011/0089417 A1 | 4/2011 | Yamazaki et al. |
| 2011/0104851 A1 | 5/2011 | Akimoto et al. |
| 2011/0114947 A1 | 5/2011 | Iwasaki |
| 2011/0117697 A1 | 5/2011 | Akimoto et al. |
| 2011/0121290 A1 | 5/2011 | Akimoto et al. |
| 2011/0127523 A1 | 6/2011 | Yamazaki |
| 2011/0140100 A1* | 6/2011 | Takata ............. H01L 29/7869 257/43 |
| 2011/0156026 A1 | 6/2011 | Yamazaki et al. |
| 2011/0163311 A1 | 7/2011 | Akimoto et al. |
| 2011/0193083 A1 | 8/2011 | Kim et al. |
| 2011/0240990 A1 | 10/2011 | Yamazaki |
| 2011/0240991 A1 | 10/2011 | Yamazaki |
| 2011/0240992 A1 | 10/2011 | Yamazaki |
| 2011/0240993 A1 | 10/2011 | Yamazaki |
| 2011/0240994 A1 | 10/2011 | Yamazaki |
| 2011/0248260 A1* | 10/2011 | Yamazaki ......... H01L 29/78606 257/43 |
| 2011/0248270 A1 | 10/2011 | Fukumoto et al. |
| 2011/1024099 | 10/2011 | Yamazaki |
| 2011/0284848 A1* | 11/2011 | Yamazaki ........... H01L 27/1225 257/57 |
| 2011/0298027 A1 | 12/2011 | Isobe et al. |
| 2011/0318875 A1 | 12/2011 | Yamazaki et al. |
| 2012/0001170 A1 | 1/2012 | Yamazaki |
| 2012/0026787 A1 | 2/2012 | Uochi et al. |
| 2012/0119205 A1 | 5/2012 | Taniguchi et al. |
| 2012/0132904 A1 | 5/2012 | Yamazaki |
| 2012/0138922 A1 | 6/2012 | Yamazaki et al. |
| 2012/0146042 A1 | 6/2012 | Kim et al. |
| 2012/0146713 A1 | 6/2012 | Kim et al. |
| 2012/0161122 A1 | 6/2012 | Yamazaki |
| 2012/0286278 A1 | 11/2012 | Kondo et al. |
| 2012/0305913 A1 | 12/2012 | Yamazaki et al. |
| 2012/0319102 A1 | 12/2012 | Yamazaki et al. |
| 2012/0319183 A1 | 12/2012 | Yamazaki et al. |
| 2013/0320334 A1 | 12/2013 | Yamazaki et al. |
| 2013/0334533 A1 | 12/2013 | Yamazaki |
| 2014/0008647 A1 | 1/2014 | Yamazaki |
| 2014/0014947 A1 | 1/2014 | Yamazaki |
| 2014/0027762 A1 | 1/2014 | Tsurume et al. |
| 2014/0042433 A1 | 2/2014 | Yamazaki |
| 2014/0042434 A1 | 2/2014 | Yamazaki |
| 2014/0042435 A1 | 2/2014 | Yamazaki |
| 2014/0042436 A1 | 2/2014 | Yamazaki |
| 2014/0042437 A1 | 2/2014 | Yamazaki |
| 2014/0042438 A1 | 2/2014 | Yamazaki |
| 2014/0110705 A1 | 4/2014 | Koezuka et al. |
| 2014/0138674 A1 | 5/2014 | Sato et al. |
| 2015/0118790 A1 | 4/2015 | Yamazaki et al. |
| 2015/0311347 A1 | 10/2015 | Yamazaki |
| 2017/0033110 A1 | 2/2017 | Shionoiri et al. |

FOREIGN PATENT DOCUMENTS

| | | |
|---|---|---|
| EP | 1737044 A | 12/2006 |
| EP | 2141743 A | 1/2010 |
| EP | 2141744 A | 1/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-273361 A | 9/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2008-218495 A | 9/2008 |
| JP | 2009-231613 A | 10/2009 |
| JP | 2009-277701 A | 11/2009 |
| JP | 2010-016347 A | 1/2010 |
| JP | 2010-016348 A | 1/2010 |
| JP | 4415062 | 2/2010 |
| JP | 2010-067954 A | 3/2010 |
| JP | 2010-186860 A | 8/2010 |
| JP | 4571221 | 10/2010 |
| JP | 2011-124360 A | 6/2011 |
| JP | 2011-216694 A | 10/2011 |
| JP | 2011-222767 A | 11/2011 |
| JP | 2011-228689 A | 11/2011 |
| JP | 2011-243745 A | 12/2011 |
| JP | 2011-258804 A | 12/2011 |
| JP | 2012-009843 A | 1/2012 |
| JP | 2012-059860 A | 3/2012 |
| WO | WO-2004/114391 | 12/2004 |
| WO | WO-2008/105250 | 9/2008 |
| WO | WO-2008/133345 | 11/2008 |
| WO | WO-2009/139428 | 11/2009 |
| WO | WO-2010/093051 | 8/2010 |
| WO | WO-2011/081000 | 7/2011 |
| WO | WO-2011/081009 | 7/2011 |
| WO | WO-2011/122363 | 10/2011 |
| WO | WO-2012/073918 | 6/2012 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU,or ZN] at Temperatures Over 1000°C", Journal of Solid State Chemistry, 1985, vol. 60, pp. 382-384.

Nakamura.M et al., "The phase relations in the In2O3-Ga2ZnO4-ZnO system at 1350°C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

(56) References Cited

OTHER PUBLICATIONS

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED ", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Park.S et al., "Challenge to Future Displays: Transparent AM-OLED Driven by Peald Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "Suftla Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous IN-GA-ZN-Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '04 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.
Ohara.H et al., "21.3:4.0 In. QVGA AMOLED Display Using IN-GA-ZN-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous IN-GA-ZN-Oxide TFT", SID Digest '09 : SID International Symposium Digest of Technical Papers, May 31, 2009, pp. 1110-1112.
Osada.T et al., "Development of Driver-Integrated Panel Using Amorphous IN-GA-ZN-Oxide TFT", AM-FPD '09 Digest of Technical Papers, Jul. 1, 2009, pp. 33-36.
Godo.H et al., "Temperature Dependence of Characteristics and Electronic Structure for Amorphous IN-GA-ZN-Oxide TFT", AM-FPD '09 Digest of Technical Papers, Jul. 1, 2009, pp. 41-44.
Ohara.H et al., "Amorphous IN-GA-ZN-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

(56) References Cited

OTHER PUBLICATIONS

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In-Ga-Zn-O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation with Ultraviolet Lamp", Journal of SOL-GEL Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-2008.

Taiwanese Office Action (Application No. 106103708) dated Jul. 18, 2017.

Chinese Office Action (Application No. 201310631139.1) dated Sep. 12, 2017.

\* cited by examiner

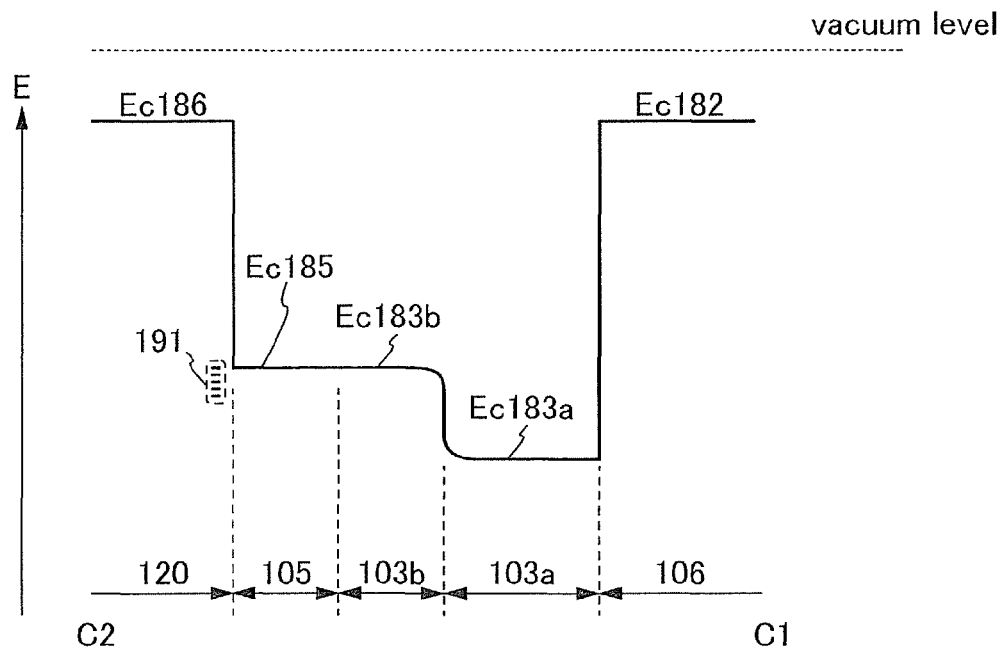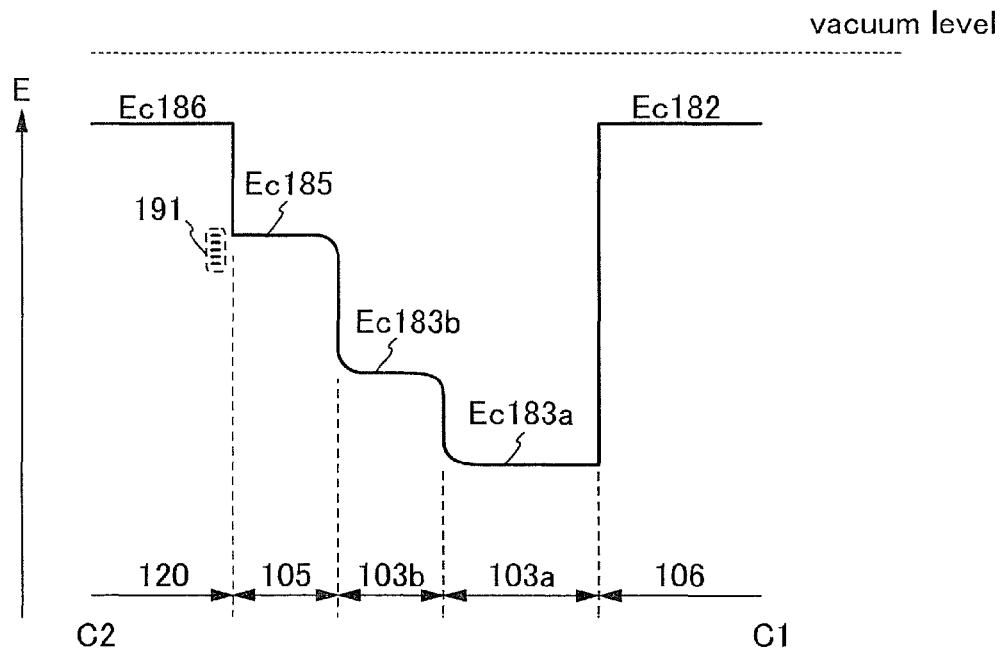

input voltage waveform output current waveform input voltage waveform output voltage waveform

SEMICONDUCTOR DEVICE

BACKGROUND OF THE INVENTION

1. Field of the Invention

The present invention relates to an object, a method, a manufacturing method, a process, a machine, a manufacture, or a composition of matter. In particular, the present invention relates to, for example, a semiconductor device, a display device, a light-emitting device, a driving method thereof, or a manufacturing method thereof.

In this specification, a semiconductor device means all types of devices that can function by utilizing semiconductor characteristics, and a transistor, a semiconductor circuit, a memory device, an imaging device, a display device, an electro-optical device, an electronic device, and the like are all semiconductor devices.

2. Description of the Related Art

A technique by which transistors are formed using semiconductor thin films has been attracting attention. The transistor is applied to a wide range of electronic devices such as an integrated circuit (IC) or an image display device. A silicon-based semiconductor material is widely known as a material for a semiconductor thin film applicable to a transistor. As another material, an oxide semiconductor has been attracting attention.

For example, a transistor using an amorphous oxide containing indium (In), gallium (Ga), and zinc (Zn) for a channel formation region of a transistor is disclosed (see Patent Document 1).

Further, it is known that oxygen is released from an oxide semiconductor in a manufacturing process, so that an oxygen vacancy is formed (see Patent Document 2).

REFERENCE

Patent Document

[Patent Document 1] Japanese Published Patent Application No. 2006-165528
[Patent Document 2] Japanese Published Patent Application No. 2011-222767

SUMMARY OF THE INVENTION

An oxygen vacancy generated in an oxide semiconductor film generates a localized level, which causes degradation of electrical characteristics of a semiconductor device such as a transistor including the oxide semiconductor film.

An interface state due to the oxygen vacancy is easily generated in the vicinity of the interface of the oxide semiconductor film with an insulating film which is stacked over the oxide semiconductor film. An increase in the interface states causes scattering of carriers or capture of carriers, which results in a decrease in field-effect mobility of a transistor or an increase in off-state current. The increase in the interface states also changes threshold voltage of a transistor, which causes an increase in variation of electrical characteristics. That is, the increase in the interface states degrades electrical characteristics of a transistor and reduces reliability of a transistor.

An object of one embodiment of the present invention is to provide an oxide semiconductor in which the density of localized levels is low. Another object of one embodiment of the present invention is to provide a semiconductor device having small variation in electrical characteristics. Another object of one embodiment of the present invention is to provide a highly reliable semiconductor device which exhibits stable electrical characteristics. Another object of one embodiment of the present invention is to provide a semiconductor device which has favorable electrical characteristics.

Another object of one embodiment of the present invention is to provide a semiconductor device in which a shift or a variation in the threshold voltage is small. Another object of one embodiment of the present invention is to provide a semiconductor device in which a reduction in electron mobility is inhibited. Another object of one embodiment of the present invention is to provide a semiconductor device in which an increase in off-state current is inhibited. Another object of one embodiment of the present invention is to provide a semiconductor device in which deterioration is small.

Note that the descriptions of these problems do not disturb the existence of other problems. Note that in one embodiment of the present invention, there is no need to achieve all the objects. Other objects will be apparent from and can be derived from the description of the specification, the drawings, the claims, and the like.

An oxide film containing one or more kinds of metal elements included in an oxide semiconductor film is formed in contact with the oxide semiconductor film where a channel is formed. In such a multilayer film of the oxide film and the oxide semiconductor film, an interface state is not easily generated at the interface in the multilayer film.

The oxide film is provided on at least a top surface of the oxide semiconductor film. Specifically, the oxide film containing one or more kinds of metal elements included in an oxide semiconductor film is formed in contact with the top surface of the oxide semiconductor film. Thus, interface states at an upper interface of the oxide semiconductor film can be reduced.

In this case, for example, generation of interface states can be further suppressed than the case where an insulating film is provided over an oxide semiconductor film.

A material which has a lower electron affinity than the oxide semiconductor film is used for the oxide films in contact with the oxide semiconductor film. With such a structure, electrons which flow in the channel hardly move in the oxide films in contact with the oxide semiconductor film and mainly move in the oxide semiconductor film. Accordingly, even when an interface state exists between the oxide film and an insulating film which is formed on the outside of the oxide film, the state hardly influences the movement of electrons.

That is, although a trap level derived from an impurity or a defect is formed in the vicinity of the interface between the oxide film and the insulating film, the oxide semiconductor film can be separated from the trap level because the oxide film is provided between the oxide film and the oxide semiconductor film.

When an oxide film is further provided between the insulating film and the oxide film in contact with the oxide semiconductor film, the oxide semiconductor film can be further separated from the trap level. Note that the oxide film provided between the insulating film and the oxide film in contact with the oxide semiconductor film preferably contains at least one metal element that is the same as that contained in the oxide film in contact with the oxide semiconductor film.

It is preferable that the oxide film provided between the insulating film and the oxide film in contact with the oxide semiconductor film have a lower electron affinity than the oxide film in contact with the oxide semiconductor film.

One embodiment of the present invention is a semiconductor device including a first electrode, a first insulating film, a multilayer film in which an oxide semiconductor film and a first oxide film are stacked, a second electrode, a third electrode, and a second oxide film. The first insulating film is provided over the first electrode. The multilayer film overlaps with the first electrode with the first insulating film laid between the multilayer film and the first electrode. The second electrode and the third electrode are in contact with part of the multilayer film. The second oxide film is in contact with top surfaces of the multilayer film, the second electrode, and the third electrode.

Further, the multilayer film of the semiconductor device can employ not only a structure in which the oxide film is provided on the top surface of the oxide semiconductor film, but also a structure in which the oxide films are provided on the top surface and the bottom surface of the oxide semiconductor film.

One embodiment of the present invention is a semiconductor device including a first electrode, a first insulating film, a multilayer film in which an oxide semiconductor film, a first oxide film, and a second oxide film are stacked, a second electrode, a third electrode, and a third oxide film. The first insulating film is provided over the first electrode. The multilayer film overlaps with the first electrode with the first insulating film laid between the multilayer film and the first electrode. The second electrode and the third electrode are in contact with part of the multilayer film. The third oxide film is in contact with top surfaces of the multilayer film, the second electrode, and the third electrode.

Further, in one embodiment of the present invention, an insulating film may be in contact with a top surface of an oxide film which is in contact with top surfaces of a multilayer film, a second electrode, and a third electrode. The insulating film has a single-layer structure or a stacked-layer structure and preferably includes at least an oxide insulating film in which the oxygen content is higher than that in the stoichiometric composition. By providing the insulating film, oxygen in the oxide insulating film can be supplied to the oxide semiconductor film by heat treatment in the manufacturing process of the semiconductor device, so that the oxygen vacancies in the oxide semiconductor film can be filled.

Note that the first electrode can function as a gate electrode, one of the second electrode and the third electrode can function as a source electrode, and the other of the second electrode and the third electrode can function as a drain electrode.

According to one embodiment of the present invention, an oxide semiconductor in which the density of localized levels is low can be provided.

According to one embodiment of the present invention, a semiconductor device having small variation in electrical characteristics can be provided.

According to one embodiment of the present invention, a highly reliable semiconductor device which exhibits stable electrical characteristics can be provided.

According to one embodiment of the present invention, a semiconductor device which has favorable electrical characteristics can be provided.

BRIEF DESCRIPTION OF THE DRAWINGS

In the accompanying drawings:

FIGS. 2A and 2B each illustrate an energy band structure of a multilayer film;

DETAILED DESCRIPTION OF THE INVENTION

Figure 1C:
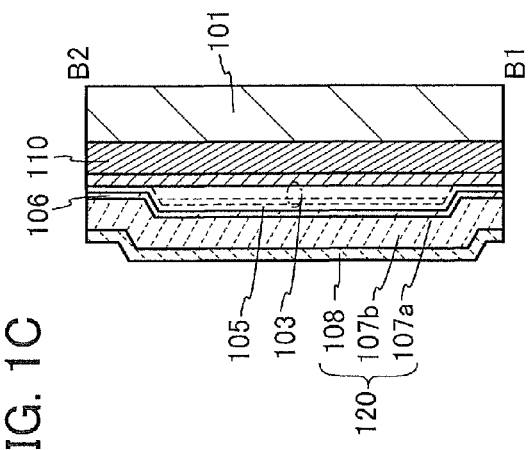
FIGS. 1A to 1D are a top view and cross-sectional views illustrating an example of a transistor.

Hereinafter, embodiments of the present invention will be described in detail with reference to the accompanying drawings. However, the present invention is not limited to the description below and it is easily understood by those skilled in the art that the mode and details can be modified in various ways. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that the position, size, range, or the like of each structure illustrated in drawings and the like is not accurately represented in some cases for easy understanding. Therefore, the disclosed invention is not necessarily limited to the position, size, range, or the like as disclosed in the drawings and the like. For example, in the actual manufacturing process, a resist mask or the like might be unintentionally reduced in size by treatment such as etching, which is not illustrated in some cases for easy understanding. In this specification, resist masks are removed after etching even in the case where removal of the resist masks is not written in this specification.

Note that the ordinal numbers such as "first" and "second" are used for convenience in order to avoid confusion among components and do not denote the order or the priority, such as the order of steps and the stacking order of layers.

A voltage usually refers to a potential difference between a given potential and a reference potential (e.g., a source potential or a ground potential (GND)). Accordingly, a voltage can also be called a potential.

Note that in this specification and the like, the term "electrically connected" includes the case where components are connected through an object having any electric function. There is no particular limitation on an object having any electric function as long as electric signals can be transmitted and received between components that are connected through the object. Thus, even when the expression "electrically connected" is used in this specification, there is a case in which no physical connection is made and a wiring is just extended in an actual circuit.

Functions of a "source" and a "drain" are sometimes replaced with each other depending on the operating conditions, for example, when a transistor of opposite polarity is used or when the direction of current flowing is changed in circuit operation; thus, it is difficult to define which is a source or a drain. Therefore, the terms a "source" and a "drain" can be switched in this specification.

In addition, in this specification and the like, the term such as an "electrode" or a "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Embodiment 1

In this embodiment, as an example of one embodiment of a semiconductor device, a transistor 100 is described.
<Structural Example of Semiconductor Device>

Figure 1D:
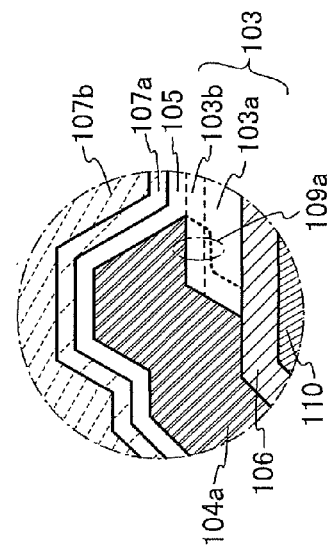
Figure 1A:
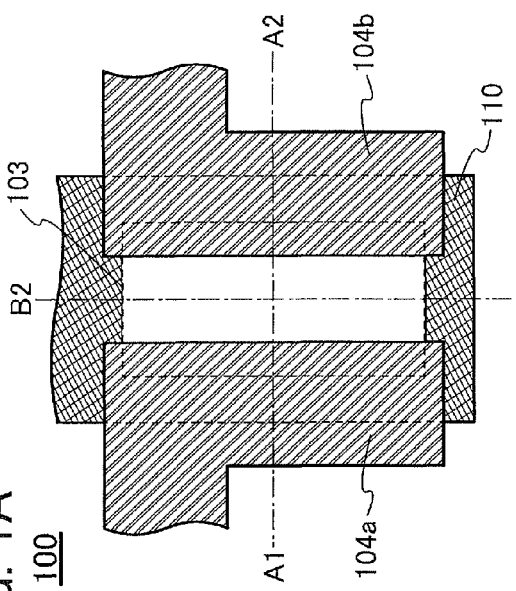
Figure 1B:
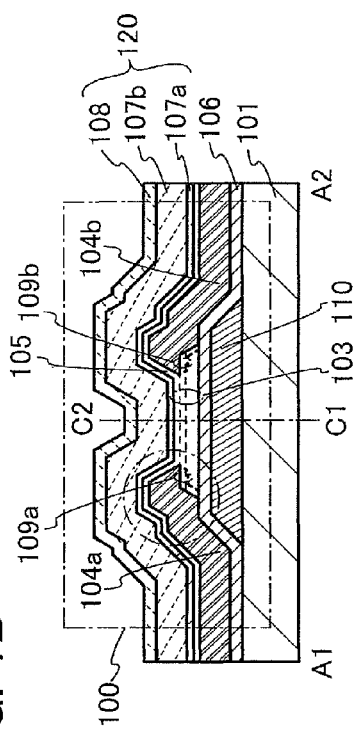

FIGS. 1A to 1D show the transistor 100 which is one embodiment of a semiconductor device. The transistor 100 is a bottom-gate transistor. FIG. 1A is a top view of the transistor 100. FIG. 1B is a cross-sectional view taken along dashed-dotted line A1-A2 in FIG. 1A and FIG. 1C is a cross-sectional view taken along dashed-dotted line B1-B2 in FIG. 1A. FIG. 1D is an enlarged view of a region surrounded by a dashed-dotted-line circle in FIG. 1B. Note that in FIG. 1A, some components are omitted.

The transistor 100 includes a gate electrode 110 over a substrate 101, a gate insulating film 106 over the gate electrode 110, a multilayer film 103 over the gate insulating film 106, a source electrode 104a and a drain electrode 104b over the multilayer film 103, and an oxide film 105 over the multilayer film 103, the source electrode 104a, and the drain electrode 104b. Note that an insulating film functioning as a base insulating film may be provided between the substrate 101 and the gate electrode 110.

The multilayer film 103 includes at least an oxide semiconductor film 103a and an oxide film 103b. The multilayer film 103 overlaps with the gate electrode 110 with the gate insulating film 106 provided therebetween. In the multilayer film 103 in this embodiment, the oxide semiconductor film 103a is provided in contact with the gate insulating film 106 and the oxide film 103b is provided over the oxide semiconductor film 103a. Note that the stacked structure of the multilayer film 103 is not limited thereto, and the oxide semiconductor film 103a may be provided over the oxide film 103b.

Further, depending on the kind of conductive film used for the source electrode 104a and the drain electrode 104b, oxygen is taken away from part of the multilayer film 103 or some elements contained in the conductive film are diffused to the multilayer film 103, so that a low-resistance region 109a and a low-resistance region 109b are formed in the multilayer film 103 in some cases. In FIGS. 1B and 1C, the low-resistance regions 109a and 109b are regions in the vicinity of an interface between the multilayer film 103 and the source electrode 104a and an interface between the multilayer film 103 and the drain electrode 104b in the multilayer film 103 (a region between the dashed line of the multilayer film 103 and the source electrode 104a and a region between the dashed line of the multilayer film 103 and the drain electrode 104b). Part or the whole of the low-resistance region 109a and part or the whole of the low-resistance region 109b function as a source region and a drain region.

In FIG. 1A, a distance between the source electrode 104a and the drain electrode 104b in a region overlapping with the gate electrode 110 is referred to as a channel length. Note that in the case where the transistor includes the source region and the drain region, a distance between the low-resistance region 109a and the low-resistance region 109b in the region overlapping with the gate electrode 110 may be referred to as a channel length.

In the multilayer film 103, a region which overlaps with the gate electrode 110 and is sandwiched between the source electrode 104a and the drain electrode 104b is referred to as a channel formation region (see FIG. 1B). Further, a region through which current mainly flows in the channel formation region is referred to as a channel region. Here, the channel region refers to a portion of the oxide semiconductor film 103a in the channel formation region.

In the multilayer film 103, a boundary between the oxide semiconductor film 103a and the oxide film 103b is not clearly observed in some cases depending on the materials used for the oxide semiconductor film 103a and the oxide film 103b. Further, a boundary between the multilayer film 103 and the oxide film 105 is also not clearly observed in some cases depending on the materials used for the multilayer film 103 and the oxide film 105. Thus, in FIGS. 1A to 1D, the boundaries between the oxide semiconductor film 103a and the oxide film 103b, and between the oxide film 103b and the oxide film 105 are represented by dashed lines.

The multilayer film 103 is provided to be smaller than the gate electrode 110 in the channel length direction and in the channel width direction of the transistor 100 (see FIGS. 1A to 1C). Such a shape can inhibit entry of light from the rear surface of the substrate 101 to the multilayer film 103, so that the reliability of the transistor 100 can be improved. Note that the shape of the multilayer film 103 is not limited to the shape illustrated in FIGS. 1A to 1C. For example, the multilayer film 103 may be provided to be larger than the gate electrode 110 in the channel length direction of the transistor 100.

The oxide film 105 is in contact with the top surfaces of the multilayer film 103 (the oxide film 103b in FIGS. 1A to 1D), the source electrode 104a, and the drain electrode 104b.

Moreover, an insulating film 120 which functions as a protective insulating film is preferably provided over the oxide film 105. The insulating film 120 has a single-layer structure or a stacked-layer structure and preferably includes an oxide insulating film in which the oxygen content is higher than that in the stoichiometric composition. In particular, the insulating film 120 preferably has a structure in which an oxide insulating film 107a, an oxide insulating film 107b, and a nitride insulating film 108 are stacked. In the case where the insulating film 120 has such a stacked-layer structure, the oxide insulating film 107b preferably contains oxygen at a higher proportion than the stoichiometric composition. With such a structure, oxygen in the oxide insulating film can be supplied to an oxide semiconductor film by heat treatment in the manufacturing process of the transistor 100, so that the oxygen vacancies in the oxide semiconductor film can be filled. Thus, the reliability of the transistor 100 can be improved.

[Multilayer Film and Oxide Film in Contact with the Multilayer Film]

The multilayer film 103, the oxide semiconductor film 103a and the oxide film 103b included in the multilayer film 103, and the oxide film 105 are described below.

The oxide semiconductor film 103a and the oxide film 103b each include one of or both In and Ga. Typically, an In—Ga oxide (an oxide containing In and Ga), an In—Zn oxide (an oxide containing In and Zn), and an In-M-Zn oxide (an oxide contains In, an element M, and Zn, and the element M is one or more kinds of elements selected from Al, Ti, Ga, Y, Zr, La, Ce, Nd, and Hf) can be used.

Further, the oxide film 103b, which is in contact with the oxide semiconductor film 103a, is preferably formed using a material including one or more kinds of metal elements included in the oxide semiconductor film 103a. By using such a material, an interface state between the oxide semiconductor film 103a and the oxide film 103b cannot easily occur. Thus, scattering of carriers or capture of carriers at the interface can be reduced, so that the field-effect mobility of the transistor can be improved. Further, variation in threshold voltage of the transistor can be reduced.

The oxide semiconductor film 103a and the oxide film 103b are successively formed under an inert gas atmosphere, an oxidation gas atmosphere, or a reduced pressure without exposure to the air during the formation steps, whereby the interface state between the oxide semiconductor film 103a and the oxide film 103b can be further reduced.

The thickness of the oxide semiconductor film 103a is greater than or equal to 3 nm and less than or equal to 200 nm, preferably greater than or equal to 3 nm and less than or equal to 100 nm, more preferably greater than or equal to 3 nm and less than or equal to 50 nm. The thickness of the oxide film 103b is greater than or equal to 3 nm and less than or equal to 50 nm, preferably greater than or equal to 3 nm and less than or equal to 20 nm.

In the transistor 100 described in this embodiment, the source electrode 104a and the drain electrode 104b are in contact with the oxide film 103b. In order to reduce connection resistance between the source electrode 104a and the oxide semiconductor film 103a and between the drain electrode 104b and the oxide semiconductor film 103a, the oxide film 103b is preferably formed as thin as possible.

When each of the oxide semiconductor film 103a and the oxide film 103b is an In-M-Zn oxide and the oxide film 103b and the oxide semiconductor film 103a contain In, M, and Zn at an atomic ratio of $x_1:y_1:z_1$ and an atomic ratio of $x_2:y_2:z_2$ respectively, $y_1/x_1$ needs to be larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the oxide semiconductor film 103a and the oxide film 103b in which $y_1/x_1$ is 1.5 times or more as large as $y_2/x_2$ are selected. More preferably, the oxide semiconductor film 103a and the oxide film 103b in which $y_1/x_1$ is twice or more as large as $y_2/x_2$ are selected. Still further preferably, the oxide semiconductor film 103a and the oxide film 103b in which $y_1/x_1$ is three times or more as large as $y_2/x_2$ are selected. At this time, $y_1$ is preferably greater than or equal to $x_1$ in the oxide semiconductor film 103a, in which case stable electrical characteristics of a transistor can be achieved. However, when $y_1$ is three times or more as large as $x_1$, the field-effect mobility of the transistor is reduced; accordingly, $y_1$ is preferably greater than or equal to $x_1$ and smaller than three times $x_1$. When the oxide film 103b has the above structure, the oxide film 103b can be a layer in which oxygen vacancies are less likely to occur than in the oxide semiconductor film 103a.

When the oxide semiconductor film 103a is an In-M-Zn oxide, it is preferable that, in the atomic ratio between In and M, the proportion of In be greater than or equal to 25 atomic % and the proportion of M be less than 75 atomic %, and it is more preferable that, in the atomic ratio between In and M, the proportion of In be greater than or equal to 34 atomic % and the proportion of M be less than 66 atomic %. When the oxide film 103b is an In-M-Zn oxide, it is preferable that, in the atomic ratio between In and M, the proportion of In be less than 50 atomic % and the proportion of M be greater than or equal to 50 atomic %, and it is more preferable that, in the atomic ratio between In and M, the proportion of In be less than 25 atomic % and the proportion of M be greater than or equal to 75 atomic %.

For example, the oxide semiconductor film 103a can be formed using an In—Ga—Zn oxide having an atomic ratio of In:Ga:Zn=1:1:1 or In:Ga:Zn=3:1:2 as a target and the oxide film 103b can be formed using an In—Ga—Zn oxide having an atomic ratio of In:Ga:Zn=1:3:2, In:Ga:Zn=1:6:4, or In:Ga:Zn=1:9:6 as a target. Note that a proportion of each atom in the atomic ratio of the oxide semiconductor film 103a and the oxide film 103b varies within a range of ±20% as an error.

In order to give stable electrical characteristics to the transistor including the multilayer film 103, it is preferable that the oxygen vacancies and the impurity concentration in the oxide semiconductor film 103a be reduced and the oxide semiconductor film 103a be an intrinsic or substantially intrinsic semiconductor film. In particular, the channel formation region in the oxide semiconductor film 103a is preferably regarded as intrinsic or substantially intrinsic. Specifically, the carrier density of the oxide semiconductor film 103a is smaller than $1\times10^{17}/cm^3$, smaller than $1\times10^{15}/cm^3$, or smaller than $1\times10^{13}/cm^3$.

In the oxide semiconductor film 103a, hydrogen, nitrogen, carbon, silicon, and metal elements other than main components serve as impurities. In order to reduce the concentration of impurities in the oxide semiconductor film 103a, it is preferable to also reduce the concentration of impurities in the oxide film 103b which is close to the oxide semiconductor film 103a to a value almost equal to that in the oxide semiconductor film 103a.

In particular, when silicon is contained in the oxide semiconductor film 103a at a high concentration, an impurity level caused by silicon is formed in the oxide semiconductor film 103a. The impurity level serves as a trap level, and may degrade electrical characteristics of a transistor. In order to reduce degradation of electrical characteristics of the transistor, the silicon concentration of the oxide semiconductor film 103a is smaller than $1\times10^{19}$ atoms/cm$^3$, preferably smaller than $5\times10^{18}$ atoms/cm$^3$, more preferably smaller than $1\times10^{18}$ atoms/cm$^3$. Further, the silicon concentration at the interface between the oxide semiconductor film 103a and the oxide film 103b is also in the above range.

Note that when silicon and carbon are contained in the oxide semiconductor film 103a at a high concentration, the crystallinity of the oxide semiconductor film 103a is lowered in some cases. In order not to lower the crystallinity of the oxide semiconductor film 103a, the concentration of carbon in the oxide semiconductor film 103a is set to be lower than $1\times10^{19}$ atoms/cm$^3$, preferably lower than $5\times10^{18}$ atoms/cm$^3$, further preferably lower than $1\times10^{18}$ atoms/cm$^3$. Moreover, in order not to lower the crystallinity of the oxide semiconductor film 103a, the concentration of silicon in the oxide semiconductor film 103a is preferably set to be lower than $1\times10^{19}$ atoms/cm$^3$, preferably lower than $5\times10^{18}$ atoms/cm$^3$, further preferably lower than $1\times10^{18}$ atoms/cm$^3$.

Further, hydrogen and nitrogen in the oxide semiconductor film 103a form donor levels, which increase carrier density. In order to make the oxide semiconductor film 103a intrinsic or substantially intrinsic, the concentration of hydrogen in the oxide semiconductor film 103a, which is measured by SIMS, is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. The concentration of nitrogen in the oxide semiconductor film 103a, which is measured by SIMS, is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Further, since the band gap of an oxide semiconductor is 2 eV or higher, in a transistor including an oxide semiconductor, leakage current when the transistor is off (also referred to as off-state current) is extremely small. Specifically, in a transistor whose channel length is 3 μm and channel width is 10 μm, the off-state current can be lower than $1\times10^{-20}$ A, preferably lower than $1\times10^{-22}$ A, further preferably lower than $1\times10^{-24}$ A. In other words, the on/off ratio of the transistor can be greater than or equal to 20 digits and less than or equal to 150 digits.

For the oxide film 105, the material which can be used for the oxide semiconductor film 103a and the oxide film 103b can be used as appropriate. The thickness of the oxide film 105 is greater than or equal to 3 nm and less than or equal to 100 nm, preferably greater than or equal to 3 nm and less than or equal to 50 nm.

Here, the crystallinities of the oxide semiconductor film 103a and the oxide film 103b, which are included in the multilayer film 103, and the crystallinity of the oxide film 105 are described.

In the multilayer film 103, the oxide semiconductor film 103a and the oxide film 103b each may be in a non-single-crystal state, for example. The non-single-crystal state is, for example, structured by at least one of c-axis aligned crystal (CAAC), polycrystal, microcrystal, and an amorphous part. Among c-axis aligned crystal (CAAC), an amorphous part has the highest density of defect levels, whereas CAAC has the lowest density of defect levels. Note that an oxide semiconductor film including CAAC is referred to as a CAAC-OS (c-axis aligned crystalline oxide semiconductor) film.

In the oxide semiconductor film 103, at least the oxide semiconductor film 103a includes a c-axis aligned crystalline oxide semiconductor (CAAC-OS) film, for example. In the CAAC-OS film, for example, c-axes are aligned, and a-axes and/or b-axes are not macroscopically aligned.

The oxide semiconductor film 103a may include a microcrystal, for example. A microcrystalline oxide semiconductor film includes microcrystal with a size greater than or equal to 1 nm and less than 10 nm, for example.

The oxide semiconductor film 103a may include an amorphous part, for example. An amorphous oxide semiconductor film, for example, includes an oxide semiconductor having disordered atomic arrangement and no crystalline component.

Alternatively, an amorphous oxide semiconductor film is, for example, absolutely amorphous and has no crystal part.

Note that the oxide semiconductor film 103a may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked-layer structure including a region of an amorphous oxide semiconductor, a region of a microcrystalline oxide semiconductor, and a region of a CAAC-OS, for example.

Note that the oxide semiconductor film 103a may include a single crystal, for example.

The oxide semiconductor film 103a preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits a cube whose one side is less than 10 nm, less than 5 nm, or less than 3 nm.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is from 80° to 100°, and accordingly includes a case where the angle is from 85° to 95°.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ at around 31° appears and a peak of 2θ at around 36° does not appear.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect levels. In some cases, oxygen vacancies in the oxide semiconductor film serve as carrier traps or serve as carrier generation sources when hydrogen is captured therein.

The state in which impurity concentration is low and density of defect levels is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect levels, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect levels has unstable electrical characteristics in some cases.

In a transistor using the CAAC-OS film, change in electrical characteristics due to irradiation with visible light or ultraviolet light is small. Thus, the transistor has high reliability.

In order that the oxide semiconductor film 103a is the CAAC-OS film, the surface where the oxide semiconductor film 103a is formed is preferably amorphous. When the surface where the oxide semiconductor film 103a is formed has high crystallinity, the crystallinity of the oxide semiconductor film 103a is easily disordered and the CAAC-OS film is not easily formed.

Note that the surface where the oxide semiconductor film 103a is formed may have crystallinity similar to that of a CAAC-OS film. In the case where the surface where the oxide semiconductor film 103a is formed has crystallinity similar to that of a CAAC-OS film, the oxide semiconductor film 103a easily becomes a CAAC-OS film.

Further, when the oxide semiconductor film 103a is a CAAC-OS film, the oxide film 103b formed over the oxide semiconductor film 103a easily becomes a CAAC-OS film.

Further, the oxide film 105 may be in a non-single-crystal state like the oxide semiconductor film 103a and the oxide film 103b. Alternatively, the oxide film 105 may be a CAAC-OS film. When the oxide film 103b is a CAAC-OS film, the oxide film 105 formed over the oxide film 103b easily becomes a CAAC-OS film. Note that the oxide film 105 may be amorphous or microcrystalline.

In the transistor including the multilayer film 103, the oxide semiconductor film 103a is a layer in which a channel is formed; thus, it is preferable that the oxide semiconductor film 103a have high crystallinity so that the transistor can have stable electric characteristics.

Localized levels of the multilayer film 103 are described below. By reducing the density of localized levels of the multilayer film 103, a transistor including the multilayer film 103 can have stable electrical characteristics. The localized levels of the multilayer film 103 can be measured by a constant photocurrent method (CPM).

In order that the transistor has stable electrical characteristics, the absorption coefficient due to the localized levels of the multilayer film 103 measured by CPM is preferably lower than $1 \times 10^{-3}$ cm$^{-1}$, further preferably lower than $3 \times 10^{-4}$ cm$^{-1}$. Further, when the absorption coefficient due to the localized levels of the multilayer film 103 measured by CPM is lower than $1 \times 10^{-3}$ cm$^{-1}$, preferably lower than $3 \times 10^{-4}$ cm$^{-1}$, the field-effect mobility of the transistor can be increased. In order that the absorption coefficient due to the localized levels of the multilayer film 103 measured by CPM is lower than $1 \times 10^{-3}$ cm$^{-1}$, preferably lower than $3 \times 10^{-4}$ cm$^{-1}$, the concentration of silicon, germanium, carbon, hafnium, titanium, and the like in the oxide semiconductor film 103a which form localized levels is preferably lower than $2 \times 10^{18}$ atoms/cm$^3$, further preferably lower than $2 \times 10^{17}$ atoms/cm$^3$.

In the CPM measurement, the amount of light with which a surface of the sample between electrodes (a surface of the multilayer film 103) is irradiated is adjusted so that a photocurrent value is kept constant in the state where voltage is applied between electrodes provided in contact with the multilayer film 103 that is the sample, and then an absorption coefficient is derived from the amount of the irradiation light at each wavelength. In the CPM measurement, when the sample has a defect, the absorption coefficient of energy which corresponds to a level at which the defect exists (calculated from a wavelength) is increased. The increase in the absorption coefficient is multiplied by a constant, whereby the defect density of the sample can be obtained.

The localized levels measured by CPM probably result from an impurity or a defect. In other words, a transistor which includes the multilayer film having a small absorption coefficient due to the localized levels measured by CPM can have stable electrical characteristics.

A function and an effect of the multilayer film 103 in this embodiment are described below with reference to energy band structure diagrams of FIGS. 2A and 2B. FIGS. 2A and 2B each show the energy band structure along dashed-dotted line C1-C2 in FIG. 1B.

In FIGS. 2A and 2B, Ec182, Ec183a, Ec183b, Ec185, and Ec186 represent the energies of the conduction band bottoms of the gate insulating film 106, the oxide semiconductor film 103a, the oxide film 103b, the oxide film 105, and the insulating film 120, respectively.

Here, the energy difference between the vacuum level and the conduction band bottom (the difference is also referred to as electron affinity) corresponds to a value obtained by subtracting an energy gap from the energy difference between the vacuum level and the valence band top (the difference is also referred to as an ionization potential). Note that the energy gap can be measured using a spectroscopic ellipsometer (UT-300 manufactured by HORIBA JOBIN YVON SAS.). Note that the energy difference between the vacuum level and the valence band top can be measured using an ultraviolet photoelectron spectroscopy (UPS) device (VersaProbe manufactured by ULVAC-PHI, Inc.).

Since the gate insulating film 106 and the insulating film 120 are insulators, Ec182 and Ec186 are closer to the vacuum level (have a smaller electron affinity) than Ec183a, Ec183b, and Ec185.

Further, Ec183b is closer to the vacuum level than Ec183a. Specifically, the energy difference between Ec183a and Ec183b is greater than or equal to 0.05 eV and less than or equal to 2 eV. Preferably, the lower limit of the energy difference is greater than or equal to 0.1 eV, more preferably greater than or equal to 0.15 eV. Preferably, the upper limit of the energy difference is less than or equal to 0.5 eV, more preferably less than or equal to 0.4 eV.

There is no barrier between the oxide semiconductor film 103a and the oxide film 103b and between the oxide film 103b and the oxide film 105, and the energy of the conduction band bottom smoothly varies. In other words, the energy of the conduction band bottom successively varies. This is because the oxide film 103b contains an element common to the oxide semiconductor film 103a, and oxygen moves between the oxide semiconductor film 103a and the oxide film 103b to form a mixed layer.

Thus, it can be said that no state or few states exist at the interface between the oxide semiconductor film 103a and the oxide film 103b and the interface between the oxide film 103b and the oxide film 105. Accordingly, electrons transfer mainly through the oxide semiconductor film 103a in the multilayer film 103 having the above energy band structure. That is, the channel region is formed in the oxide semiconductor film 103a. Therefore, even when a state exists at an interface with the insulating film that is the outside of the multilayer film 103, the state hardly influences the transfer of the electrons because the level exists apart from the channel region. In addition, since no state or few states exist between the layers included in the multilayer film 103, the transfer of electrons is not interrupted in the channel region. Accordingly, the oxide semiconductor film 103a of the multilayer film 103 has high electron mobility.

Particularly in FIG. 2A, in the case where the oxide film 105 and the oxide film 103b are formed using the same material, the energy of Ec185 and the energy of Ec183b are equivalent.

As shown in FIG. 2A, although a trap level 191 due to impurities or defects might be formed in the vicinity of the interface between the oxide film 105 and the insulating film 120, the oxide semiconductor film 103a can be distanced away from the trap level 191 owing to existence of the oxide films 103b and 105.

Further, as described above, in the regions where the source electrode 104a and the drain electrode 104b are in contact with the multilayer film 103, in order to reduce connection resistance between the source electrode 104a and the oxide semiconductor film 103a and between the drain electrode 104b and the oxide semiconductor film 103a, the oxide film 103b is preferably formed as thin as possible. However, when the oxide film 103b is thin, a problem in that the trap level 191 on the insulating film 120 side easily affects the oxide semiconductor film 103a is caused.

Thus, in one embodiment of the present invention, the oxide film 105 is provided between the oxide film 103b and the insulating film 120. When the oxide film 105 is provided between the oxide film 103b and the insulating film 120, the oxide semiconductor film 103a in the channel formation region can be distanced away from the trap level 191 on the insulating film 120 side, whereby the trap level 191 does not easily affect the oxide semiconductor film 103a.

However, in the case where an energy difference between Ec183a and Ec183b is small, electrons of the oxide semiconductor film 103a might reach the trap level 191 by passing over the energy difference. When the electrons are captured by the trap level 191, negative charge is generated at the interface with the insulating film, so that the threshold voltage of the transistor is shifted in the positive direction.

Thus, the energy difference between Ec183a and Ec183b is preferably in the above range. Accordingly, variation in the threshold voltage of the transistor 100 can be reduced and electrical characteristics of the transistor 100 can be improved.

As the material of the oxide film 105, the material which can be used for the oxide semiconductor film 103a and the oxide film 103b can be used as appropriate. In particular, the oxide film 105 is preferably formed using a material including one or more kinds of metal elements included in the oxide film 103b. There is no barrier between the oxide film 103b and the oxide film 105, and the energy of the conduction band bottom can smoothly vary.

In order to have the energy band structure shown in FIG. 2A, the oxide semiconductor film 103a is formed using an In—Ga—Zn oxide having an atomic ratio of In:Ga:Zn=1:1:1 as a target and the oxide film 103b and the oxide film 105 are each formed using an In—Ga—Zn oxide having an atomic ratio of In:Ga:Zn=1:3:2 as a target.

Note that the band gaps of the oxide films 103b and 105 are each preferably wider than the band gap of the oxide semiconductor film 103a.

In FIG. 2A, the oxide film 103b and the oxide film 105 are formed using materials whose conduction band bottoms have the same energy; however, the oxide film 105 may be formed using a material in which the energy of the conduction band bottom is closer to the vacuum level than the energy of the conduction band bottom of the oxide film 103b (see FIG. 2B).

Specifically, in the case where the oxide film 103b is formed using an In—Ga—Zn oxide having an atomic ratio of In:Ga:Zn=1:3:2 as a target, the oxide film 105 is formed using an In—Ga—Zn oxide having an atomic ratio of In:Ga:Zn=1:6:4 or In:Ga:Zn=1:9:4 as a target.

In other words, in the case where the oxide film 105 and the oxide film 103b are formed using an In-M-Zn oxide, an atomic ratio of an element M to In of the oxide film 105 is preferably greater than or equal to an atomic ratio of an element M to In of the oxide film 103b.

Also in the case of the energy band structure shown in FIG. 2B, as in the case of the energy band structure shown in FIG. 2A, there is no barrier between the oxide semiconductor film 103a and the oxide film 103b and between the oxide film 103b and the oxide film 105, and the energy of the conduction band bottom smoothly varies. In other words, the energy of the conduction band bottom successively varies. Thus, it can be said that no state or few states exist at the interface between the oxide semiconductor film 103a and the oxide film 103b and the interface between the oxide film 103b and the oxide film 105.

Further, in order to reduce influence of the trap level 191 due to impurities or defects, which is formed in the vicinity of the interface between the oxide film 105 and the insulating film 120, the energy difference between Ec183a and Ec183b and the energy difference between Ec183b and Ec185 are each greater than or equal to 0.05 eV and less than or equal to 2 eV. Preferably, the lower limit of the energy difference is greater than or equal to 0.1 eV, more preferably greater than or equal to 0.15 eV.

In this manner, also in the case of the energy band structure shown in FIG. 2B, the oxide semiconductor film 103a in the multilayer film 103 can have high electron mobility, variation in the threshold voltage can be reduced, so that the transistor 100 having favorable electrical characteristics can be achieved.

[Source Electrode and Drain Electrode]

The source electrode 104a and the drain electrode 104b are formed over and partly in contact with the multilayer film 103. As a conductive material for forming the source electrode 104a and the drain electrode 104b, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing any of these metal elements as a component; an alloy containing any of these metal elements in combination; or the like can be used. Alternatively, a semiconductor typified by polycrystalline silicon including an impurity element such as phosphorus, or silicide such as nickel silicide may be used. There is no particular limitation on the formation method of the conductive layer, and a variety of formation methods such as an evaporation method, a CVD method, a sputtering method, and a spin coating method can be employed.

The source electrode 104a and the drain electrode 104b can also be formed using a conductive material containing oxygen, such as indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to use a stacked-layer structure formed using the above conductive material containing oxygen and a material containing the above metal element.

The source electrode 104a and the drain electrode 104b may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

A material which is capable of removing oxygen from part of the multilayer film 103 to generate oxygen vacancies is preferably used for regions of the source and drain electrodes 104a and 104b which are in contact with at least the multilayer film 103. The carrier concentration of the regions of the multilayer film 103 in which oxygen vacancies are generated is increased and the resistance of the regions is reduced, so that the regions become low-resistance regions 109a and 109b. Accordingly, the low-resistance regions 109a and 109b can function as a source region and a drain region. Examples of the material which is capable of removing oxygen from the multilayer film 103 to generate oxygen vacancies include tungsten and titanium.

Depending on the materials and thickness of the multilayer film 103, all the regions of the multilayer film 103 that overlap with the source electrode 104a and the drain electrode 104b serve as the low-resistance region 109a and the low-resistance region 109b in some cases.

Formation of the low-resistance region 109a and the low-resistance region 109b in the multilayer film 103 makes it possible to reduce contact resistance between the multilayer film 103 and each of the source and drain electrodes 104a and 104b. Accordingly, the electrical characteristics of the transistor 100, such as the field-effect mobility and the threshold voltage, can be favorable.

In the case where a multilayer structure including a layer containing copper is used for the source electrode 104a and the drain electrode 104b, interface states might be formed at the interface between the oxide film 105 and the insulating film 120 by the influence of copper. However, the oxide film 105 can inhibit electrons from being trapped in the interface states. In this manner, the transistor 100 with stable electrical characteristics in which wiring resistance is reduced can be fabricated.

Note that the source electrode 104a and the drain electrode 104b each have a thickness greater than or equal to 10 nm and less than or equal to 500 nm, preferably greater than or equal to 50 nm and less than or equal to 300 nm.

[Protective Insulating Film]

The insulating film 120 functions as a protective insulating film, and can prevent or reduce diffusion of an impurity element from the outside.

The insulating film 120 is formed using one or more of materials selected from an aluminum nitride, an aluminum oxide, an aluminum nitride oxide, an aluminum oxynitride, a magnesium oxide, a silicon nitride, a silicon oxide, a silicon nitride oxide, a silicon oxynitride, a gallium oxide, a germanium oxide, an yttrium oxide, a zirconium oxide, a lanthanum oxide, a neodymium oxide, a hafnium oxide, and a tantalum oxide. In this specification, nitride oxide refers to a material containing a larger quantity of nitrogen than that of oxygen, and oxynitride refers to a material containing a larger quantity of oxygen than that of nitrogen. Note that content of each element can be measured by Rutherford backscattering spectrometry (RBS) or the like, for example.

The insulating film 120 can be formed by a sputtering method, a molecular beam epitaxy (MBE) method, a chemical vapor deposition (CVD) method, a pulsed laser deposition (PLD) method, an atomic layer deposition (ALD) method, or the like, as appropriate.

Here, the insulating film 120 has a stacked-layer structure of the oxide insulating film 107a, the oxide insulating film 107b, and the nitride insulating film 108.

For example, the insulating film 120 includes the oxide insulating film 107a as a first silicon oxide film, the oxide insulating film 107b as a second silicon oxide film, and the nitride insulating film 108 as a silicon nitride film. In this case, one of or both the first silicon oxide film and the second silicon oxide film may be a silicon oxynitride film. The silicon nitride film may be a silicon nitride oxide film. As the first silicon oxide film, a silicon oxide film with a low defect density is preferably used. Specifically, a silicon oxide film which has a spin density of $3 \times 10^{17}$ spins/cm$^3$ or less, preferably $5 \times 10^{16}$ spins/cm$^3$ or less calculated from a signal at a g-factor of 2.001 in ESR is used. As the second silicon oxide film, a silicon oxide film in which the oxygen content is higher than that in the stoichiometric composition, in other words, a silicon oxide film containing excess oxygen, is used. As the silicon nitride film, a silicon nitride film from which hydrogen gas and ammonia gas are less released is used. Further, as the silicon nitride film, a silicon nitride film which does not transmit or hardly transmits hydrogen, water, and oxygen may also be used. Note that the amount of released hydrogen gas and ammonia gas can be measured by thermal desorption spectroscopy (TDS) analysis.

An oxide insulating film which contains oxygen at a higher proportion than the stoichiometric composition means an oxide insulating film from which oxygen is released by heat treatment. The silicon oxide film having excess oxygen means a silicon oxide film from which oxygen can be released by heat treatment or the like.

The oxide insulating film containing excess oxygen is capable of reducing oxygen vacancies in the oxide semiconductor film 103a. Oxygen vacancies in the oxide semiconductor film 103a form defect levels, and some of the defect levels become donor levels. Thus, by a reduction in oxygen vacancies in the oxide semiconductor film 103a (particularly, in the channel region), the carrier density of the oxide semiconductor film 103a (particularly, the channel region) can be reduced, whereby the transistor 100 with stable electrical characteristics can be fabricated.

Here, a film from which oxygen is released by heat treatment may release oxygen, the amount of which is higher than or equal to $1 \times 10^{18}$ atoms/cm$^3$, higher than or equal to $1 \times 10^{19}$ atoms/cm$^3$, or higher than or equal to $1 \times 10^{20}$ atoms/cm$^3$ in TDS analysis (converted into the number of oxygen atoms).

Further, the film from which oxygen is released by heat treatment may contain a peroxide radical. Specifically, the spin density attributed to a peroxide radical is greater than or equal to $5 \times 10^{17}$ spins/cm$^3$. Note that the film containing a peroxide radical may have an asymmetric signal at a g factor of around 2.01 generated in ESR.

The silicon oxide film containing excess oxygen can be represented by a chemical formula, SiO$_x$, (x>2), for example, and in the silicon oxide film, the number of oxygen atoms per unit volume is more than twice the number of silicon atoms per unit volume. The number of silicon atoms and the number of oxygen atoms per unit volume are measured by Rutherford backscattering spectrometry (RBS).

The structure of the insulating film 120 is not limited to the stacked-layer structure of the oxide insulating film 107a, the oxide insulating film 107b, and the nitride insulating film 108, and for example, may be a stacked-layer structure of the oxide insulating film 107b as a first layer and the nitride insulating film 108 as a second layer.

Note that the thickness of the insulating film 120 is greater than or equal to 30 nm and less than or equal to 1000 nm. In particular, the thickness of the oxide insulating film 107a can be greater than or equal to 5 nm and less than or equal to 150 nm, preferably greater than or equal to 5 nm and less than or equal to 50 nm, further preferably greater than or equal to 10 nm and less than or equal to 30 nm. The thickness of the oxide insulating film 107b can be greater than or equal to 30 nm and less than or equal to 500 nm, preferably greater than or equal to 150 nm and less than or equal to 400 nm. The thickness of the nitride insulating film 108 can be greater than or equal to 5 nm and less than or equal to 150 nm, preferably greater than or equal to 5 nm and less than or equal to 50 nm, more preferably greater than or equal to 10 nm and less than or equal to 30 nm.

[Gate Insulating Film]

The gate insulating film 106 may have a single-layer structure or a stacked-layer structure using an insulating film containing one or more kinds selected from aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate insulating film 106 can be, for example, a multilayer film including a silicon nitride film as a first layer and a silicon oxide film as a second layer. In this case, the silicon oxide film may be a silicon oxynitride film. The silicon nitride film may be a silicon nitride oxide film. As the silicon oxide film, a silicon oxide film with a low defect density is preferably used. Specifically, a silicon oxide film which has a spin density of $3 \times 10^{17}$ spins/cm$^3$ or less, preferably $5 \times 10^{16}$ spins/cm$^3$ or less calculated from a signal at a g-factor of 2.001 in ESR is used. As the silicon oxide film, a silicon oxide film containing excess oxygen is preferably used. As the silicon nitride film, a silicon nitride film from which hydrogen gas and ammonia gas are less released is used. The amount of released hydrogen gas and ammonia gas can be measured by TDS analysis.

The gate insulating film 106 can be, for example, a multilayer film including a first silicon nitride film as a first layer, a second silicon nitride film as a second layer, a third silicon nitride film as a third layer, and a silicon oxide film as a fourth layer. In that case, the silicon oxide film may be a silicon oxynitride film. In addition, the silicon nitride film may be a silicon nitride oxide film. Further, the third layer is preferably a silicon nitride oxide film. The silicon oxide film and the silicon nitride film used in this case can be the above-described silicon oxide film and silicon nitride film. In the case where a silicon nitride oxide film is used as the third layer, a silicon nitride oxide film with few defects in which a dangling bond is terminated with nitrogen or oxygen is preferably used. Specifically, a silicon nitride oxide film whose spin density calculated from a signal with a g factor of 2.001 in ESR is lower than or equal to $1.2 \times 10^{18}$ spins/cm$^3$, preferably lower than or equal to $1 \times 10^{17}$ spins/cm$^3$ is preferably used.

In the case where at least one of the gate insulating film 106 and the insulating film 120 includes an oxide insulating film containing excess oxygen, oxygen vacancies in the oxide semiconductor film 103a are reduced, so that the transistor 100 with stable electrical characteristics can be achieved.

The thickness of the gate insulating film 106 is greater than or equal to 5 nm and less than or equal to 500 nm, preferably greater than or equal to 10 nm and less than or equal to 300 nm.

[Substrate]

Although there is no particular limitation on a substrate which can be used as the substrate 101, it is necessary that the substrate have at least heat resistance high enough to withstand heat treatment to be performed later. For example, a glass substrate of barium borosilicate glass, aluminoborosilicate glass, or the like, a ceramic substrate, a quartz substrate, or a sapphire substrate can be used.

A single crystal semiconductor substrate or a polycrystalline semiconductor substrate of silicon, silicon carbide, or the like or a compound semiconductor substrate of silicon germanium or the like may be used as the substrate 101. Alternatively, an SOI substrate, a substrate over which a semiconductor element is provided, or the like can be used.

Note that a flexible substrate may also be used as the substrate 101. In the case where a flexible substrate is used, the transistor, the capacitor, or the like may be directly formed over the flexible substrate, or the transistor, the capacitor, or the like may be formed over a manufacturing substrate, and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

[Gate Electrode]

For a conductive material for forming the gate electrode 110, a metal element selected from aluminum, chromium, copper, silver, gold, platinum, tantalum, nickel, titanium, molybdenum, tungsten, hafnium, vanadium, niobium, manganese, magnesium, zirconium, beryllium, and the like; an alloy containing any of the above metal elements; an alloy containing a combination of the above metal elements; or the like can be used. Alternatively, a semiconductor typified by polycrystalline silicon including an impurity element such as phosphorus, or silicide such as nickel silicide may be used. There is no particular limitation on a formation method of the conductive film, and a variety of formation methods such as an evaporation method, a CVD method, a sputtering method, and a spin coating method can be employed.

The gate electrode 110 can be formed using a conductive material containing oxygen, such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to use a stacked-layer structure formed using the above conductive material containing oxygen and a material containing the above metal element.

The gate electrode 110 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

Further, an In—Ga—Zn oxynitride film, an In—Sn oxynitride film, an In—Ga oxynitride film, an In—Zn oxynitride film, a Sn oxynitride film, an In oxynitride film, a metal nitride (such as InN or ZnN) film, or the like may be provided between the gate electrode 110 and the gate insulating film 106. These layers each have a work function of 5 eV or higher and the electron affinity of each of these layers is larger than that of an oxide semiconductor; thus, the threshold voltage of the transistor including an oxide semiconductor in a semiconductor film in which a channel is formed can be shifted in a positive direction. Accordingly, what is called a normally-off switching element can be obtained. For example, in the case of providing an In—Ga—Zn oxynitride film between the gate electrode 110 and the gate insulating film 106, an In—Ga—Zn oxynitride film whose nitrogen concentration is higher than at least the nitrogen concentration of the oxide semiconductor film 103a, specifically, an In—Ga—Zn oxynitride film whose nitrogen concentration is higher than or equal to 7 at. % is provided.

Note that the thickness of the gate electrode 110 may be greater than or equal to 10 nm and less than or equal to 500 nm, preferably greater than or equal to 50 nm and less than or equal to 300 nm.

A base insulating film may be provided between the substrate 101 and the gate electrode 110. The base insulating film can be formed using a material which can be used for the insulating film 120. The base insulating film can prevent or reduce diffusion of an impurity element from the substrate 101.

[Example of Method for Manufacturing Transistor]

An example of a method for manufacturing the transistor 100 is described with reference to the cross-sectional views illustrated in FIGS. 3A to 3E.

Here, a glass substrate is used as the substrate 101.

A conductive film is formed over the substrate 101 using a conductive material which can be used for the gate electrode 110, a resist mask is formed over the conductive film, and part of the conductive film is selectively etched using the resist mask, so that the gate electrode 110 is formed. Then, an insulating film is formed using a material which can be used for the gate insulating film 106.

Figure 3A:
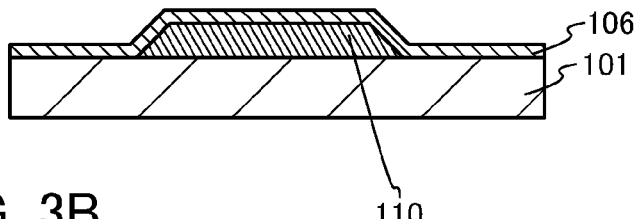
FIGS. 3A to 3E are cross-sectional views illustrating an example of a method for manufacturing a semiconductor device.

The structure obtained through the steps up to here is illustrated in FIG. 3A.

Next, an oxide semiconductor film which is to be processed into the oxide semiconductor film 103a is formed and an oxide film which is to be processed into the oxide film 103b is formed over the oxide semiconductor film, so that a multilayer film is formed. A resist mask is formed over the multilayer film and part of the multilayer film is selectively etched using the resist mask, so that the multilayer film 103 including the oxide semiconductor film 103a and the oxide film 103b is formed.

Here, the case of forming the oxide semiconductor film which is to be processed into the oxide semiconductor film 103a and the oxide film which is to be processed into the oxide film 103b by a sputtering method is described.

In this embodiment, as the oxide semiconductor film to be processed into the oxide semiconductor film 103a, a 15-nm-thick oxide semiconductor film is formed over the gate insulating film 106 using an In—Ga—Zn oxide having an atomic ratio of In:Ga:Zn=1:1:1 as a target. After that, as the oxide film 103b, a 5-nm-thick oxide film is formed over the oxide semiconductor film 103a using an In—Ga—Zn oxide having an atomic ratio of In:Ga:Zn=1:3:2 as a target.

Further, it is preferable that the oxide semiconductor film 103a be a CAAC-OS film. Four examples of a method for forming a CAAC-OS film are described.

The first method is to form an oxide semiconductor at a temperature higher than or equal to 100° C. and lower than or equal to 500° C., whereby crystal parts in which the c-axes are aligned in the direction parallel to a normal vector of a surface on which the oxide semiconductor is formed or a normal vector of a surface of the oxide semiconductor are formed in the oxide semiconductor.

The second method is to form an oxide semiconductor with a small thickness and then heat it at a temperature higher than or equal to 200° C. and lower than or equal to 700° C., whereby crystal parts in which the c-axes are aligned in the direction parallel to a normal vector of a surface on which the oxide semiconductor film is formed or a normal vector of a surface of the oxide semiconductor are formed in the oxide semiconductor.

The third method is to form a first oxide semiconductor film with a small thickness, then heat it at a temperature higher than or equal to 200° C. and lower than or equal to 700° C., and form a second oxide semiconductor film, whereby crystal parts in which the c-axes are aligned in the direction parallel to a normal vector of a surface on which the oxide semiconductor film is formed or a normal vector of a surface of the oxide semiconductor film are formed in the oxide semiconductor film.

The fourth method is to form an oxide semiconductor which includes crystal parts in which the c-axes are aligned in a direction parallel to a normal vector of a surface on which the oxide semiconductor is formed or a normal vector of a surface of the oxide semiconductor, with the use of a target including a polycrystalline oxide semiconductor with high alignment.

Here, a model of crystal growth of a CAAC-OS film using the fourth method is described with reference to FIGS. 4A and 4B, FIGS. 5A and 5B, and FIGS. 6A and 6B.

Figure 4A:
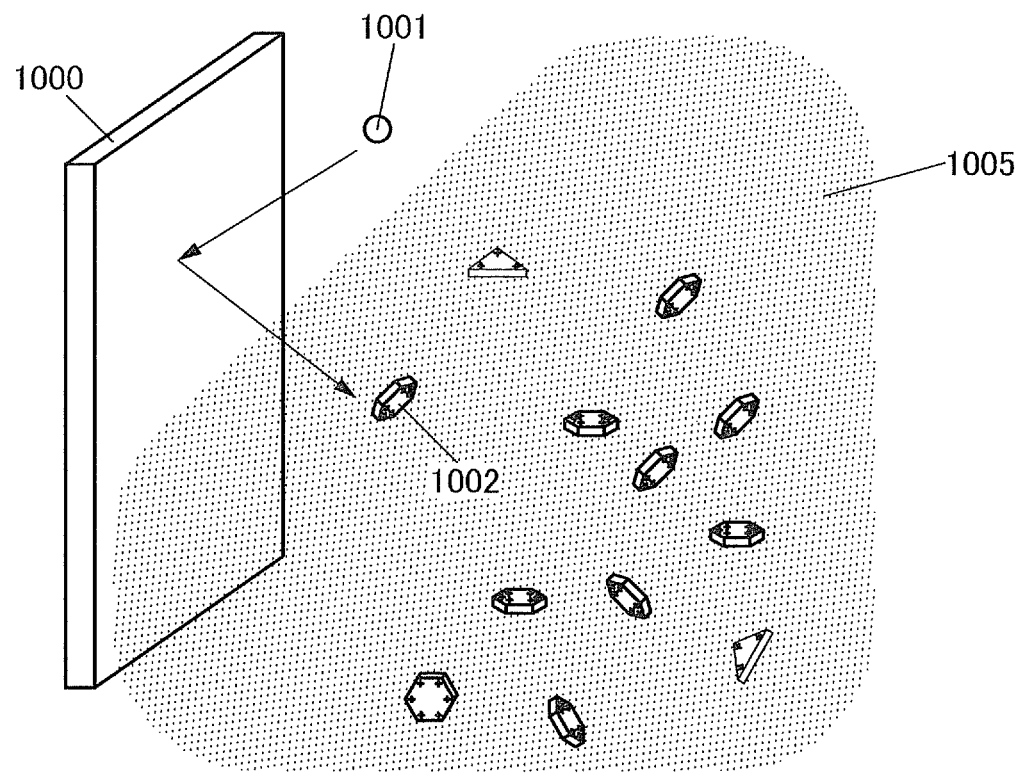
FIGS. 4A and 4B show a situation where a sputtered particle is separated from a sputtering target.
Figure 4B:
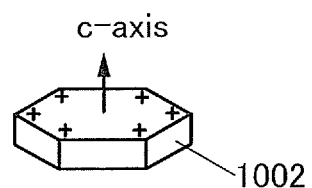

FIG. 4A is a schematic diagram illustrating a state in which an ion 1001 collides with a target 1000 containing a polycrystalline oxide semiconductor having high alignment to separate sputtered particles 1002 with crystallinity from the sputtering target 1000. A crystal grain has a cleavage plane parallel to a surface of the target 1000. The crystal grain has a portion with a weak interatomic bond. When the ion 1001 collides with the crystal grain, an interatomic bond of the portion where an interatomic bond is weak is cut. Accordingly, the sputtered particle 1002 is cut along the cleavage plane and the portion where an interatomic bond is weak and separated in a flat-plate (or pellet) form. For example, the c-axis of the sputtered particle 1002 is oriented in a direction perpendicular to a flat plane of the sputtered particle 1002 (see FIG. 4B). The equivalent circle diameter of a crystal grain of the oxide semiconductor included in the target 1000 is preferably less than or equal to 1 μm. Note that the equivalent circle diameter of a flat plane of the sputtered particle 1002 is greater than or equal to 1/3000 and less than or equal to 1/20, preferably greater than or equal to 1/1000 and less than or equal to 1/30 of an average grain size of the crystal grains. Here, the term "equivalent circle diameter on a plane" refers to the diameter of a perfect circle having the same area as the plane.

Alternatively, when part of the crystal grain is separated as a particle from a cleavage plane and exposed to plasma 1005, cutting of a bond starts at the portion where an interatomic bond is weak, so that a plurality of sputtered particles 1002 are generated.

With the use of an oxygen cation as the ion 1001, plasma damage at the film formation can be alleviated. Thus, when the ion 1001 collides with the surface of the target 1000, a lowering in crystallinity of the target 1000 can be suppressed or a change of the target 1000 into an amorphous state can be suppressed.

Figure 5A:
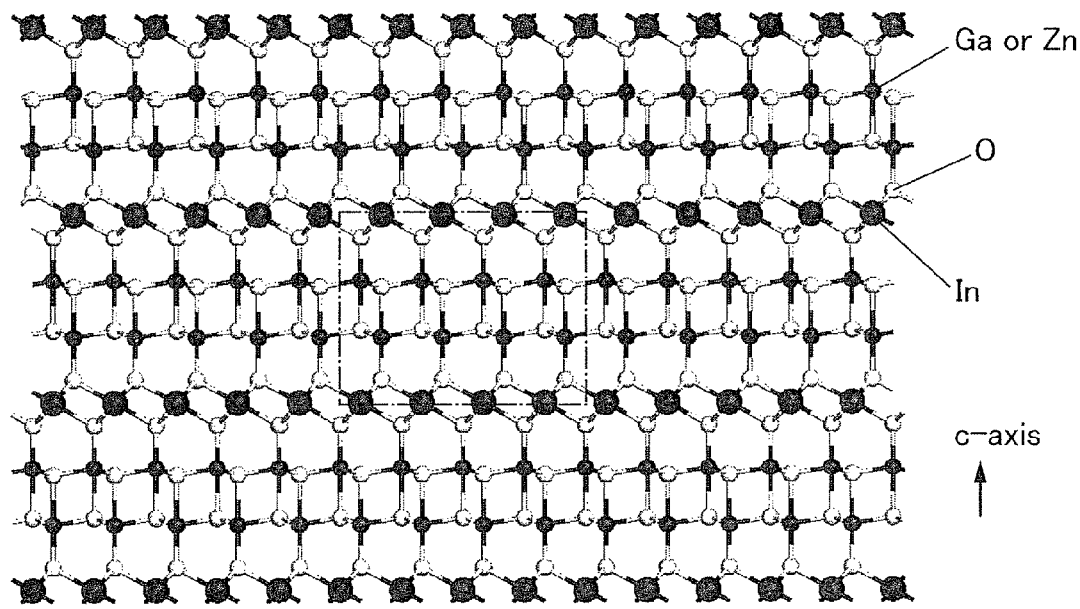
FIGS. 5A and 5B show an example of a crystal structure of an In—Ga—Zn oxide.
Figure 5B:
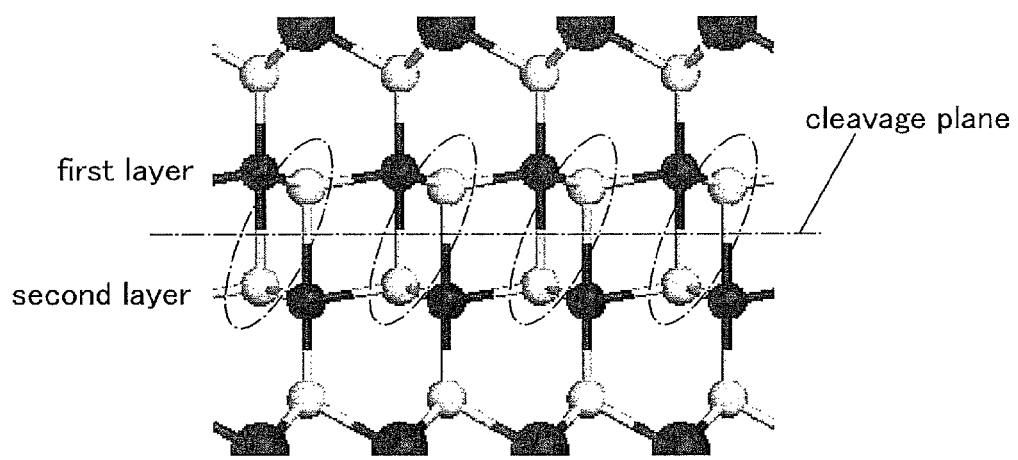

FIG. 5A illustrates a crystal structure of an In—Ga—Zn oxide viewed from a direction parallel to an a-b plane of the crystal as an example of the target 1000 containing a polycrystalline oxide semiconductor with high alignment. FIG. 5B illustrates an enlarged view of a portion surrounded by a dashed-dotted line in FIG. 5A.

For example, in a crystal grain of an In—Ga—Zn oxide, a cleavage plane is a plane between a first layer and a second layer as illustrated in FIG. 5B. The first layer includes a gallium atom and/or zinc atom and an oxygen atom, and the second layer includes a gallium atom and/or zinc atom and an oxygen atom. This is because oxygen atoms having negative charge in the first layer and oxygen atoms having negative charge in the second layer are close to each other (see surrounded portions in FIG. 5B). In this manner, the cleavage plane is a plane parallel to an a-b plane. Further, the crystal of the In—Ga—Zn oxide shown in FIGS. 5A and 5B is a hexagonal crystal; thus the flat-plate-like crystal particle is likely to have a hexagonal prism shape with a regular hexagonal plane whose internal angle is 120°. Note that the shape of the flat-plate-like crystal particle is not limited to a hexagonal prism and may be a triangular prism.

It is preferable that sputtered particles 1002 be positively charged. Note that it is preferable that corner portions of the sputtered particles 1002 have charges with the same polarity because interaction between the sputtered particles occurs (the sputtered particles repel with each other) so that the shapes of the sputtered particles maintain (see FIG. 4B). For example, the sputtered particles 1002 may be positively charged. There is no particular limitation on a timing of when the sputtered particle 1002 is positively charged, but it is preferably positively charged by receiving an electric charge when an ion 1001 collides. Alternatively, in the case where the plasma 1005 is generated, the sputtered particle 1002 is preferably exposed to the plasma 1005 to be positively charged. Further alternatively, the ion 1001 which is an oxygen cation is preferably bonded to a side surface, a top surface, or a bottom surface of the sputtered particle 1002, whereby the sputtered particle 1002 is positively charged.

A situation where a sputtered particle is deposited on a deposition surface over an amorphous film 1004 is described with reference to FIGS. 6A and 6B. Note that in FIGS. 6A and 6B, sputtered particles which have been already deposited are shown by dashed lines.

Figure 6A:
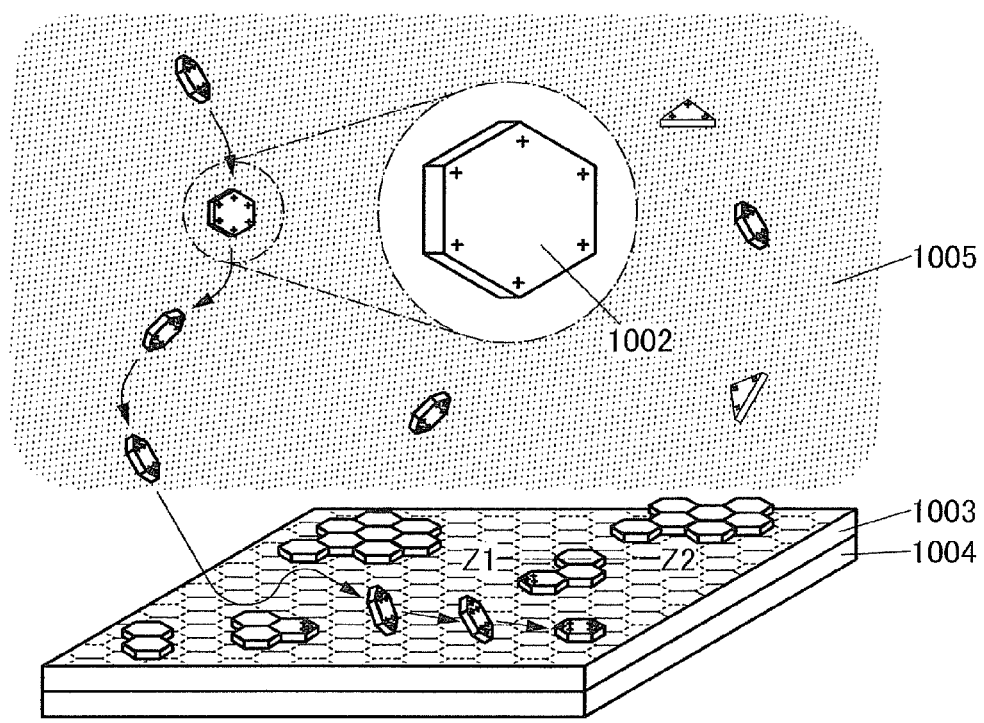
FIGS. 6A and 6B show a situation where a sputtered particle reaches a surface and is deposited on the surface.

FIG. 6A illustrates an oxide semiconductor film 1003 which is formed by deposition of the sputtering particles 1002 on the amorphous film 1004. As shown in FIG. 6A, the sputtered particle 1002 is exposed to the plasma 1005 to be positively charged, and accordingly the sputtered particle 1002 is deposited on a region in the oxide semiconductor film 1003 where other sputtered particles 1002 have not been deposited yet. This is because the sputtered particles 1002 that are positively charged repel each other. The sputtering particles can be deposited in the above manner on an insulating surface.

Figure 6B:
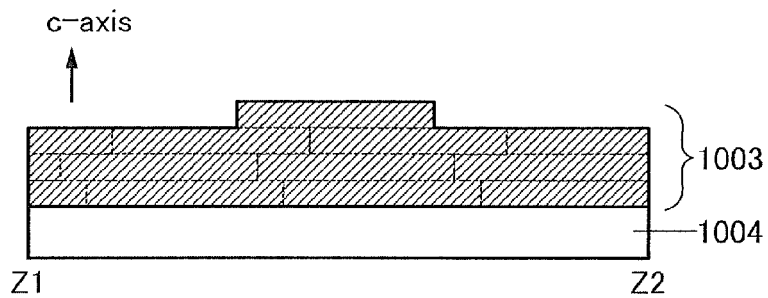

FIG. 6B is a cross-sectional view taken along dashed-dotted line Z1-Z2 in FIG. 6A. The oxide semiconductor film 1003 is formed in such a manner that the plate-like sputtered particles 1002 whose c-axis direction is perpendicular to their flat planes are deposited orderly. Accordingly, the oxide semiconductor film 1003 is a CAAC-OS film whose c-axes are aligned in a direction perpendicular to a surface on which the film is formed. According to the above model, a CAAC-OS film having high crystallinity can be formed even on an insulating surface, an amorphous film, or an amorphous insulating film.

In a transistor in which a CAAC-OS film is used for a channel region, electrical characteristics variation due to irradiation with visible light or ultraviolet light is small. Thus, the transistor in which a CAAC-OS film is used for the channel region has high reliability.

For the deposition of the CAAC-OS film, the following conditions are preferably used.

By reducing the amount of impurities entering the CAAC-OS during the deposition, the crystal state can be prevented from being broken. For example, the concentration of impurities (e.g., hydrogen, water, carbon dioxide, or nitrogen) which exist in the deposition chamber may be reduced. Furthermore, the concentration of the impurities in a sputtering gas may be reduced. Specifically, a sputtering gas whose dew point is −40° C. or lower, preferably −60° C. or lower is used.

By increasing the heating temperature of the surface where the CAAC-OS is formed (for example, the substrate heating temperature) during the deposition, migration of a sputtered particle is likely to occur after the sputtered particle reaches the surface where the CAAC-OS is formed. Specifically, the temperature of the surface where the CAAC-OS is formed during the deposition is higher than or equal to 100° C. and lower than or equal to 740° C., preferably higher than or equal to 150° C. and lower than or equal to 500° C.

Further, it is preferable that the proportion of oxygen in the sputtering gas be increased and the power be optimized in order to reduce plasma damage at the time of deposition. The proportion of oxygen in the sputtering gas is higher than or equal to 30 vol % and lower than or equal to 100 vol %.

As an example of the sputtering target, an In—Ga—Zn oxide target is described below.

The In—Ga—Zn oxide target which is polycrystalline is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

An oxide semiconductor film which is formed by a sputtering method contains hydrogen, water, a compound having a hydroxyl group, or the like in some cases. Hydrogen, water, and the like easily form a donor level and thus serve as impurities in the oxide semiconductor. Therefore, in the formation of an oxide semiconductor film by a sputtering method, the hydrogen concentration of the oxide semiconductor film is preferably reduced as much as possible.

Moreover, when the leakage rate of the reaction chamber of the sputtering apparatus is set to lower than or equal to $1 \times 10^{-10}$ Pa·m$^3$/second at the formation of the oxide semiconductor film, entry of impurities such as an alkali metal or hydride into the oxide semiconductor film that is being formed by a sputtering method can be reduced. Further, with the use of an entrapment vacuum pump (e.g., a cryopump) as an evacuation system, counter flow of impurities such as an alkali metal, a hydrogen atom, a hydrogen molecule, water, a compound having a hydroxyl group, and hydride from the evacuation system can be reduced.

When the purity of the target is set to 99.99% or higher, entry of alkali metal, hydrogen atoms, hydrogen molecules, water, a hydroxyl group, hydride, and the like into the oxide semiconductor film can be suppressed. In addition, when the target is used, the concentration of alkali metal such as lithium, sodium, or potassium in the oxide semiconductor film can be reduced. The silicon concentration of the target is preferably lower than or equal to $1\times10^{18}$ atoms/cm$^3$.

After the oxide semiconductor film and the oxide film are formed, plasma treatment in an oxygen atmosphere or a mixed atmosphere of nitrogen and oxygen may be performed. Thus, oxygen vacancies in at least the oxide semiconductor film can be reduced.

Note that the etching for forming the multilayer film 103 can be performed by one of or both a dry etching method and a wet etching method.

A chlorine-based gas typified by chlorine ($Cl_2$), boron trichloride ($BCl_3$), silicon tetrachloride ($SiCl_4$), carbon tetrachloride ($CCl_4$), or the like can be used as an etching as for the dry etching of the multilayer film 103. As a plasma source in the case where the etching of the multilayer film 103 is performed by a dry etching method, a capacitively coupled plasma (CCP), an inductively coupled plasma (ICP), an electron cyclotron resonance (ECR) plasma, a helicon wave plasma (HWP), a microwave-excited surface wave plasma (SWP), or the like can be used. In particular, with ICP, ECR, HWP, and SWP, a high density plasma can be generated. In the case of the etching according to the dry etching method (hereinafter also referred to as a "dry etching"), the etching conditions (the amount of electric power applied to a coil-shaped electrode, the amount of electric power applied to an electrode on a substrate side, the temperature of the electrode on the substrate side, and the like) are adjusted as appropriate so that the film can be etched into a desired shape.

In the case where the multilayer film 103 is etched by a wet etching method, a solution obtained by mixing phosphoric acid, acetic acid, and nitric acid, a solution containing oxalic acid, a solution containing phosphoric acid, or the like can be used as the etchant. Alternatively, ITO-07N (produced by KANTO CHEMICAL CO., INC.) may be used.

Next, first heat treatment is preferably performed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The first heat treatment enables the crystallinity of the oxide semiconductor film 103a to be improved, and in addition, impurities such as water, hydrogen, nitrogen, and carbon to be removed from the gate insulating film 106 and the multilayer film 103.

Note that the first heat treatment can be performed at least before or after the etching step for forming the multilayer film 103.

Figure 3B:
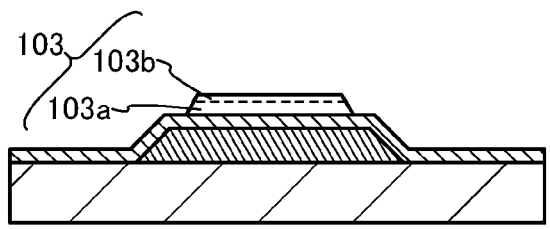

The structure obtained through the steps up to here is illustrated in FIG. 3B.

Then, a conductive film is formed over the multilayer film 103 using a conductive material which can be used for the source electrode 104a and the drain electrode 104b, a resist mask is formed over the conductive film, and part of the conductive film is etched using the resist mask, so that the source electrode 104a and the drain electrode 104b are formed.

Note that the etching for forming the source electrode 104a and the drain electrode 104b can be performed by one of or both a dry etching method and a wet etching method.

It is preferable that the source electrode 104a and the drain electrode 104b each have an end portion having a tapered shape. Specifically, the end portion has a taper angle θ of 80° or less, preferably 60° or less, further preferably 45° or less.

Next, second heat treatment is preferably performed. The description of the first heat treatment can be referred to for the second heat treatment. The second heat treatment can remove impurities such as hydrogen and water from the multilayer film 103. Hydrogen easily moves especially in the multilayer film 103; thus, reducing hydrogen by the second heat treatment enables a transistor to have stable electrical characteristics. Note that water is a compound containing hydrogen and thus might serve as an impurity in the oxide semiconductor film 103a.

In addition, by the second heat treatment, the low-resistance region 109a and the low-resistance region 109b can be formed in the multilayer film 103 in contact with the source electrode 104a and the drain electrode 104b.

By forming the multilayer film 103 in the above-described manner, the concentrations of impurities in the oxide semiconductor film 103a and the oxide film 103b and at the interface between the oxide semiconductor film 103a and the oxide film 103b can be reduced.

Figure 3C:
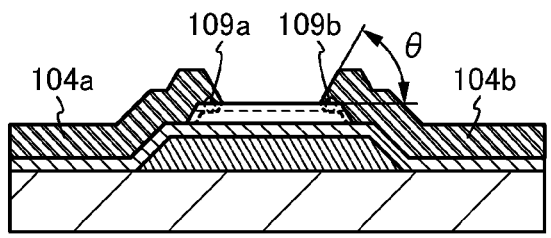

The structure obtained through the steps up to here is illustrated in FIG. 3C.

Next, the oxide film 105 is formed over the multilayer film 103, the source electrode 104a, and the drain electrode 104b. The oxide film 105 is formed using a material and a method which can be used for the oxide semiconductor film 103a and the oxide film 103b. Here, the oxide film 105 is formed using a material including one or more kinds of metal elements included in the oxide film 103b. Specifically, the oxide film is formed using an In—Ga—Zn oxide having an atomic ratio of In:Ga:Zn=1:3:2, In:Ga:Zn=1:6:4, or In:Ga:Zn=1:9:4 as a target.

Figure 3D:
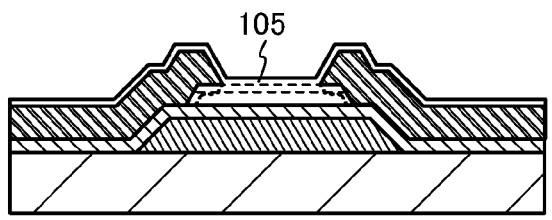

The structure obtained through the steps up to here is illustrated in FIG. 3D.

Next, the insulating film 120 is formed over the oxide film 105. Here, the case of forming the oxide insulating film 107a, the oxide insulating film 107b, and the nitride insulating film 108 is described.

First, the first silicon oxide film is formed as the oxide insulating film 107a. Then, the second silicon oxide film is formed as the oxide insulating film 107b. Next, treatment for adding oxygen ions to the second silicon oxide film may be performed. The treatment for adding oxygen ions may be performed with an ion doping apparatus or a plasma treatment apparatus. As the ion doping apparatus, an ion doping apparatus with a mass separation function may be used. As a source material of oxygen ions, an oxygen gas such as $^{16}O_2$ or $^{18}O_2$, a nitrous oxide gas, an ozone gas, or the like may be used. Next, the silicon nitride film is formed as the nitride insulating film 108.

The first silicon oxide film is preferably formed by a plasma CVD method which is one type of CVD method. Specifically, the first silicon oxide film may be formed by supplying high-frequency power to an electrode under the following conditions: the substrate temperature is higher than or equal to 180° C. and lower than or equal to 400° C., preferably higher than or equal to 200° C. and lower than or equal to 370° C., a deposition gas containing silicon and an oxidizing gas are used, and the pressure is higher than or equal to 20 Pa and lower than or equal to 250 Pa, preferably higher than or equal to 40 Pa and lower than or equal to 200 Pa. Note that typical examples of the deposition gas containing silicon include silane, disilane, trisilane, and silane fluoride. Examples of the oxidizing gas include oxygen, ozone, nitrous oxide, and nitrogen dioxide.

By setting the flow rate of the oxidizing gas to 100 times or more the flow rate of the deposition gas containing silicon, the hydrogen content in the first silicon oxide film can be reduced and dangling bonds can be reduced.

The second silicon oxide film is preferably formed by a plasma CVD method. Specifically, the second silicon oxide film may be formed by supplying high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$, to an electrode under the following conditions: the substrate temperature is higher than or equal to 160° C. and lower than or equal to 350° C., preferably higher than or equal to 180° C. and lower than or equal to 260° C., a deposition gas containing silicon and an oxidizing gas are used, and the pressure is higher than or equal to 100 Pa and lower than or equal to 250 Pa, preferably higher than or equal to 100 Pa and lower than or equal to 200 Pa.

By the above-described method, the decomposition efficiency of the gas in plasma is enhanced, oxygen radicals are increased, and oxidation of the gas is promoted; thus, the silicon oxide film containing excess oxygen can be formed as the second silicon oxide film.

The silicon nitride film used as the nitride insulating film 108 is preferably formed by a plasma CVD method. Specifically, the silicon nitride film may be formed by supplying high-frequency power under the following conditions: the substrate temperature is higher than or equal to 180° C. and lower than or equal to 400° C., preferably higher than or equal to 200° C. and lower than or equal to 370° C., a deposition gas containing silicon, a nitrogen gas, and an ammonia gas are used, and the pressure is higher than or equal to 20 Pa and lower than or equal to 250 Pa, preferably higher than or equal to 40 Pa and lower than or equal to 200 Pa.

Note that the flow rate of the nitrogen gas is set to 5 times or more and 50 times or less, preferably 10 times or more and 50 times or less the flow rate of the ammonia gas. The use of ammonia as the source gas can promote decomposition of the deposition gas containing silicon and the nitrogen gas. This is because the ammonia gas is dissociated by plasma energy or heat energy, and energy generated by the dissociation contributes to decomposition of a bond of the deposition gas containing silicon and a bond of the nitrogen gas.

Through the above method, the silicon nitride film which can be used as the nitride insulating film 108 and from which the hydrogen gas and the ammonia gas are less likely to be released can be formed. The silicon nitride film has low hydrogen content, and thus is dense and does not transmit or hardly transmit hydrogen, water, and oxygen.

Third heat treatment is preferably performed after at least the oxide insulating film 107a and the oxide insulating film 107b of the insulating film 120 are formed. The description of the first heat treatment can be referred to for the third heat treatment. By the third heat treatment, excess oxygen released from at least one of the gate insulating film 106, the oxide insulating film 107a, and the oxide insulating film 107b; thus, oxygen vacancies in the multilayer film 103 can be reduced. Note that in the multilayer film 103, an oxygen vacancy captures an adjacent oxygen atom, so that the oxygen vacancy seems to move.

Further, by the third heat treatment, hydrogen or water can be removed from the oxide insulating films 107a and 107b. In the case where the third heat treatment is performed after the formation of the nitride insulating film 108, hydrogen or water can be removed also from the nitride insulating film 108.

Figure 3E:
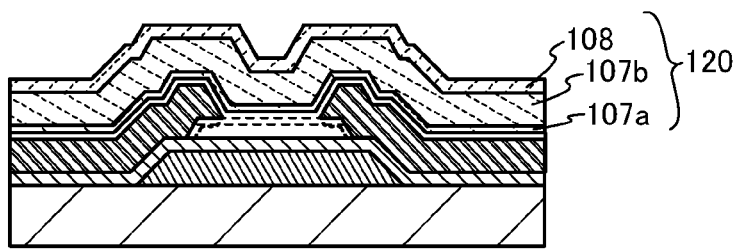

The structure obtained through the process up to here is illustrated in FIG. 3E.

In this manner, the transistor 100 can be fabricated.

Note that in the manufacturing process of the transistor 100, the oxide film 103b is partly etched in some cases at the time of forming the source electrode 104a and the drain electrode 104b. Further, on the top surface of the oxide semiconductor film 103a, a mixed layer of the oxide semiconductor film 103a and the oxide film 103b is formed at the time of forming the oxide film 103b in some cases.

For example, in the case where the oxide semiconductor film 103a is formed using an In—Ga—Zn oxide having an atomic ratio of In:Ga:Zn=1:1:1 or an In—Ga—Zn oxide having an atomic ratio of In:Ga:Zn=3:1:2 as a target, the oxide film 103b is formed using an In—Ga—Zn oxide having an atomic ratio of In:Ga:Zn=1:3:2 or an In—Ga—Zn oxide having an atomic ratio of In:Ga:Zn=1:6:4 as a target, and the oxide film 105 is formed using an In—Ga—Zn oxide having an atomic ratio of In:Ga:Zn=1:3:2 or an In—Ga—Zn oxide having an atomic ratio of In:Ga:Zn=1:6:4 as a target, a Ga content in the oxide film 103b is higher than that in the oxide semiconductor film 103a, so that a mixed layer in which a Ga content is higher than that in a GaOx layer or the oxide semiconductor film 103a can be formed on the top surface of the oxide semiconductor film 103a.

Figure 24:
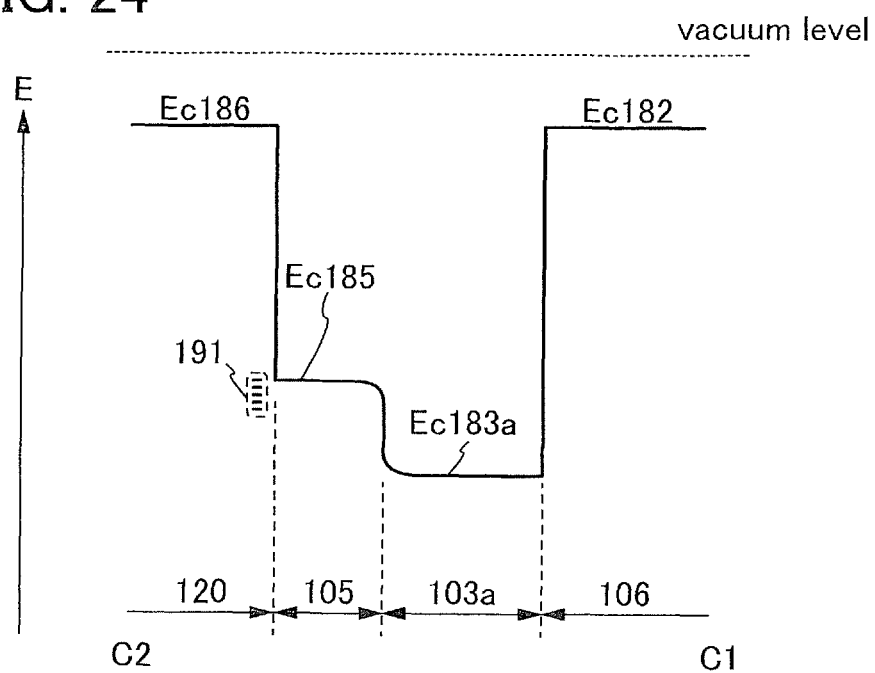
FIG. 24 illustrates an energy band structure of a multilayer film.

An energy band structure diagram of a cross section C1-C2 of the transistor 100 in such a case is shown in FIG. 24. FIG. 24 shows a modification example of the energy band structures in FIGS. 2A and 2B. In FIG. 24, Ec182, Ec183a, and Ec185 represent the energies of the conduction band bottoms of the gate insulating film 106, the oxide semiconductor film 103a, and the oxide film 105, respectively.

As described above, even in the case where the oxide film 103b is etched and the oxide film 105 is in contact with the oxide semiconductor film 103a, the mixed layer in which a Ga content is higher than that in the GaOx layer or the oxide semiconductor film 103a is formed between the oxide film 105 and the oxide semiconductor film 103a, so that Ec183a and Ec185 are continuously connected. Further, Ec185 is higher than Ec183a.

Modification Example 1

Figure 7A:
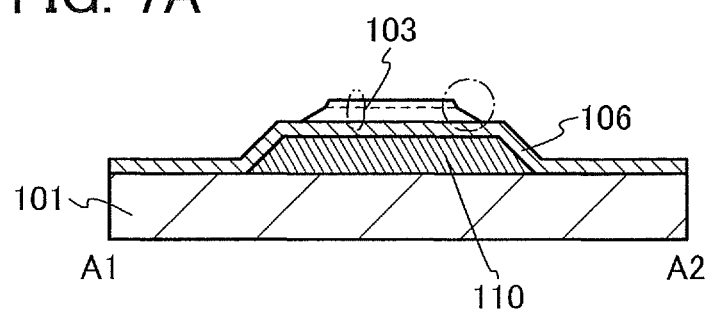
FIGS. 7A and 7B illustrate an example of a cross-sectional shape of an end portion of a multilayer film.

Here, a modification example of the transistor 100 is described. FIG. 7A illustrates some components (the substrate 101, the gate electrode 110, the gate insulating film 106, and the multilayer film 103) of a transistor which is the modification example. Further, FIG. 7B is an enlarged view of an end portion of the multilayer film 103 (a region surrounded by a dashed-dotted-line circle) in FIG. 7A.

In the multilayer film 103 in the modification example of the transistor 100, at least the oxide semiconductor film 103a has a tapered shape. Preferably, the oxide film 103b also has a tapered shape. In addition, the tapered shape of the oxide semiconductor film 103a and the tapered shape of the oxide film 103b are different.

Specifically, when the angle between the bottom surface of the oxide semiconductor film 103a and a side surface of the oxide semiconductor film 103a in the oxide semiconductor film 103a is defined as a first angle θ1 and the angle between the bottom surface of the oxide film 103b and a side surface of the oxide film 103b in the oxide film 103b is defined as a second angle θ2, the first angle θ1 can be an acute angle and the second angle θ2 can be an acute angle or a right angle.

Figure 7B:
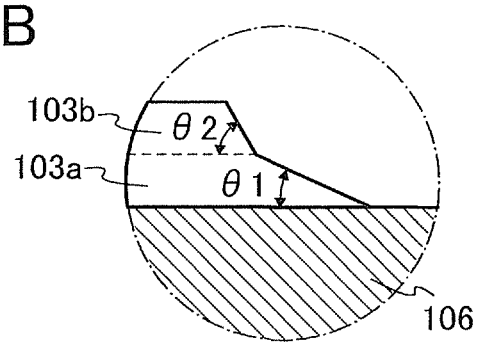

It is particularly preferable that the first angle θ1 and the second angle θ2 be both acute angles and that the first angle θ1 is smaller than the second angle θ2 (see FIG. 7B).

Further, the first angle θ1 is greater than or equal to 10° and less than 90°, preferably greater than or equal to 30° and less than or equal to 80°. The second angle θ2 is greater than or equal to 10° and less than 90°, preferably greater than or equal to 30° and less than or equal to 80°, more preferably greater than or equal to 45° and less than or equal to 70°.

A bottom surface of the oxide semiconductor film 103a corresponds to the surface on the substrate 101 side of the oxide semiconductor film 103a or the surface in contact with the gate insulating film 106 of the oxide semiconductor film 103a. A bottom surface of the oxide film 103b corresponds to the surface on the substrate 101 side of the oxide film 103b or the boundary surface between the oxide film 103b and the oxide semiconductor film 103a. Note that the boundary in the stacked structure of the multilayer film 103 can be observed by scanning transmission electron microscopy (STEM). However, the boundary cannot be observed clearly in some cases depending on the materials used in the oxide semiconductor film 103a and the oxide film 103b.

The following effects can be obtained by the tapered shape with different taper angles of the multilayer film 103. The contact area of the source electrode 104a and the drain electrode 104b can be large with the tapered shape having different taper angles, compared with the tapered shape having one taper angle in the multilayer film 103. Accordingly, the contact resistance between the multilayer film 103 and the source and drain electrodes 104a and 104b is reduced, whereby on-state current of the transistor can be increased.

Further, by setting the second angle θ2 larger than the first angle θ1, the contact area of the oxide film 103b with the source and drain electrodes 104a and 104b can be reduced, which can cause a reduction of the low-resistance regions formed in the oxide film 103b. This suppresses the lowering of the resistance of the oxide film 103b. In addition, low-resistance regions can be formed effectively in the oxide semiconductor film 103a functioning as the channel region. Thus, an increase in on-state current and a reduction in off-state current of the transistor can be both achieved.

In order to form the multilayer film 103 in which the tapered shape of the oxide semiconductor film 103a is different from that of the oxide film 103b, for example, the difference in etching rate between the oxide semiconductor film 103a and the oxide film 103b is utilized in etching of the multilayer film 103. The above-described tapered shapes can be formed by setting the etching rate of the oxide semiconductor film 103a lower than that of the oxide film 103b.

For example, in the step of FIG. 3B, the tapered shapes can be formed by wet etching using a solution containing a phosphoric acid as an etchant.

Advantages in employing wet etching for forming the multilayer film 103 are as follows. In the case of dry etching, if an oxide semiconductor film and an oxide film which are to be processed into the multilayer film 103 have a defect such as a pinhole, for example, the insulating film (e.g., the gate insulating film) provided below the oxide semiconductor film and the oxide film may be etched through the pinhole by the dry etching. Further, an opening that reaches the electrode (e.g., the gate electrode) provided below the insulating film may be formed in the insulating film. The transistor formed under these conditions possibly has characteristics defects such as short circuit between the electrode below the insulating film and the electrode (e.g., the source electrode and the drain electrode) formed over the multilayer film 103. That is, dry etching of the multilayer film 103 leads to a reduction in yield of the transistor. By forming the multilayer film 103 by wet etching, a transistor with favorable electrical characteristics can be manufactured with high productivity.

The etching rate in wet etching varies depending on the concentration, temperature, and the like of the etchant. It is preferable to adjust the concentration, temperature, and the like of the etchant as appropriate so that the etching rate of the oxide semiconductor film 103a is lower than the etching rate of the oxide film 103b. Further, by setting the second angle θ2 larger than the first angle θ1, the area exposed to the etchant in the wet etching can be reduced, and in addition, the low-resistance regions formed in the oxide film 103b owing to contamination or defect generation by the etchant can be reduced.

For example, a solution of about 85% phosphoric acid or a mixed solution (also referred to as an aluminum etchant) containing a phosphoric acid (72%), a nitric acid (2%), and an acetic acid (9.8%) can be used as the above-described etchant. The temperature of the etchant is preferably room temperatures or normal temperatures of 20° C. to 35° C. Note that an etchant other than the above-described etchants may be used as well.

The modification example of the transistor 100 can be fabricated by forming the multilayer film 103 by the above-described wet etching and forming the gate electrode 110, the gate insulating film 106, the source electrode 104a, the drain electrode 104b, and the insulating film 120 by using the manufacturing method of the transistor 100 as appropriate.

Modification Example 2

Figure 8:
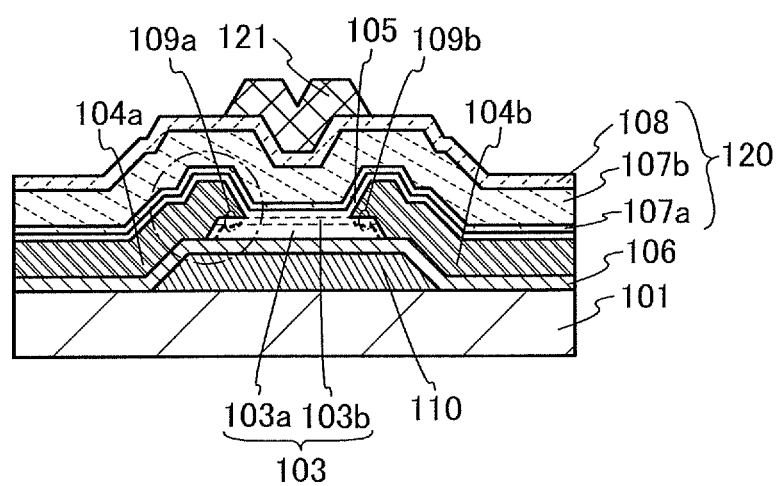
FIG. 8 is a cross-sectional view illustrating an example of a transistor.

As a modification example, in the transistor 100, a conductive film 121 can be provided in a region which overlaps with the multilayer film 103 over the insulating film 120 (see FIG. 8). FIG. 8 shows a cross-sectional view of the transistor of the modification example in the channel length direction. In this case, the gate electrode 110 can be referred to as a first gate electrode, and the conductive film 121 can be referred to as a second gate electrode. Further, one of the first gate electrode and the second gate electrode can function as a gate electrode, and the other thereof can function as a back gate electrode.

The back gate electrode can function in a manner similar to that of the gate electrode. The potential of the back gate electrode may be the same as that of the gate electrode or may be a GND potential or a predetermined potential. By changing a potential of the back gate electrode, the threshold voltage of the transistor can be changed.

Further, the gate electrode and the back gate electrode are formed using a conductive film and thus have a function of preventing an electric field generated in the outside of the transistor from influencing the channel formation region (in particular, a function of preventing static electricity). That is, the variation in the electric characteristics of the transistor due to the influence of external electric field such as static electricity can be prevented. Further, when the back gate electrode is provided, the amount of change in the threshold voltage of the transistor before and after BT test can be reduced.

When the back gate electrode is formed using a light-blocking conductive film, light can be prevented from entering the multilayer film 103 from the back gate electrode side. Therefore, photodegradation of the multilayer film 103 (in particular, the oxide semiconductor film 103a) can be prevented and deterioration in electrical characteristics of the transistor, such as a shift of the threshold voltage, can be prevented.

This embodiment can be implemented in appropriate combination with any of the structures described in the other embodiments, example, and reference example.

Embodiment 2

In this embodiment, a transistor 150 whose structure is partly different from the structure of the transistor 100 which is one embodiment of the present invention is shown as an example.

[Structural Example of Semiconductor Device]

Figure 9A:
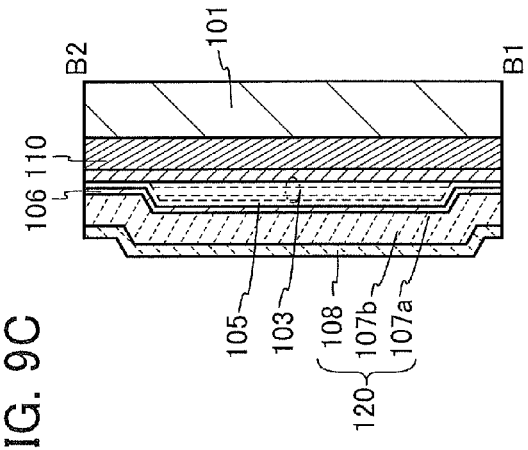
FIGS. 9A to 9D are a top view and cross-sectional views illustrating an example of a transistor.
Figure 9B:
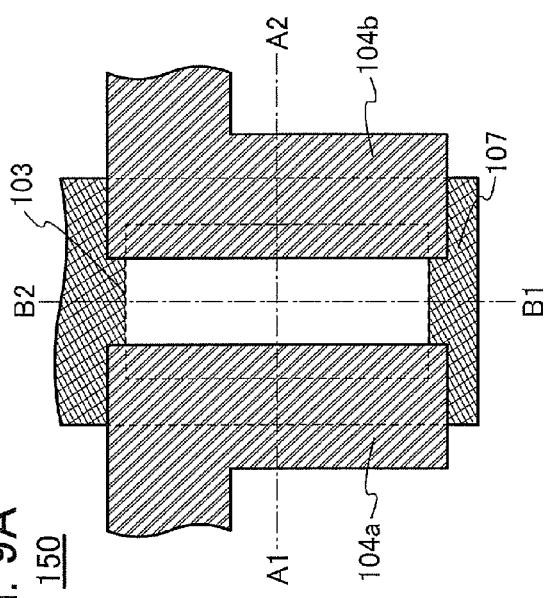
Figure 9C:
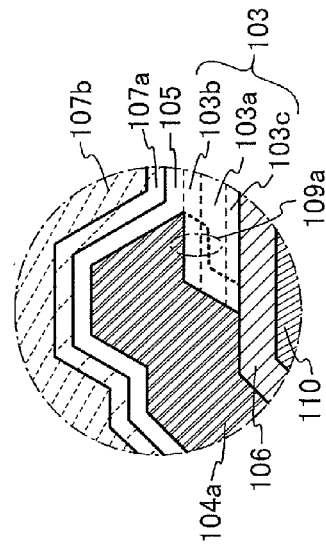
Figure 9D:
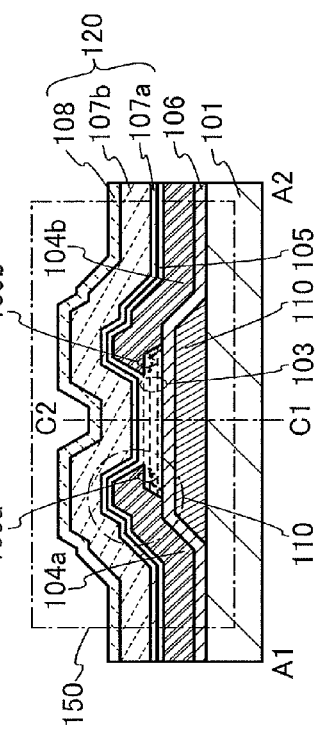

FIGS. 9A to 9D show a transistor 150 which is one embodiment of a semiconductor device. The transistor 150 is a bottom-gate transistor. FIG. 9A is a top view of the transistor 150. FIG. 9B is a cross-sectional view taken along dashed-dotted line A1-A2 in FIG. 9A and FIG. 9C is a cross-sectional view taken along dashed-dotted line B1-B2 in FIG. 9A. FIG. 9D is an enlarged view of a region surrounded by a dashed-dotted-line circle in FIG. 9B. Note that in FIG. 9A, some components are omitted.

The stacked-layer structure of the multilayer film 103 of the transistor 150 is different from that of the transistor 100 in the cross-sectional structure. In the multilayer film 103 of the transistor 150, the oxide semiconductor film 103a is provided over an oxide film 103c while the oxide film 103b is provided over the oxide semiconductor film 103a (see FIG. 9D). Note that the other components of the transistor 150 is the same as those of the transistor 100.

Also in the transistor 150, the oxide film 105 is provided in contact with the top surfaces of the oxide film 103b, the source electrode 104a, and the drain electrode 104b.

In the transistor 150, as in the transistor 100, depending on the kind of conductive film used for the source electrode 104a and the drain electrode 104b, oxygen is taken away from part of the multilayer film 103 or a mixed layer is formed, so that a low-resistance region 109a and a low-resistance region 109b are formed in the multilayer film 103 in some cases.

In FIGS. 9B and 9C, the low-resistance regions 109a and 109b are regions in the vicinity of an interface between the multilayer film 103 and the source electrode 104a and an interface between the multilayer film 103 and the drain electrode 104b in the multilayer film 103. Part or the whole of the low-resistance region 109a and part or the whole of the low-resistance region 109b function as a source region and a drain region.

[Multilayer Film and Oxide Film in Contact with the Multilayer Film]

The oxide film 103c, the oxide semiconductor film 103a, and the oxide film 103b included in the multilayer film 103 of the transistor 150 are described below. Note that the oxide semiconductor film 103a and the oxide film 103b of the transistor 150 are the same as those of the transistor 100; thus, here, only the oxide film 103c, which is not included in the transistor 100, is described.

For the oxide film 103c, the material which can be used for the oxide semiconductor film 103a and the oxide film 103b can be used as appropriate. Further, the oxide film 103c is preferably formed using a material including one or more kinds of metal elements included in the oxide semiconductor film 103a. In particular, the oxide film 103c is preferably formed using the material which can be used for the oxide film 103b. By using such a material, an interface state between the oxide semiconductor film 103a and the oxide film 103b cannot easily occur. Thus, scattering of carriers or capture of carriers at the interface does not easily occur, so that the field-effect mobility of the transistor can be improved. Further, variation in threshold voltage of the transistor can be reduced.

The oxide film 103c, the oxide semiconductor film 103a, and the oxide film 103b are successively formed under an inert gas atmosphere, an oxidation gas atmosphere, or a reduced pressure without exposure to the air between the formation steps, whereby the interface state between the oxide semiconductor film 103a and each of the oxide film 103c and the oxide film 103b can be less likely to be generated.

The thickness of the oxide film 103c is greater than or equal to 3 nm and less than or equal to 100 nm, preferably greater than or equal to 3 nm and less than or equal to 50 nm.

The oxide film 103c may be in a non-single-crystal state like the oxide semiconductor film 103a and the oxide film 103b.

Further, in the transistor 150, at least the oxide semiconductor film 103a may include a CAAC-OS film.

In a transistor using the CAAC-OS film, change in electrical characteristics due to irradiation with visible light or ultraviolet light is small. Thus, the transistor has high reliability.

In order that the oxide semiconductor film 103a be a CAAC-OS film, it is preferable that the oxide film 103c serving as a base be amorphous or have crystallinity similar to that of a CAAC-OS film.

Further, when the oxide semiconductor film 103a is a CAAC-OS film, the oxide film 103b formed over the oxide semiconductor film 103a easily becomes a CAAC-OS film. Note that the oxide film 103b may be amorphous.

In the transistor including the multilayer film 103, the oxide semiconductor film 103a is a layer in which a channel is formed; thus, it is preferable that the oxide semiconductor film 103a have high crystallinity so that the transistor can have stable electric characteristics.

In the transistor 150, as in the transistor 100, the absorption coefficient due to the localized levels of the multilayer film 103 measured by CPM is preferably lower than $1 \times 10^{-3}$ $cm^{-1}$, further preferably lower than $3 \times 10^{-4}$ $cm^{-1}$. As a result, the field-effect mobility of the transistor can be increased. In order that the absorption coefficient is in the above range, the concentration of silicon, germanium, carbon, hafnium, titanium, and the like in the oxide semiconductor film 103a which form localized levels is preferably lower than $2 \times 10^{18}$ atoms/$cm^3$, further preferably lower than $2 \times 10^{17}$ atoms/$cm^3$.

A function and an effect of the multilayer film 103 in this embodiment are described below with reference to energy band structure diagrams of FIGS. 10A and 10B and FIGS. 11A and 11B. FIGS. 10A and 10B and FIGS. 11A and 11B each show the energy band structure along dashed-dotted line C1-C2 in FIG. 9B.

In FIGS. 10A and 10B and FIGS. 11A and 11B, Ec182, Ec183c, Ec183a, Ec183b, Ec185, and Ec186 represent the energies of the conduction band bottoms of the gate insulating film 106, the oxide film 103c, the oxide semiconductor film 103a, the oxide film 103b, the oxide film 105, and the insulating film 120, respectively.

Since the gate insulating film 106 and the insulating film 120 are insulators, Ec182 and Ec186 are closer to the vacuum level (have a smaller electron affinity) than Ec183c, Ec183a, Ec183b, and Ec185.

Further, Ec183c and Ec183b are closer to the vacuum level than Ec183a. Specifically, the energy difference between Ec183a and Ec183c and the energy difference between Ec183a and Ec183b are greater than or equal to 0.05 eV and less than or equal to 2 eV. Preferably, the lower limit of each of the energy differences is greater than or equal to 0.1 eV, more preferably greater than or equal to 0.15 eV.

In FIGS. 10A and 10B and FIGS. 11A and 11B, there is no barrier between the oxide semiconductor film 103a and the oxide film 103b, between the oxide semiconductor film 103a and the oxide film 103c, and between the oxide film 103b and the oxide film 105, and the energy of the conduction band bottom smoothly varies. In other words, the energy of the conduction band bottom successively varies. This is because, as described in Embodiment 1, the oxide film 103b and the oxide film 103c each contain an element common to the oxide semiconductor film 103a, and oxygen mutually moves between the oxide semiconductor film 103a and the oxide film 103c and between the oxide semiconductor film 103a and the oxide film 103b to form mixed layers.

Further, as described in Embodiment 1, in the case where the multilayer film 103 having the above energy band structure is included in the transistor, electrons transfer mainly through the oxide semiconductor film 103a. That is, the channel region is formed in the oxide semiconductor film 103a. Therefore, even when a state exists at an interface with the insulating film that is the outside of the multilayer film 103, the state hardly influences the transfer of the electrons. In addition, since no state or few states exist between the layers included in the multilayer film 103, the transfer of electrons is not interrupted in the channel region. Accordingly, the oxide semiconductor film 103a of the multilayer film 103 has high electron mobility.

Figure 10A:
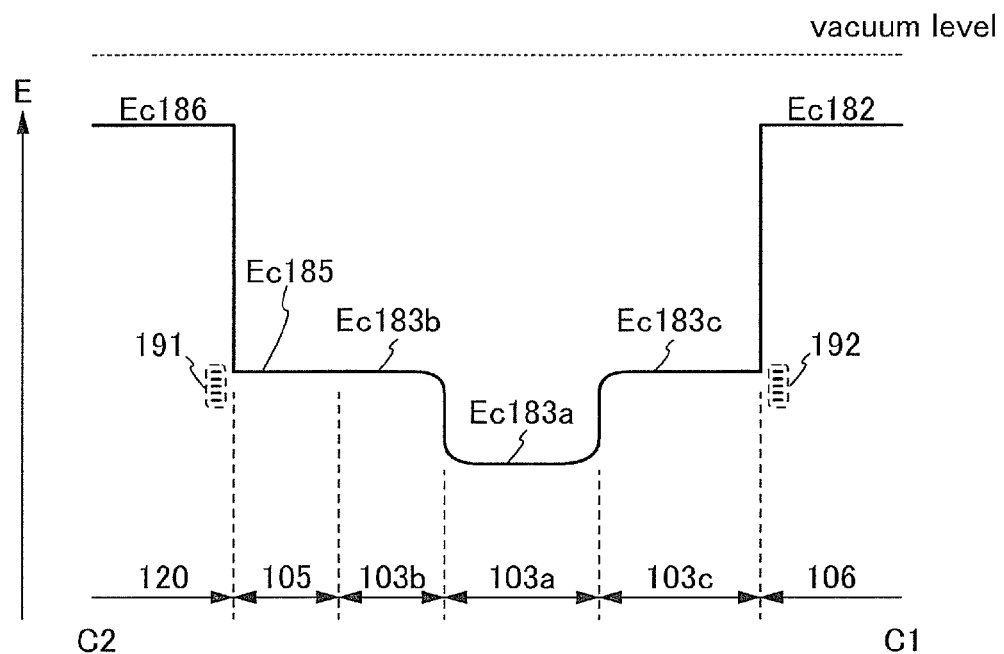
FIGS. 10A and 10B each illustrate an energy band structure of a multilayer film.

Particularly in the case where the oxide film 105 and the oxide film 103b are formed using the same material, the energy of Ec185 and the energy of Ec183b are equivalent (see FIG. 10A).

As shown in FIG. 10A, although a trap level 191 due to impurities or defects might be formed in the vicinity of the interface between the oxide film 105 and the insulating film 120 and a trap level 192 due to impurities or defects might be formed in the vicinity of the interface between the oxide film 103c and the gate insulating film 106, the oxide semiconductor film 103a can be distanced away from the trap level 191 and the trap level 192 owing to existence of the oxide films 103c, 103b, and 105.

However, in the case where an energy difference between Ec183a and Ec183b and an energy difference between Ec183a and Ec183c are small, electrons of the oxide semiconductor film 103a might reach the trap level 191 and the trap level 192 by passing over the energy differences. When the electrons are captured by the trap level 191 and the trap level 192, negative charge is generated at the interface with the insulating film, so that the threshold voltage of the transistor is shifted in the positive direction.

Thus, the energy differences between Ec183a and Ec183b and between Ec183a and Ec183c are preferably in the above range. Accordingly, variation in the threshold voltage of the transistor 150 can be reduced and electrical characteristics of the transistor 150 can be improved.

Also in the transistor 150, as the material of the oxide film 105, the material which can be used for the oxide semiconductor film 103a and the oxide film 103b can be used as appropriate. In particular, the oxide film 105 is preferably formed using a material including one or more kinds of metal elements included in the oxide film 103b. There is no barrier between the oxide film 103b and the oxide film 105, and the energy of the conduction band bottom can smoothly vary.

In order to have the energy band structure shown in FIG. 10A, the oxide semiconductor film 103a is formed using an In—Ga—Zn oxide having an atomic ratio of In:Ga:Zn=1:1:1 as a target and the oxide films 103c, 103b, and 105 are each formed using an In—Ga—Zn oxide having an atomic ratio of In:Ga:Zn=1:3:2 as a target.

Note that the band gaps of the oxide films 103c, 103b, and 105 are each preferably wider than the band gap of the oxide semiconductor film 103a.

Figure 10B:
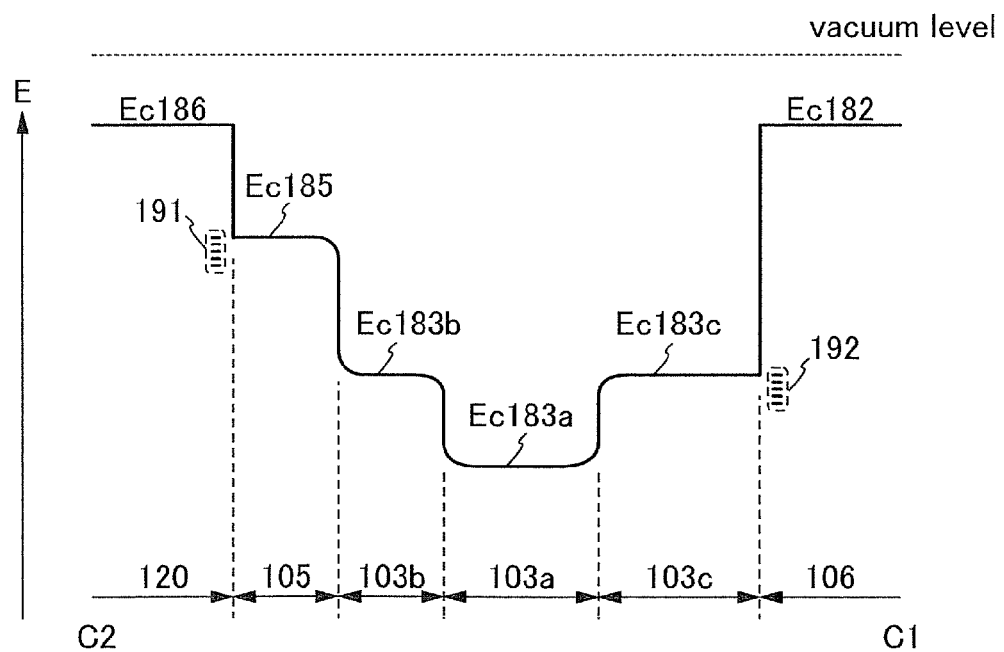

In FIG. 10A, the oxide films 103c, 103b, and 105 are formed using materials whose conduction band bottoms have the same energy; however, the oxide film 105 may be formed using a material in which the energy of the conduction band bottom is closer to the vacuum level than the energies of the conduction band bottoms of the oxide films 103c and 103b (see FIG. 10B).

Specifically, the oxide semiconductor film 103a is formed using an In—Ga—Zn oxide having an atomic ratio of In:Ga:Zn=1:1:1 as a target, the oxide films 103c and 103b are each formed using an In—Ga—Zn oxide having an atomic ratio of In:Ga:Zn=1:3:2 as a target, and the oxide film 105 is formed using an In—Ga—Zn oxide having an atomic ratio of In:Ga:Zn=1:6:4 or In:Ga:Zn=1:9:4 as a target.

In other words, in the case where the oxide films 105, 103c, and 103b are formed using an In-M-Zn oxide, an atomic ratio of an element M to In of the oxide film 105 is preferably greater than or equal to an atomic ratio of an element M to In of each of the oxide films 103c and 103b.

Figure 11A:
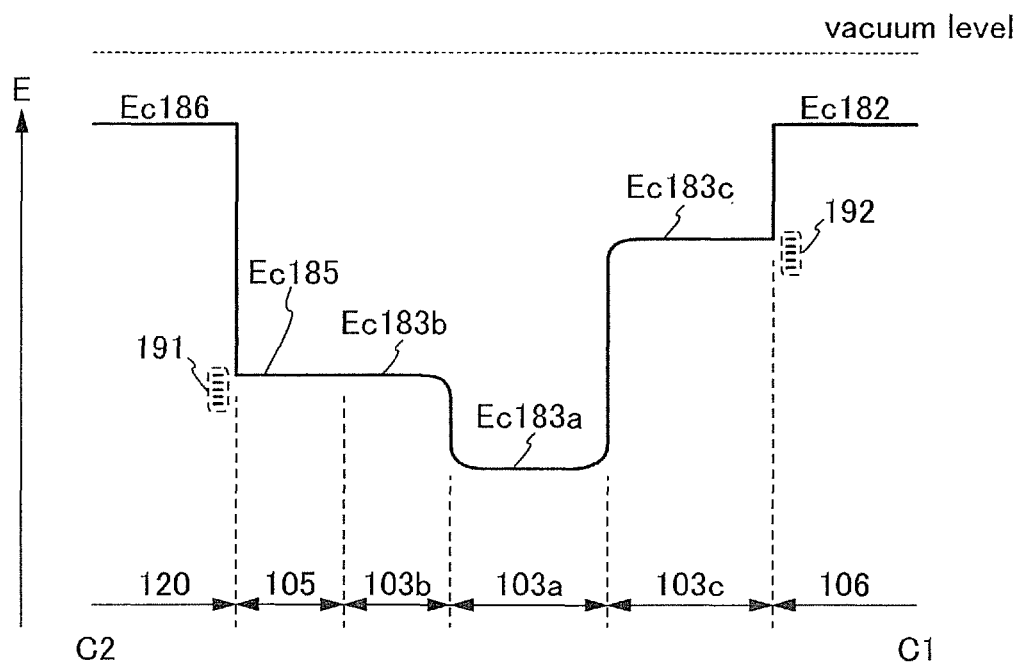
FIGS. 11A and 11B each illustrate an energy band structure of a multilayer film.

Further, the energy band structure of the transistor 150 is not limited to the structures in FIGS. 10A and 10B, but may be a structure in which the oxide film 105 and the oxide film 103b may be formed using materials whose conduction band bottoms have the same energy and the oxide film 103c may be formed using a material in which the energy of the conduction band bottom is closer to the vacuum level than the oxide film 105 and the oxide film 103b (see FIG. 11A).

Figure 11B:
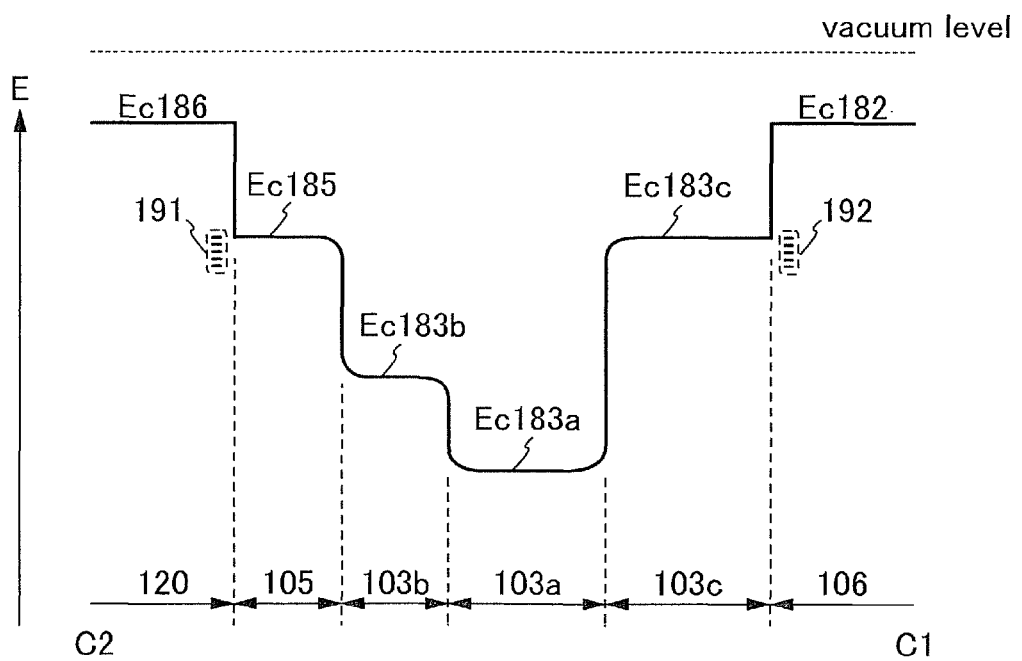

Alternatively, in the energy band structure of the transistor 150, the oxide film 105 and the oxide film 103c may be formed using materials whose conduction band bottoms have the same energy and may be formed using materials in which the energy of the conduction band bottom is closer to the vacuum level than the oxide semiconductor film 103a and the oxide film 103b (see FIG. 11B).

Further, in order to reduce influence of the trap level 191 which is formed in the vicinity of the interface between the oxide film 105 and the insulating film 120 and the trap level 192 which is formed in the vicinity of the interface between the oxide film 103c and the gate insulating film 106, the energy difference between Ec183a and Ec183b, the energy difference between Ec183a and Ec183c, and the energy difference between Ec183b and Ec185 are each greater than or equal to 0.05 eV and less than or equal to 2 eV. Preferably, the lower limit of the energy difference is greater than or equal to 0.1 eV, more preferably greater than or equal to 0.15 eV. Preferably, the upper limit of the energy difference is less than or equal to 0.5 eV, more preferably less than or equal to 0.4 eV.

In order to have the energy band structure shown in FIG. 11A, it is preferable that the oxide semiconductor film 103a be formed using an In—Ga—Zn oxide having an atomic ratio of In:Ga:Zn=1:1:1 as a target, the oxide film 103b and the oxide film 105 be each using an In—Ga—Zn oxide having an atomic ratio of In:Ga:Zn=1:3:2 as a target, and the oxide film 103c be formed using an In—Ga—Zn oxide having an atomic ratio of In:Ga:Zn=1:6:4 or In:Ga:Zn=1:9:4 as a target.

In order to have the energy band structure shown in FIG. 11B, it is preferable that the oxide semiconductor film 103a be formed using an In—Ga—Zn oxide having an atomic ratio of In:Ga:Zn=1:1:1 as a target, the oxide film 103b be formed using an In—Ga—Zn oxide having an atomic ratio of In:Ga:Zn=1:3:2 as a target, and the oxide film 103c and the oxide film 105 each be formed using an In—Ga—Zn oxide having an atomic ratio of In:Ga:Zn=1:6:4 or In:Ga:Zn=1:9:4 as a target.

In this manner, in the case of the energy band structure shown in FIGS. 10A and 10B and FIGS. 11A and 11B, the oxide semiconductor film 103a in the multilayer film 103 can have high electron mobility, variation in the threshold voltage can be reduced, so that the transistor 150 having favorable electrical characteristics can be achieved.

[Example of Method for Manufacturing Semiconductor Device]

An example of a method for manufacturing the transistor 150 is described below.

Figure 12A:
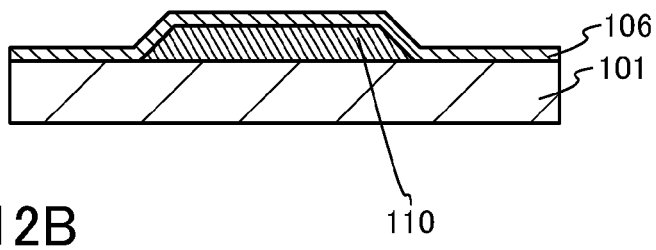
FIGS. 12A to 12E are cross-sectional views illustrating an example of a method for manufacturing a semiconductor device.

First, the gate electrode 110 is formed over the substrate 101 and the gate insulating film 106 is formed over the gate electrode 110 (see FIG. 12A). Next, over the gate insulating film 106, a multilayer film is formed by forming an oxide film which is to be processed into the oxide film 103c, forming an oxide semiconductor film which is to be processed into the oxide semiconductor film 103a over the oxide film, and forming an oxide film which is to be processed into the oxide film 103b over the oxide semiconductor film. A resist mask is formed over the multilayer film and then part of the multilayer film is selectively etched using the resist mask, so that the multilayer film 103 including the oxide film 103c, the oxide semiconductor film 103a, and the oxide film 103b is formed (see FIG. 12B). Then, the source electrode 104a and the drain electrode 104b are formed over the multilayer film 103 and the gate insulating film 106 (see FIG. 12C). The oxide film 105 is formed over the multilayer film 103, the source electrode 104a, and the drain electrode 104b (see FIG. 12D). The insulating film 120 is formed over the oxide film 105 (see FIG. 12E). Note that also in the method for manufacturing the transistor 150, as in the method for manufacturing the transistor 100, the first heat treatment to the third heat treatment are preferably performed.

For the detail of each step of the method for manufacturing the transistor 150, Embodiment 1 can be referred to.

In this manner, the transistor 150 can be fabricated.

Note that in the manufacturing process of the transistor 150, the oxide film 103b is partly etched in some cases at the time of forming the source electrode 104a and the drain electrode 104b. Further, on the top surface of the oxide semiconductor film 103a, a mixed layer of the oxide semiconductor film 103a and the oxide film 103b is formed at the time of forming the oxide film 103b in some cases.

For example, in the case where the oxide semiconductor film 103a is formed using an In—Ga—Zn oxide having an atomic ratio of In:Ga:Zn=1:1:1 or an In—Ga—Zn oxide having an atomic ratio of In:Ga:Zn=3:1:2 as a target, the oxide film 103b is formed using an In—Ga—Zn oxide having an atomic ratio of In:Ga:Zn=1:3:2 or an In—Ga—Zn oxide having an atomic ratio of In:Ga:Zn=1:6:4 as a target, the oxide film 103c is formed using an In—Ga—Zn oxide having an atomic ratio of In:Ga:Zn=1:3:2 or an In—Ga—Zn oxide having an atomic ratio of In:Ga:Zn=1:6:4 as a target, and the oxide film 105 is formed using an In—Ga—Zn oxide having an atomic ratio of In:Ga:Zn=1:3:2 or an In—Ga—Zn oxide having an atomic ratio of In:Ga:Zn=1:6:4 as a target, a Ga content in the oxide film 103b is higher than that in the oxide semiconductor film 103a, so that a mixed layer in which a Ga content is higher than that in a GaOx layer or the oxide semiconductor film 103a can be formed on the top surface of the oxide semiconductor film 103a.

Figure 25:
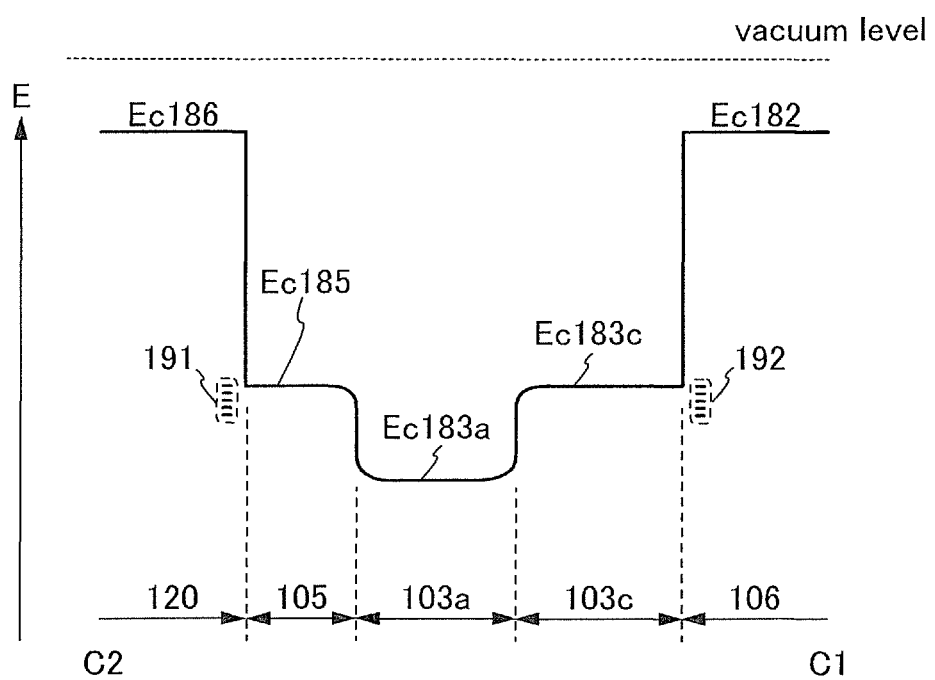
FIG. 25 illustrates an energy band structure of a multilayer film.

An energy band structure diagram of a cross section C1-C2 of the transistor 150 in such a case is shown in FIG. 25. FIG. 25 shows a modification example of the energy band structures in FIGS. 10A and 10B and FIGS. 11A and 11B. In FIG. 25, Ec182, Ec183a, Ec183c, and Ec185 represent the energies of the conduction band bottoms of the gate insulating film 106, the oxide semiconductor film 103a, the oxide film 103c, and the oxide film 105, respectively.

As described above, even in the case where the oxide film 103b is etched and the oxide film 105 is in contact with the oxide semiconductor film 103a, the mixed layer in which a Ga content is higher than that in the GaOx layer or the oxide semiconductor film 103a is formed between the oxide film 105 and the oxide semiconductor film 103a, so that Ec183a and Ec185 are continuously connected. Further, Ec185 is higher than at least Ec183a.

Modification Example 1

Figure 13B:
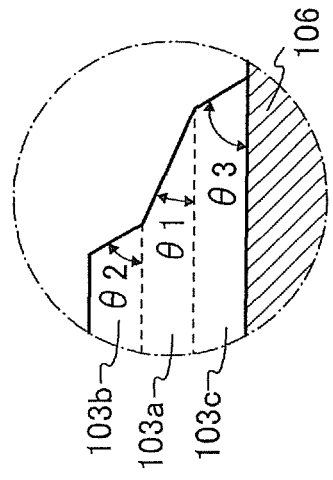
FIGS. 13A to 13D illustrate examples of a cross-sectional shape of an end portion of a multilayer film.
Figure 13D:
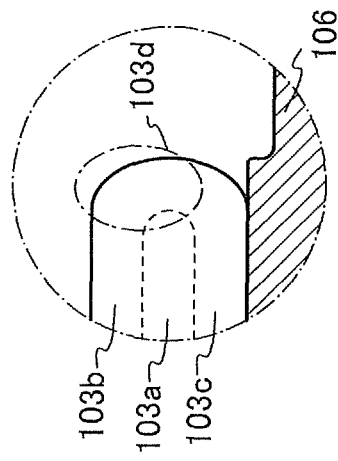
Figure 13A:
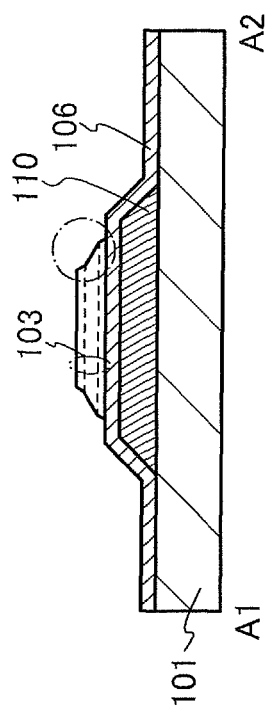

Here, a modification example of the transistor 150 is described. FIG. 13A illustrates some components (the substrate 101, the gate electrode 110, the gate insulating film 106, and the multilayer film 103) of a transistor which is the modification example. FIG. 13B is an enlarged view of an end portion of the multilayer film 103 (a region surrounded by a dashed-dotted-line circle) in FIG. 13A.

In the multilayer film 103 in the modification example, at least the oxide semiconductor film 103a has a tapered shape. Preferably, the oxide films 103b and 103c each also have a tapered shape. In addition, the tapered shape of the oxide semiconductor film 103a and the tapered shapes of the oxide films 103b and 103c are different.

Specifically, when the angle between the bottom surface of the oxide semiconductor film 103a and a side surface of the oxide semiconductor film 103a in the oxide semiconductor film 103a is defined as a first angle $\theta 1$, the angle between the bottom surface of the oxide film 103b and a side surface of the oxide film 103b in the oxide film 103b is defined as a second angle $\theta 2$, and the angle between the bottom surface of the oxide film 103c and a side surface of the oxide film 103c in the oxide film 103c is defined as a third angle $\theta 3$, the first angle $\theta 1$ can be an acute angle and the second angle $\theta 2$ and the third angle $\theta 3$ can be individually an acute angle or a right angle.

It is particularly preferable that the first angle $\theta 1$, the second angle $\theta 2$, and the third angle $\theta 3$ be all acute angles and that the first angle $\theta 1$ is smaller than the second angle $\theta 2$ and the third angle $\theta 3$ (see FIG. 13B).

Note that the second angle $\theta 2$ and the third angle $\theta 3$ may be the same angle or different angles. For example, the second angle $\theta 2$ and the third angle $\theta 3$ can be the same angle by using the same kind of oxide films as the oxide film 103b and the oxide film 103c.

Further, the first angle θ1 is greater than or equal to 10° and less than 90°, preferably greater than or equal to 30° and less than or equal to 80°. The second angle θ2 and the third angle θ3 are each greater than or equal to 10° and less than 90°, preferably greater than or equal to 30° and less than or equal to 80°, more preferably greater than or equal to 45° and less than or equal to 70°.

In this modification example, for example, as in Embodiment 1, difference in etching rate among the oxide film 103c, the oxide semiconductor film 103a, and the oxide film 103b is utilized, whereby a shape illustrated in FIGS. 13A and 13B can be formed. The above-described tapered shape can be formed by setting the etching rate of the oxide semiconductor film 103a lower than those of the oxide film 103b and the oxide film 103c.

Figure 12B:
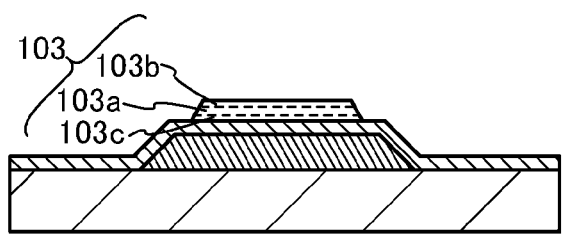
Figure 12C:
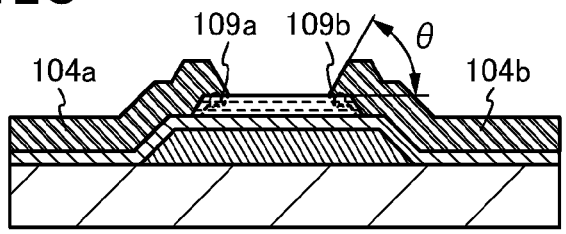
Figure 12D:
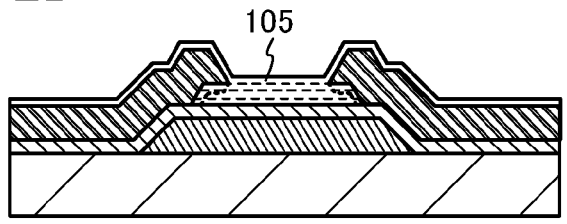
Figure 12E:
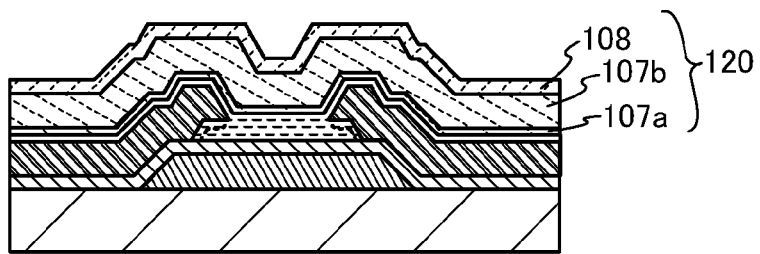

For example, in the step of FIG. 12B, the tapered shapes can be formed by wet etching using a solution containing a phosphoric acid as an etchant. For the details of the wet etching, Embodiment 1 can be referred to.

In this modification example, effects of the modification example of the transistor 100 in Embodiment 1 can also be obtained.

Modification Example 2

Figure 13C:
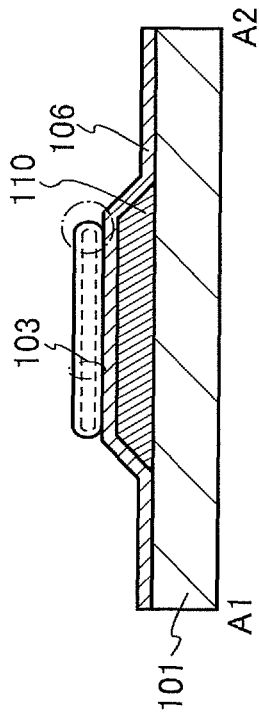

Next, a modification example of the transistor 150, which is different from the above modification example, is shown in FIG. 13C. FIG. 13D is an enlarged view of an end portion of the multilayer film 103 (a region surrounded by a dashed-dotted-line circle) in FIG. 13C.

In this modification example, the side surface of the multilayer film 103 has a curved surface. In the multilayer film 103 whose side surface has a curved surface illustrated in FIGS. 13C and 13D, an oxide film 103d is formed on the side surface of the multilayer film 103, and the end portion of the multilayer film 103 in the cross-sectional shape has a curved surface.

The oxide film 103d can be formed in such a manner that the etching for forming the multilayer film 103 is performed by selecting conditions from those given in Embodiment 1. Part of the oxide film 103c which is etched by the dry etching is reattached to the side surface of the multilayer film, whereby the oxide film 103d is formed. By forming the oxide film 103d on the side surface of the multilayer film 103, the density of localized levels generated at the side surface can be reduced. Thus, the transistor 150 can have favorable electric characteristics.

Modification Example 3

Figure 14:
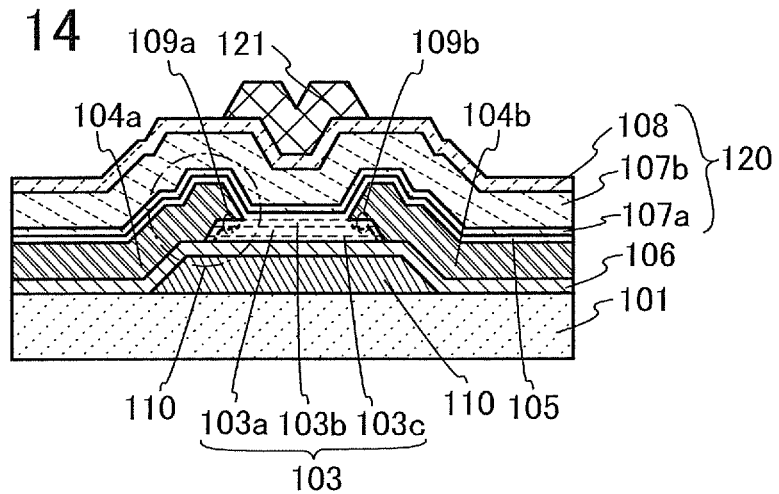
FIG. 14 is a cross-sectional view illustrating an example of a transistor.

As a modification example, in the transistor 150, a conductive film 121 can be provided in a region which overlaps with the multilayer film 103 over the insulating film 120 (see FIG. 14). FIG. 14 shows a cross-sectional view of the transistor of the modification example in the channel length direction. In this case, the gate electrode 110 can be referred to as a first gate electrode, and the conductive film 121 can be referred to as a second gate electrode. Further, one of the first gate electrode and the second gate electrode can function as a gate electrode, and the other thereof can function as a back gate electrode.

Effects obtained by providing the conductive film 121 in this modification example are similar to those in Embodiment 1.

This embodiment can be implemented in appropriate combination with any of the structures described in the other embodiments, example, and reference example.

Embodiment 3

Display Device

The transistor described in the above embodiments can be used in a display device. Further, with the above-described transistor, part or all of a driver circuit which includes the transistor can be formed over a substrate where a pixel portion is formed, whereby a system-on-panel can be formed. Structural examples of a display device in which the above transistor can be used are described with reference to FIG. 15, FIGS. 16A to 16C, FIGS. 17A and 17B, FIG. 18, and FIGS. 19A to 19C.

As a display element provided in the display device, a liquid crystal element (also referred to as a liquid crystal display element), a light-emitting element (also referred to as a light-emitting display element) or the like can be used. A light-emitting element includes, in its category, an element whose luminance is controlled by current or voltage, and specifically an inorganic electroluminescent (EL) element, an organic EL element, and the like. Furthermore, a display medium whose contrast is changed by an electric effect, such as electronic ink, can be used as the display element. A display device including an EL element and a display device including a liquid crystal element are described below as examples of the display device.

The display device described below includes, in its category, a panel in which a display element is sealed and a module in which an IC such as a controller is mounted on the panel.

The display device described below refers to an image display device or a light source (including a lighting device). The display device includes any of the following modules in its category: a module provided with a connector such as an FPC or TCP; a module in which a printed wiring board is provided at the end of TCP; and a module in which an integrated circuit (IC) is mounted directly on a display element by a COG method.

The display devices described below can be provided with an input means (a touch sensor) capable of contact or proximity sensing of an object (not shown). For example, as the input means capable of contact sensing, touch sensors of various types such as a resistive type, a capacitive type, an infrared ray type, an electromagnetic induction type, and a surface acoustic wave type can be used. As the input means capable of proximity sensing, an infrared camera or the like can be used.

The input means may be provided over a display device described below to form what is called an on-cell display device or may be provided integrally with a display device described below to form what is called an in-cell display device.

[EL Display Device]

Here, a display device including an EL element (also called an EL display device) is described.

Figure 15:
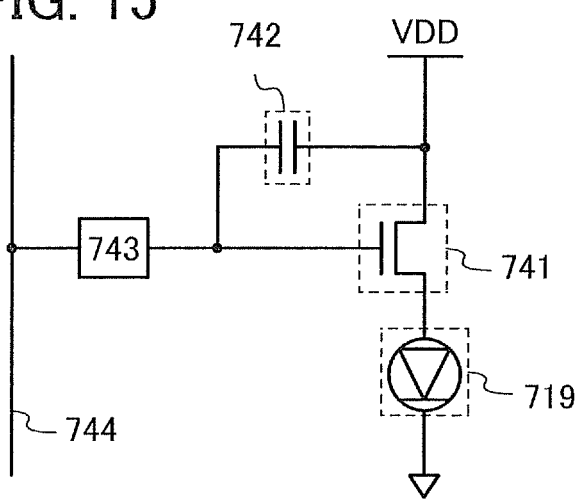
FIG. 15 illustrates an example of a pixel circuit which can be used for a display device.

FIG. 15 is an example of a circuit diagram of a pixel in the EL display device.

The EL display device illustrated in FIG. 15 includes a switching element 743, a transistor 741, a capacitor 742, and a light-emitting element 719.

A gate of the transistor 741 is electrically connected to one terminal of the switching element 743 and one terminal of the capacitor 742. A source of the transistor 741 is electrically connected to one terminal of the light-emitting element 719. A drain of the transistor 741 is electrically connected to the other terminal of the capacitor 742 and is supplied with a power supply potential VDD. The other terminal of the switching element 743 is electrically connected to a signal line 744. The other terminal of the light-emitting element 719 is supplied with a fixed potential. Note that the fixed potential is a ground potential GND or lower.

Note that as the transistor 741, the transistor described in the above embodiment is used. The transistor has stable electrical characteristics. Thus, the EL display device can have high display quality.

As the switching element 743, a transistor is preferably used. When the transistor is used as the switching element, the area of a pixel can be reduced, so that the EL display device can have high resolution. Alternatively, the transistor described in the above embodiment may be used as the switching element 743. When the above transistor is used as the switching element 743, the switching element 743 can be formed in the same process as the transistor 741, so that the productivity of the EL display device can be improved.

Figure 16A:
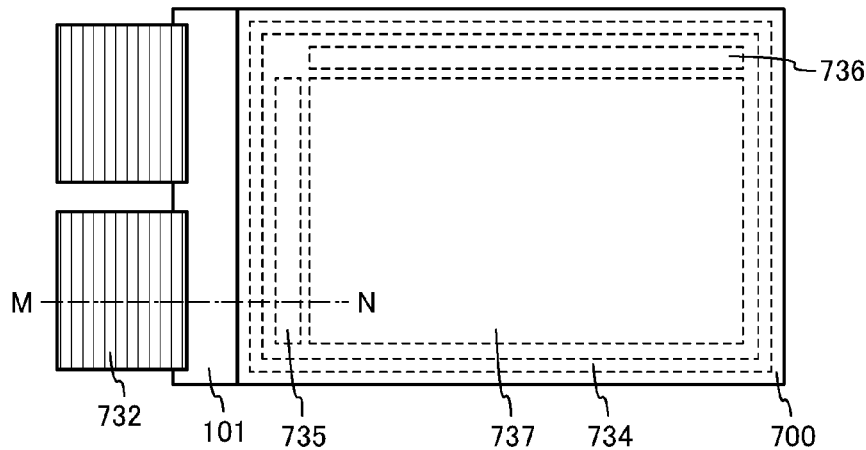
FIGS. 16A to 16C illustrate an example of a display device.

FIG. 16A is a top view of an EL display device. The EL display device includes a substrate 101, a substrate 700, a sealant 734, a driver circuit 735, a driver circuit 736, a pixel 737, and an FPC 732. The sealant 734 is provided between the substrate 101 and the substrate 700 so as to surround the pixel 737, the driver circuit 735 and the driver circuit 736. Note that the driver circuit 735 and/or the driver circuit 736 may be provided outside the sealant 734.

Figure 16B:
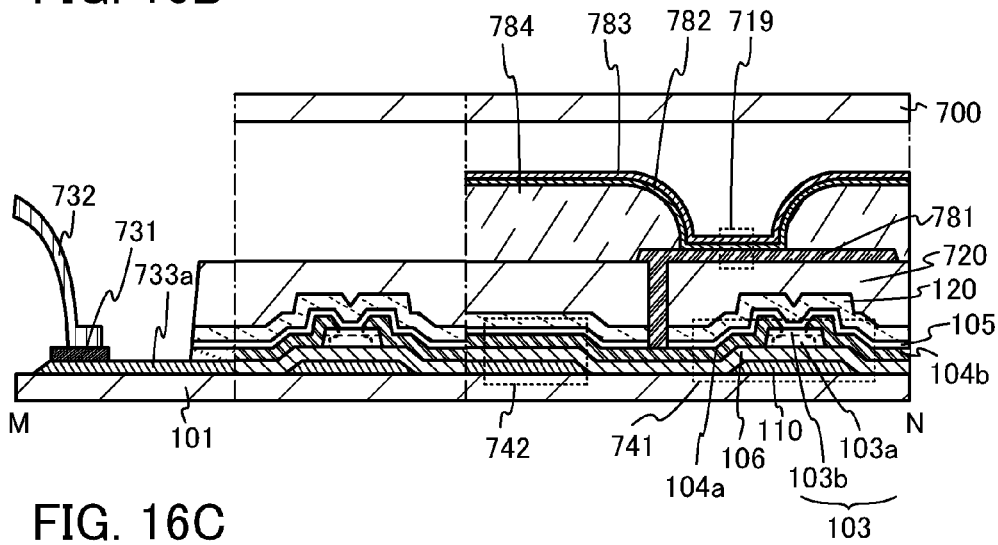

FIG. 16B is a cross-sectional view of the EL display device taken along dashed-dotted line M-N in FIG. 16A. The FPC 732 is connected to a wiring 733*a* via a terminal 731. Note that the wiring 733*a* is formed in the same layer as the gate electrode 110.

Note that FIG. 16B shows an example in which a transistor 741 and a capacitor 742 are provided in the same plane. With such a structure, the capacitor 742 can be formed in the same plane as a gate electrode, a gate insulating film, and a source electrode (drain electrode), which are included in the transistor 741. When the transistor 741 and the capacitor 742 are provided in the same plane in this manner, the number of manufacturing steps of the EL display device can be reduced; thus the productivity can be improved.

FIG. 16B illustrates an example in which the transistor illustrated in FIGS. 1A to 1D is used as the transistor 741. Therefore, for components of the transistor 741 which are not particularly described below, the description on FIGS. 1A to 1D is referred to.

An insulating film 720 is provided over the transistor 741 and the capacitor 742.

Here, an opening reaching the source electrode 104*a* of the transistor 741 is provided in the insulating film 720 and the insulating film 120.

An electrode 781 is provided over the insulating film 720. The electrode 781 is in contact with the source electrode 104*a* of the transistor 741 through the opening provided in the insulating film 720 and the insulating film 120.

A partition 784 having an opening reaching the electrode 781 is provided over the electrode 781.

A light-emitting layer 782 in contact with the electrode 781 through the opening provided in the partition 784 is provided over the partition 784.

An electrode 783 is provided over the light-emitting layer 782.

A region where the electrode 781, the light-emitting layer 782, and the electrode 783 overlap with one another serves as the light-emitting element 719.

Note that for the insulating film 720, the description of the insulating film 120 is referred to. Alternatively, a resin film of a polyimide resin, an acrylic resin, an epoxy resin, a silicone resin, or the like may be used.

Figure 16C:
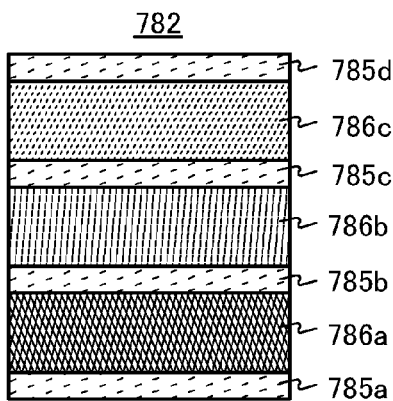

The light-emitting layer 782 is not limited to a single layer, and may be a stack including a plurality of kinds of light-emitting layers and the like. For example, a structure illustrated in FIG. 16C may be employed. FIG. 16C illustrates a structure in which an intermediate layer 785*a*, a light-emitting layer 786*a*, an intermediate layer 785*b*, a light-emitting layer 786*b*, an intermediate layer 785*c*, a light-emitting layer 786*c*, and an intermediate layer 785*d* are stacked in this order. In that case, when light-emitting layers emitting light of appropriate colors are used as the light-emitting layer 786*a*, the light-emitting layer 786*b*, and the light-emitting layer 786*c*, the light-emitting element 719 with a high color rendering property or higher emission efficiency can be formed.

A plurality of kinds of light-emitting layers may be stacked to obtain white light. Although not illustrated in FIG. 16B, white light may be extracted through coloring layers.

Although the structure in which three light-emitting layers and four intermediate layers are provided is shown here, the structure is not limited thereto. The number of light-emitting layers and the number of intermediate layers can be changed as appropriate. For example, the light-emitting layer 782 can be formed with only the intermediate layer 785*a*, the light-emitting layer 786*a*, the intermediate layer 785*b*, the light-emitting layer 786*b*, and the intermediate layer 785*c*. Alternatively, the light-emitting layer 782 may be formed with the intermediate layer 785*a*, the light-emitting layer 786*a*, the intermediate layer 785*b*, the light-emitting layer 786*b*, the light-emitting layer 786*c*, and the intermediate layer 785*d*; the intermediate layer 785*c* may be omitted.

Further, the intermediate layer may have a stacked-layer structure including a hole-injection layer, a hole-transport layer, an electron-transport layer, an electron-injection layer, or the like. Note that not all of these layers need to be provided in the intermediate layer. Any of these layers may be selected as appropriate to form the intermediate layer. Note that layers having similar functions may be provided. Further, an electron-relay layer or the like may be added as appropriate in the intermediate layer, in addition to a carrier generation layer.

The electrode 781 can be formed using a conductive film having visible light permeability. Having visible light permeability means having an average transmittance of 70% or more, particularly 80% or more in the visible light region (e.g., the range of wavelength of from 400 nm to 800 nm).

As the electrode 781, for example, an oxide film such as an In—Zn—W oxide film, an In—Sn oxide film, an In—Zn oxide film, an indium oxide film, a zinc oxide film, or a tin oxide film may be used. The above oxide film may contain a minute amount of Al, Ga, Sb, F, or the like. Further, a metal thin film having a thickness which enables light to be transmitted (preferably, approximately 5 nm to 30 nm) can also be used. For example, an Ag film, an Mg film, or an Ag—Mg alloy film with a thickness of 5 nm may be used.

The electrode 781 is preferably a film which efficiently reflects visible light. For example, a film containing lithium, aluminum, titanium, magnesium, lanthanum, silver, silicon, or nickel can be used as the electrode 781.

The electrode 783 can be formed using any of the films for the electrode 781. Note that when the electrode 781 has visible light permeability, it is preferable that the electrode 783 efficiently reflects visible light. When the electrode 781 efficiently reflects visible light, it is preferable that the electrode 783 have visible light permeability.

Positions of the electrode 781 and the electrode 783 are not limited to the structure illustrated in FIG. 16B, and the electrode 781 and the electrode 783 may be replaced with each other. It is preferable to use a conductive film having a high work function for the electrode which serves as an anode and a conductive film having a low work function for the electrode which serves as a cathode. Note that in the case where a carrier generation layer is provided in contact with the anode, a variety of conductive films can be used for the anode regardless of their work functions.

For the partition 784, the description of the insulating film 120 is referred to. Alternatively, a resin film of a polyimide resin, an acrylic resin, an epoxy resin, a silicone resin, or the like may be used.

In the display device, a black matrix (light-blocking film), an optical member (optical substrate) such as a polarizing member, a retardation member, or an anti-reflection member, and the like are provided as appropriate. For example, circular polarization may be obtained by using a polarizing substrate and a retardation substrate.

The transistor 741 connected to the light-emitting element 719 has stable electrical characteristics. Thus, a display device having high display quality can be provided.

Figure 17A:
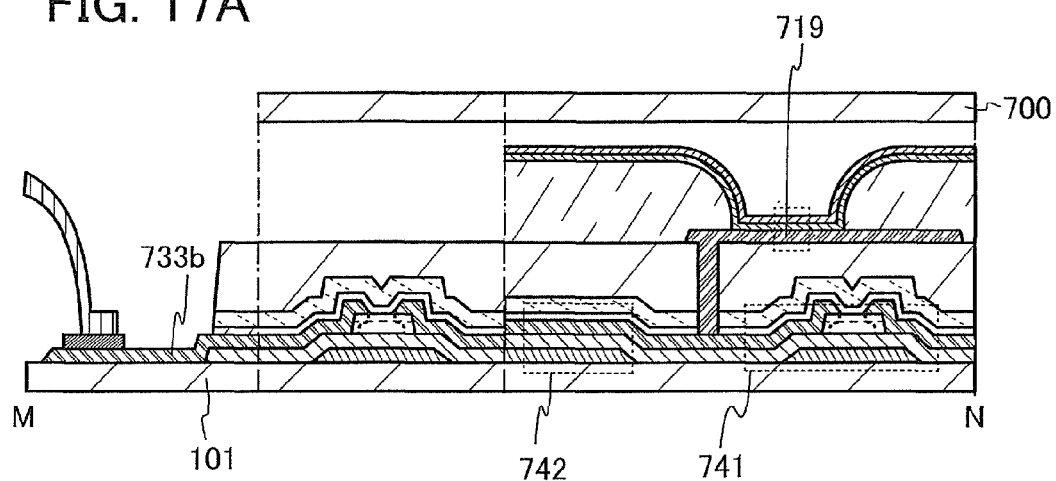
FIGS. 17A and 17B each illustrate an example of a display device.
Figure 17B:
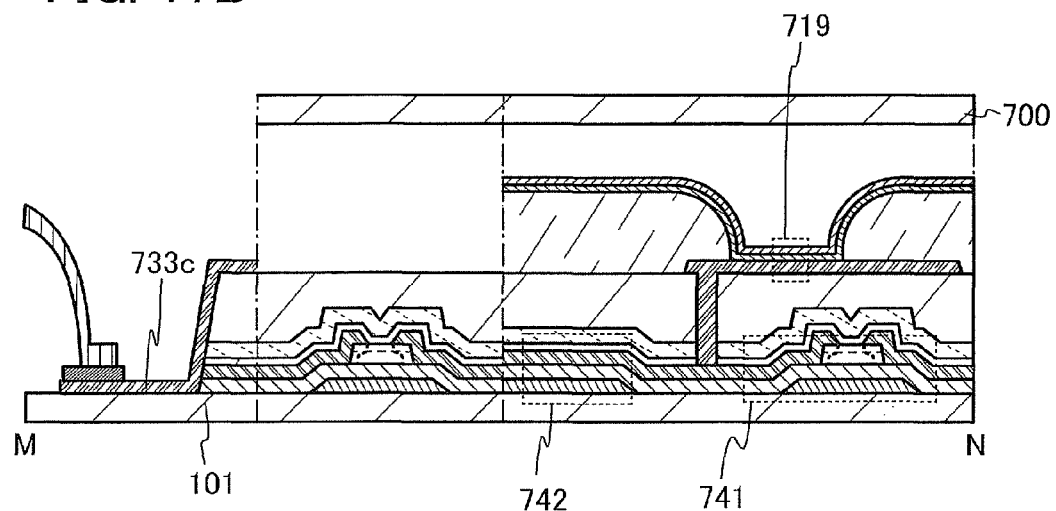

FIGS. 17A and 17B each illustrate an example of a cross section of an EL display device which is partly different from that in FIG. 16B. Specifically, the difference lies in a wiring connected to the FPC 732. In FIG. 17A, a wiring 733b is connected to the FPC 732 via the terminal 731. The wiring 733b is formed in the same layer as the source electrode 104a and the drain electrode 104b. In FIG. 17B, a wiring 733c is connected to the FPC 732 via the terminal 731. The wiring 733c is formed in the same layer as the electrode 781.

[Liquid Crystal Display Device]

Next, a display device including a liquid crystal element (also called a liquid crystal display device) is described.

Figure 18:
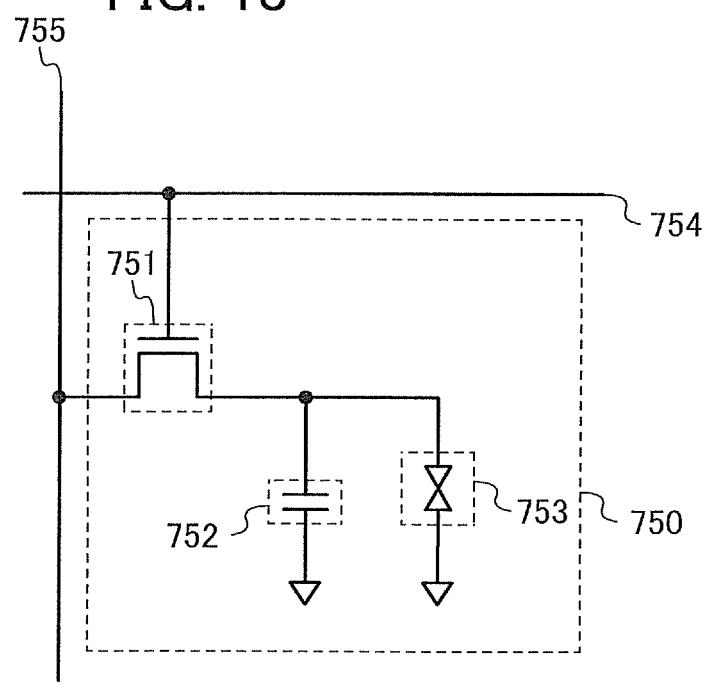
FIG. 18 illustrates an example of a pixel circuit which can be used for a display device.

FIG. 18 is a circuit diagram showing a structural example of a pixel of the liquid crystal display device. A pixel 750 illustrated in FIG. 18 includes a transistor 751, a capacitor 752, and an element 753 in which liquid crystal is injected between a pair of electrodes (hereinafter also referred to as liquid crystal element).

One of a source and a drain of the transistor 751 is electrically connected to a signal line 755, and a gate of the transistor 751 is electrically connected to a scan line 754.

One of electrodes of the capacitor 752 is electrically connected to the other of the source and the drain of the transistor 751, and the other of the electrodes of the capacitor 752 is electrically connected to a wiring for supplying a common potential.

One of electrodes of the liquid crystal element 753 is electrically connected to the other of the source and the drain of the transistor 751, and the other of the electrodes of the liquid crystal element 753 is electrically connected to a wiring for supplying a common potential. Note that the common potential supplied to the wiring to which the other of the electrodes of the liquid crystal element 753 is electrically connected may be different from the common potential supplied to the wiring to which the other of the electrodes of the capacitor 752 is electrically connected.

Figure 19A:
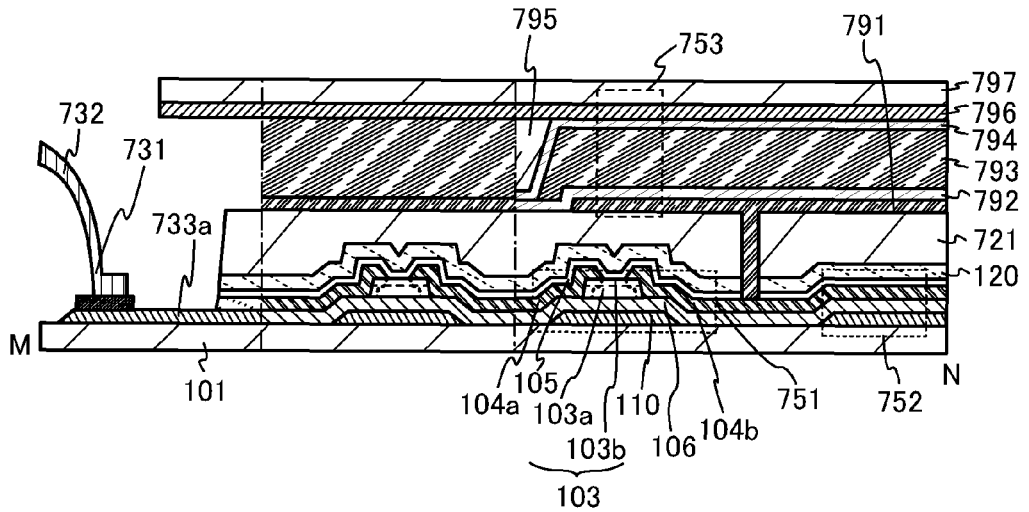
FIGS. 19A to 19C each illustrate an example of a display device.

Note that a top view of the liquid crystal display device is roughly similar to that of the EL display device. FIG. 19A is a cross-sectional view of the liquid crystal display device taken along dashed-dotted line M-N in FIG. 16A. In FIG. 19A, the FPC 732 is connected to the wiring 733a via the terminal 731. Note that the wiring 733a is formed in the same layer as the gate electrode 110.

Note that FIG. 19A illustrates an example in which the transistor 751 and the capacitor 752 are provided in the same plane. With such a structure, the capacitor 752 can be formed in the same plane as a gate electrode, a gate insulating film, and a source electrode (drain electrode), which are included in the transistor 751. When the transistor 751 and the capacitor 752 are provided in the same plane in this manner, the number of manufacturing steps of the liquid crystal display device can be reduced; thus, the productivity can be increased.

As the transistor 751, the transistor described above can be used. In FIG. 19A, the transistor illustrated in FIGS. 1A to 1D is used as the transistor 751. Therefore, for components of the transistor 751 which are not particularly described below, the description of FIGS. 1A to 1D is referred to.

Note that the transistor 751 can be a transistor having extremely low off-state current. Thus, the charge held in the capacitor 752 is unlikely to be leaked and voltage applied to the liquid crystal element 753 can be retained for a long time. Thus, by turning off the transistor 751 when an image with little motion or a still image is displayed, power for the operation of the transistor 751 is not needed. As a result, the power consumption of the liquid crystal display device can be low.

The size of the capacitor 752 provided in the liquid crystal display device is set considering the leakage current of the transistor 751 provided in the pixel portion, or the like so that charge can be held for a predetermined period. By using the transistor 751, it is enough to provide a capacitor having a capacitance that is ⅓ or less, preferably ⅕ or less of a liquid crystal capacitance of each pixel; therefore, the aperture ratio of a pixel can be increased.

An insulating film 721 is provided over the transistor 751 and the capacitor 752.

Here, an opening reaching the drain electrode 104b of the transistor 751 is provided in the insulating film 721 and the insulating film 120.

An electrode 791 is provided over the insulating film 721. The electrode 791 is in contact with the drain electrode 104b of the transistor 751 through the opening provided in the insulating film 721 and the insulating film 120.

An insulating film 792 serving as an alignment film is provided over the electrode 791.

A liquid crystal layer 793 is provided over the insulating film 792.

An insulating film 794 serving as an alignment film is provided over the liquid crystal layer 793.

A spacer 795 is provided over the insulating film 794.

An electrode 796 is provided over the spacer 795 and the insulating film 794.

A substrate 797 is provided over the electrode 796.

For the insulating film 721, the description of the insulating film 120 is referred to. Alternatively, a resin film of a polyimide resin, an acrylic resin, an epoxy resin, a silicone resin, or the like may be used.

For the liquid crystal layer 793, a thermotropic liquid crystal, a low-molecular liquid crystal, a polymer liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Note that as the liquid crystal layer 793, a liquid crystal exhibiting a blue phase may be used. In that case, the structure without the insulating films 792 and 794 serving as alignment films may be employed.

The electrode 791 can be formed using a conductive film having a transmitting property with respect to visible light.

As the electrode 791, for example, an oxide film such as an In—Zn—W oxide film, an In—Sn oxide film, an In—Zn oxide film, an indium oxide film, a zinc oxide film, or a tin oxide film may be used. The above oxide film may contain a minute amount of Al, Ga, Sb, F, or the like. Further, a metal thin film having a thickness which enables light to be transmitted (preferably, approximately 5 nm to 30 nm) can also be used.

Alternatively, the electrode 791 is preferably a film which efficiently reflects visible light. For example, a film containing aluminum, titanium, chromium, copper, molybdenum, silver, tantalum, or tungsten can be used as the electrode 791.

The electrode 796 can be formed using any of the films described above as the electrode 791. On the other hand, in the case where the electrode 791 has visible light permeability, it is preferable that the electrode 796 efficiently reflect visible light. When the electrode 791 efficiently reflects visible light, it is preferable that the electrode 796 have visible light permeability.

Positions of the electrode 791 and the electrode 796 are not limited to the structure illustrated in FIG. 19A, and the electrode 791 and the electrode 796 may be replaced with each other.

Each of the insulating films 792 and 794 may be formed using an organic compound or an inorganic compound.

The spacer 795 may be formed using an organic compound or an inorganic compound. Note that the spacer 795 can have a variety of shapes such as a columnar shape and a spherical shape.

A region where the electrode 791, the insulating film 792, the liquid crystal layer 793, the insulating film 794, and the electrode 796 overlap with one another functions as the liquid crystal element 753.

As the substrate 797, a glass substrate, a resin substrate, a metal substrate, or the like can be used. The substrate 797 may have flexibility.

Figure 19B:
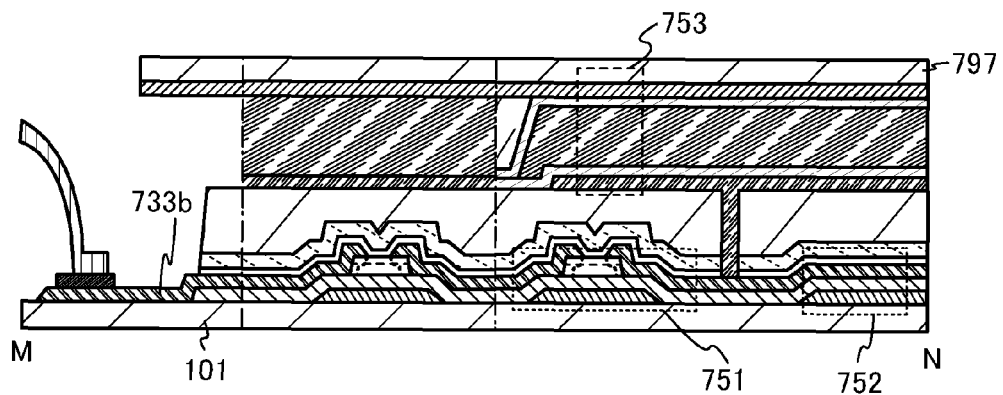
Figure 19C:
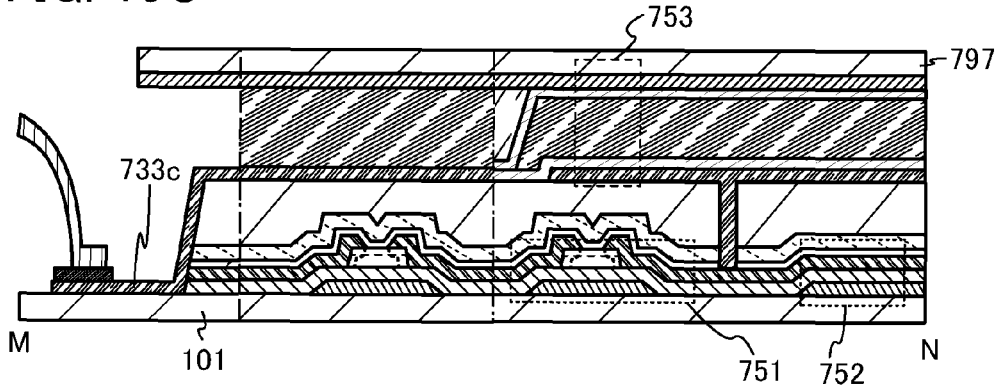

FIGS. 19B and 19C each illustrate an example of a cross section of a liquid crystal display device which is partly different from that in FIG. 19A. Specifically, the difference lies in a wiring connected to the FPC 732. In FIG. 19B, the wiring 733b is connected to the FPC 732 via the terminal 731. The wiring 733b is formed in the same layer as the source electrode 104a and the drain electrode 104b. In FIG. 19C, the wiring 733c is connected to the FPC 732 via the terminal 731. The wiring 733c is formed in the same layer as the electrode 791.

The transistor 751 connected to the liquid crystal element 753 has stable electrical characteristics. Thus, a liquid crystal display device having high display quality can be provided. Further, since the off-state current of the transistor 751 can be extremely low, a liquid crystal display device with low power consumption can be provided.

In the liquid crystal display device, the operation mode can be selected as appropriate. For example, as the driving method, there are a vertical electric field method where voltage is applied perpendicular to a substrate and a horizontal electric field method where voltage is applied in parallel to a substrate. Specifically, a TN mode, a VA mode, an MVA mode, a PVA mode, an ASM mode, a TBA mode, an OCB mode, an FLC mode, an AFLC mode, an FFS mode, or the like can be used.

In the liquid crystal display device, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

In addition, it is possible to employ a time-division display method (field-sequential driving method) with the use of a plurality of light-emitting diodes (LEDs) for a backlight. A field-sequential driving method enables color display without using a coloring layer.

As a display method in the pixel portion, a progressive method, an interlace method, or the like is employed. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. However, one embodiment of the present invention is not limited to a color liquid crystal display device and can be applied to a monochrome liquid crystal display device.

Here, a structural example of an input means (a touch sensor) for which the transistor of one embodiment of the present invention is used and capable of proximity or contact sensing of an object is described.

Here, the case of using a capacitive type is described. Examples of the capacitive touch sensor are typically of a surface capacitive type, a projected capacitive type, and the like. Further, examples of the projected capacitive type are of a self capacitive type, a mutual capacitive type, and the like mainly in accordance with the difference in the driving method. The use of a mutual capacitive type is preferable because multiple points can be sensed simultaneously.

[Example of Detection Method of Sensor]

Figure 26A:
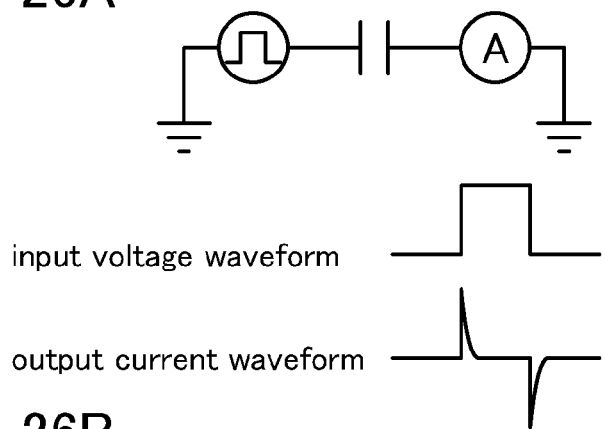
FIGS. 26A to 26C illustrate a touch sensor of one embodiment of the present invention.
Figure 26B:
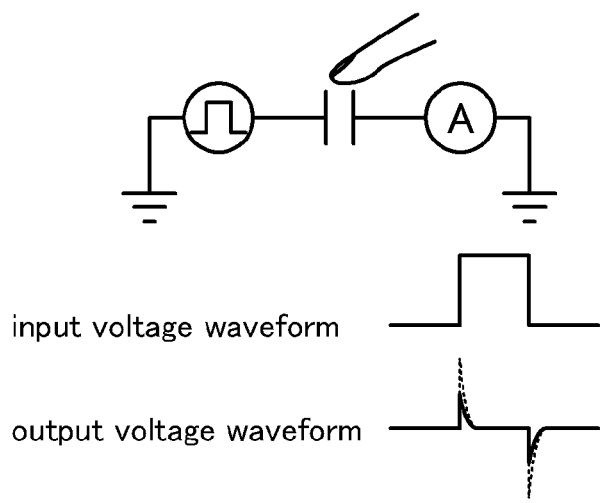

FIGS. 26A and 26B are schematic diagrams each illustrating a structure of a mutual capacitive touch sensor and input and output waveforms. The touch sensor includes a pair of electrodes. Capacitance is formed between the pair of electrodes. Input voltage is input to one of the pair of electrodes. Further, a detection circuit which detects current flowing in the other electrode (or a potential of the other electrode) is provided.

For example, in the case where a rectangular wave is used as an input voltage waveform as illustrated in FIG. 26A, a waveform having a sharp peak is detected as an output current waveform.

Further, in the case where an object having conductivity is close to or touches a capacitor as illustrated in FIG. 26B, the capacitance value between the electrodes is decreased; accordingly, the current value is decreased.

By detecting a change in capacitance by using a change in output current (or potential) with respect to input voltage in this manner, proximity or a touch of an object can be detected.

[Structure Example of Touch Sensor]

Figure 26C:
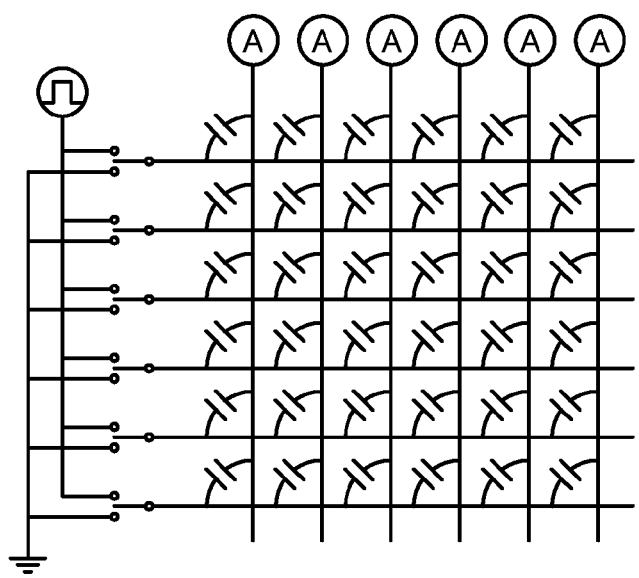

FIG. 26C illustrates a structure example of a touch sensor provided with a plurality of capacitors arranged in a matrix.

The touch sensor includes a plurality of wirings extending in an X direction (the horizontal direction of this figure) and a plurality of wirings extending in a Y direction (the vertical direction of this figure) which intersect with the plurality of wirings. Capacitance is formed between two wirings intersecting with each other.

One of input voltage and a common potential (including a grounded potential and a reference potential) is input to each of the wirings extending in the X direction. Further, a detection circuit (e.g., a source meter or a sense amplifier) is electrically connected to the wirings extending in the Y direction and can detect current (or potential) flowing through the wirings.

The touch sensor can perform sensing two dimensionally in such a manner that input voltage is sequentially input to the plurality of wirings extending in the X direction and detects a change in current (or potential) flowing through the wirings extending in the Y direction.

[Structural Example of Touch Panel]

A structure example of a touch panel incorporating the touch sensor into a display portion including a plurality of pixels is described below. Here, an example where a liquid crystal element is used as a display element provided in the pixel is shown.

Figure 27A:
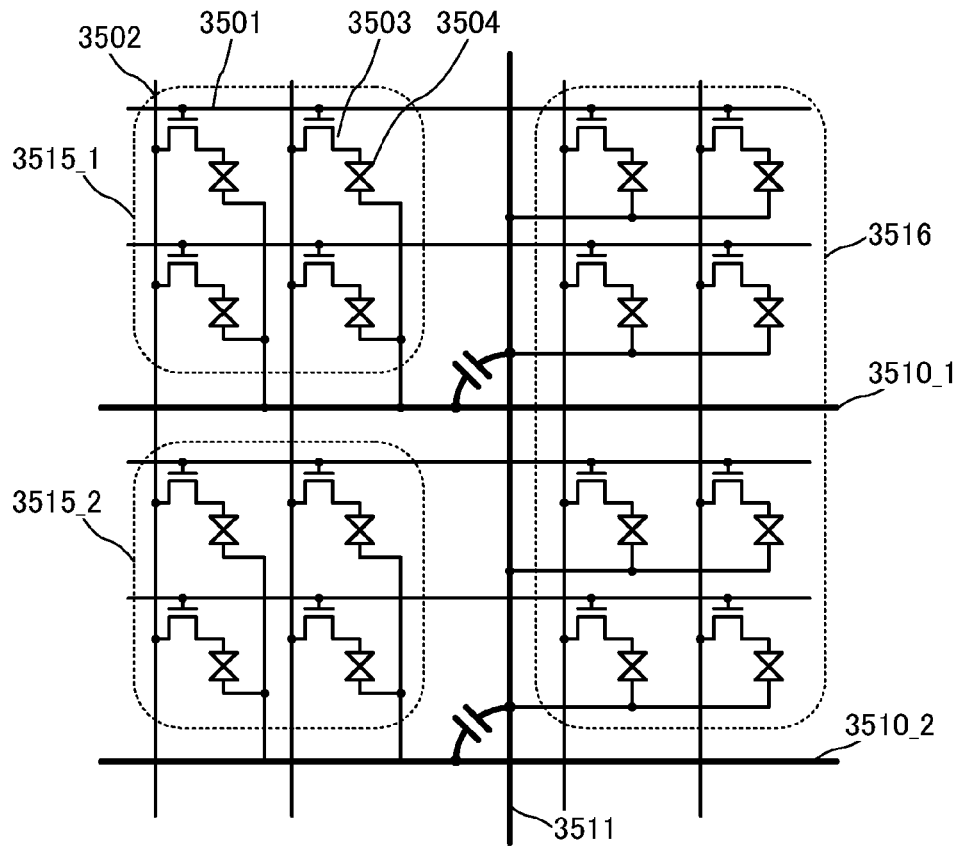
FIGS. 27A and 27B illustrate a pixel provided with a touch sensor of one embodiment of the present invention.

FIG. 27A is an equivalent circuit diagram of part of a pixel circuit provided in the display portion of the touch panel described in this structure example.

Each pixel includes at least a transistor 3503 and a liquid crystal element 3504. In addition, a gate of the transistor 3503 is electrically connected to a wiring 3501 and one of a source and a drain of the transistor 3503 is electrically connected to a wiring 3502.

The pixel circuit includes a plurality of wirings extending in the X direction (e.g., a wiring 3510_1 and a wiring 3510_2) and a plurality of wirings extending in the Y direction (e.g., a wiring 3511). They are provided to intersect with each other, and capacitance is formed therebetween.

Among the pixels provided in the pixel circuit, ones of electrodes of the liquid crystal elements of some pixels adjacent to each other are electrically connected to each other to form one block. The block is classified into two types: an island-shaped block (e.g., a block 3515_1 or a block 3515_2) and a linear block (e.g., a block 3516) extending in the Y direction.

The wiring 3510_1 (or 35102) extending in the X direction is electrically connected to the island-shaped block 3515_1 (or the block 35152). Further, the wiring 3511 extending in the Y direction is electrically connected to the linear block 3516.

Figure 27B:
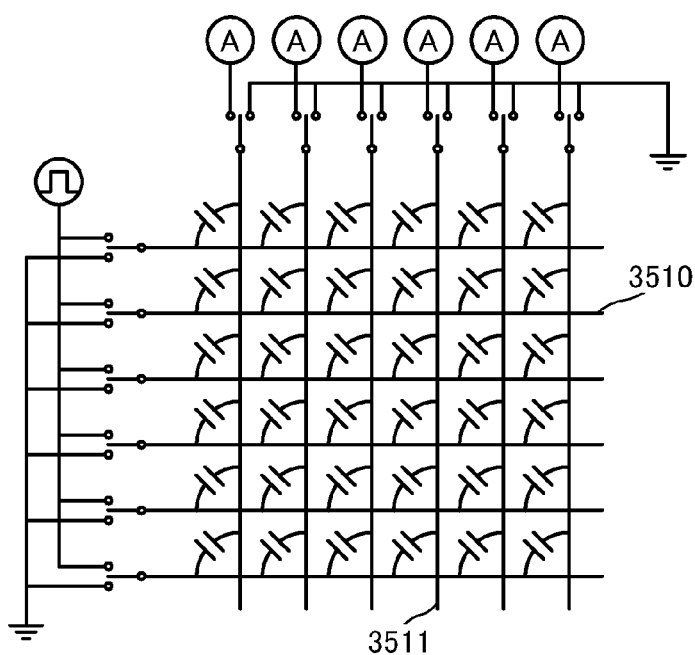

FIG. 27B is an equivalent circuit diagram in which a plurality of wirings 3510 extending in the X direction and the plurality of wirings 3511 extending in the Y direction are illustrated. Input voltage or a common potential can be input to each of the wirings 3510 extending in the X direction. Further, a ground potential can be input to each of the wirings 3511 extending in the Y direction or the wirings 3511 can be electrically connected to the detection circuit.

[Example of Operation of Touch Panel]

Operation of the above-described touch panel is described with reference to FIGS. 28A and 28B and FIG. 29.

Figure 29:
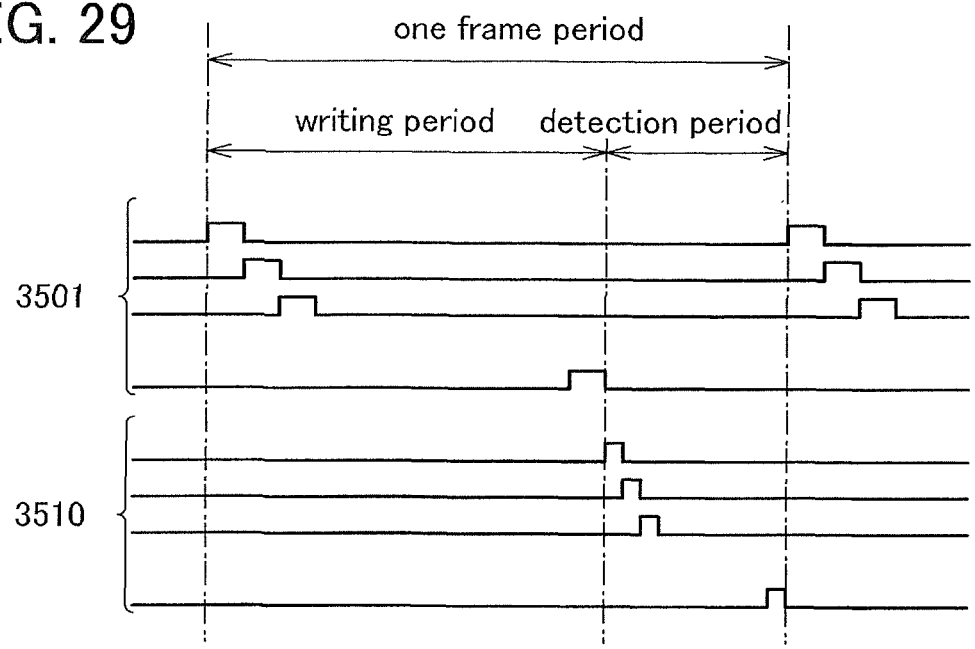
FIG. 29 is a timing chart showing operations of touch sensors and pixels of one embodiment of the present invention.

As illustrated in FIG. 29, one frame period is divided into a writing period and a detecting period. The writing period is a period in which image data is written to a pixel, and the wirings 3510 (also referred to as gate lines) are sequentially selected. On the other hand, the detecting period is a period in which sensing is performed by a touch sensor, and the wirings 3510 extending in the X direction are sequentially selected and input voltage is input.

Figure 28A:
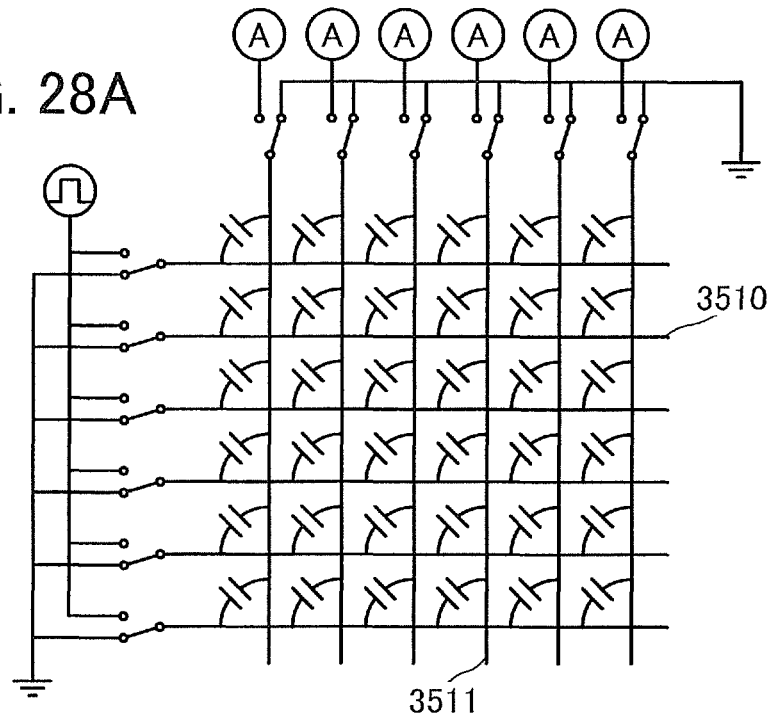
FIGS. 28A and 28B illustrate operations of touch sensors and pixels of one embodiment of the present invention.

FIG. 28A is an equivalent circuit diagram in the writing period. In the writing period, a common potential is input to both the wiring 3510 extending in the X direction and the wiring 3511 extending in the Y direction.

Figure 28B:
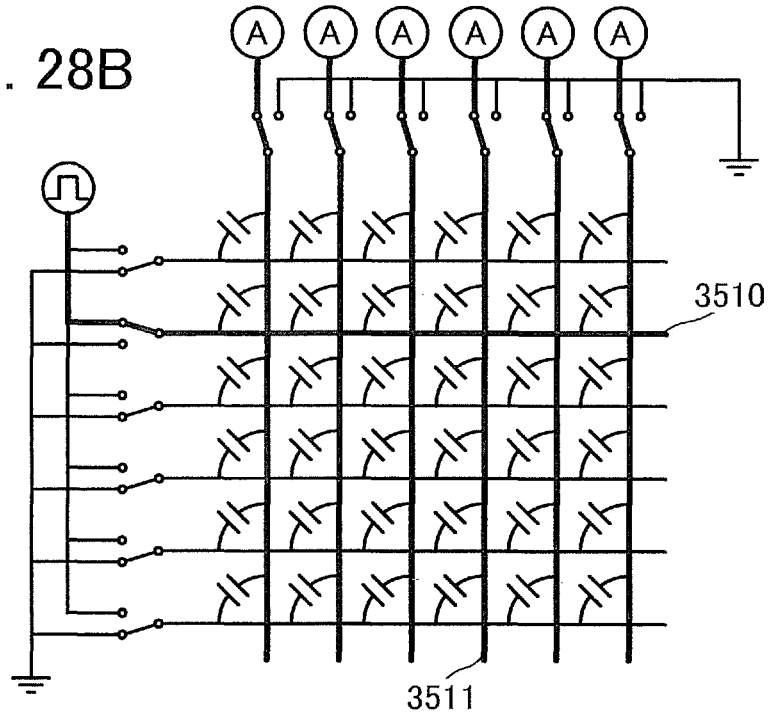

FIG. 28B is an equivalent circuit diagram at some point in time in the detection period. In the detection period, each of the wirings 3511 extending in the Y direction is electrically connected to the detection circuit. Input voltage is input to the wirings 3510 extending in the X direction which are selected, and a common potential is input to the wirings 3510 extending in the X direction which are not selected.

It is preferable that a period in which an image is written and a period in which sensing is performed by a touch sensor be separately provided as described above. Thus, a decrease in sensitivity of the touch sensor caused by noise generated when data is written to a pixel can be suppressed.

[Structure Examples of Pixel]

Structure examples of a pixel which can be used for the above touch panel are described below.

Figure 30A:
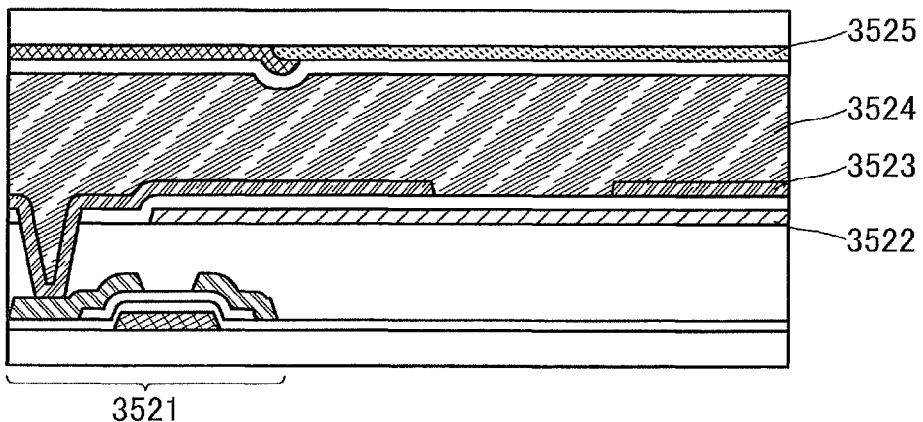
FIGS. 30A to 30C each illustrate a pixel configuration of one embodiment of the present invention.

FIG. 30A is a cross-sectional view illustrating part of a pixel using a fringe field switching (FFS) mode.

The pixel includes a transistor 3521, an electrode 3522, an electrode 3523, a liquid crystal 3524, and a color filter 3525. The electrode 3523 having an opening is electrically connected to one of a source and a drain of the transistor 3521. The electrode 3523 is provided over the electrode 3522 with an insulating layer provided therebetween. The electrode 3523 and the electrode 3522 can each function as one electrode of a liquid crystal element, and by applying a voltage therebetween, alignment of liquid crystals can be controlled.

As the transistor 3521, the transistor of one embodiment of the present invention can be used. For example, either the transistor 100 or the transistor 150 can be used. The details of the above-described liquid crystal display device can be referred to for the electrode 3522, the electrode 3523, the liquid crystal 3524, and the color filter 3525 as appropriate.

For example, the electrode 3522 is electrically connected to the above-described wiring 3510 or wiring 3511; thus, the pixel of the above-described touch panel can be formed.

Note that the electrode 3522 can be provided over the electrode 3523. In that case, the electrode 3522 may have an opening and may be provided over the electrode 3523 with an insulating layer provided therebetween.

Figure 30B:
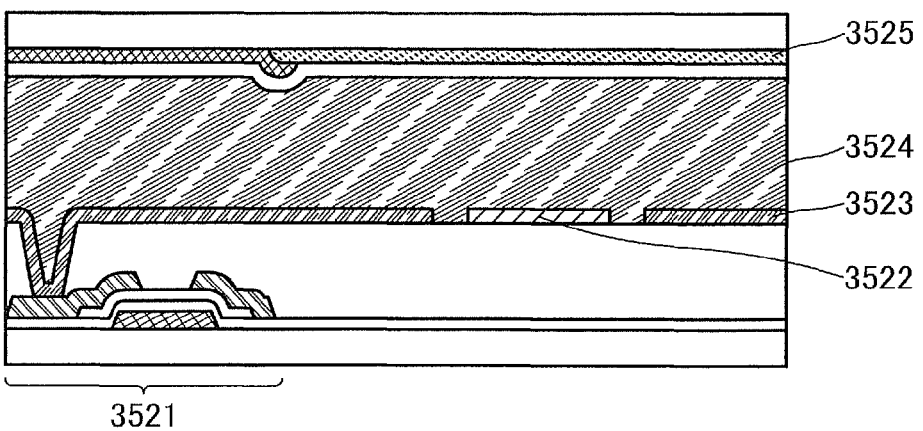

FIG. 30B is a cross-sectional view illustrating part of a pixel having an in-plane-switching (IPS) mode.

The electrode 3523 and electrode 3522 provided in the pixel each have a comb-like shape and are provided on the same plane.

For example, the electrode 3522 is electrically connected to the above-described wiring 3510 or wiring 3511; thus, the pixel of the above-described touch panel can be formed.

Figure 30C:
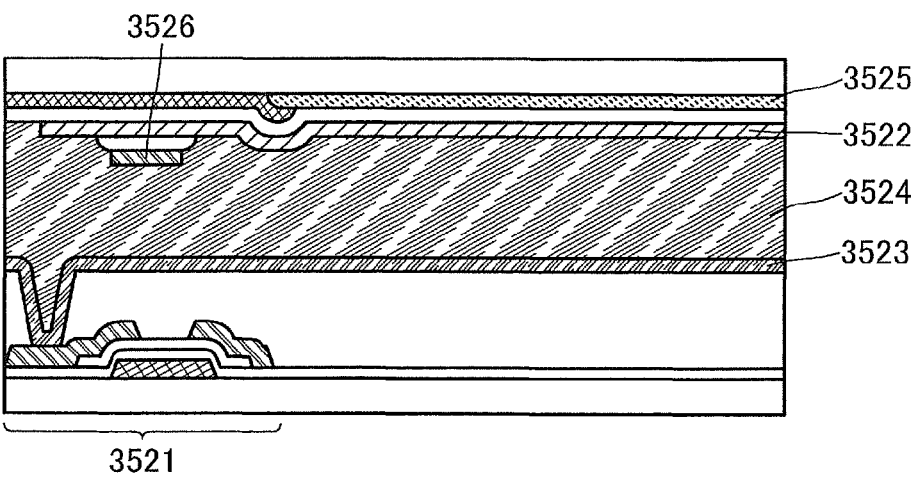

FIG. 30C is a cross-sectional view illustrating part of a pixel having a vertical alignment (VA) mode of a liquid crystal display device.

The electrode 3522 is provided so as to face the electrode 3523 with the liquid crystal 3524 provided therebetween. The wiring 3526 is provided over the electrode 3522. For example, the wiring 3526 can be provided to electrically connect the block including the pixel illustrated in FIG. 30C and blocks different from the block including the pixel illustrated in FIG. 30C.

For example, the electrode 3522 is electrically connected to the above-described wiring 3510 or wiring 3511; thus, the pixel of the above-described touch panel can be formed.

This embodiment can be implemented in appropriate combination with any of the structures described in the other embodiments, example, and reference example.

Embodiment 4

The display device which is one embodiment of the present invention can be applied to a variety of electronic appliances (including game machines). Examples of electronic appliances include a television device (also referred to as television or television receiver), a monitor of a computer or the like, a digital camera, a digital video camera, a digital photo frame, a mobile phone, a portable game machine, a portable information terminal, an audio reproducing device, a game machine (e.g., a pachinko machine or a slot machine), and a game console. Examples of such electronic devices are illustrated in FIGS. 20A to 20C.

Figure 20A:
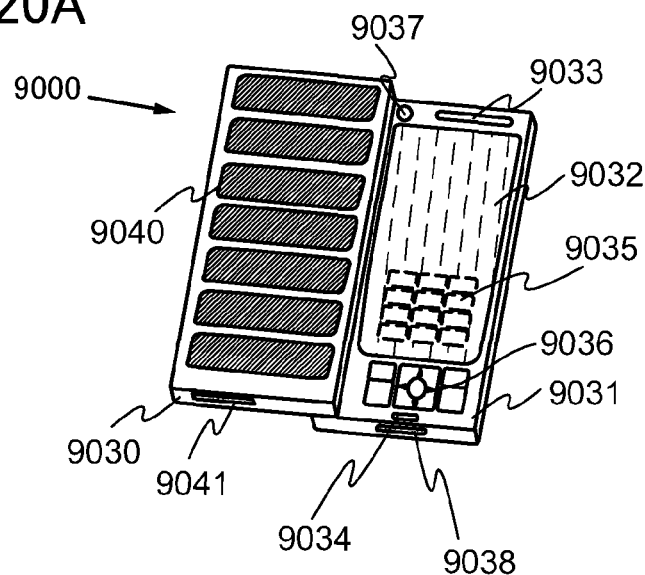
FIGS. 20A to 20C each show an example of an electronic device.
Figure 20B:
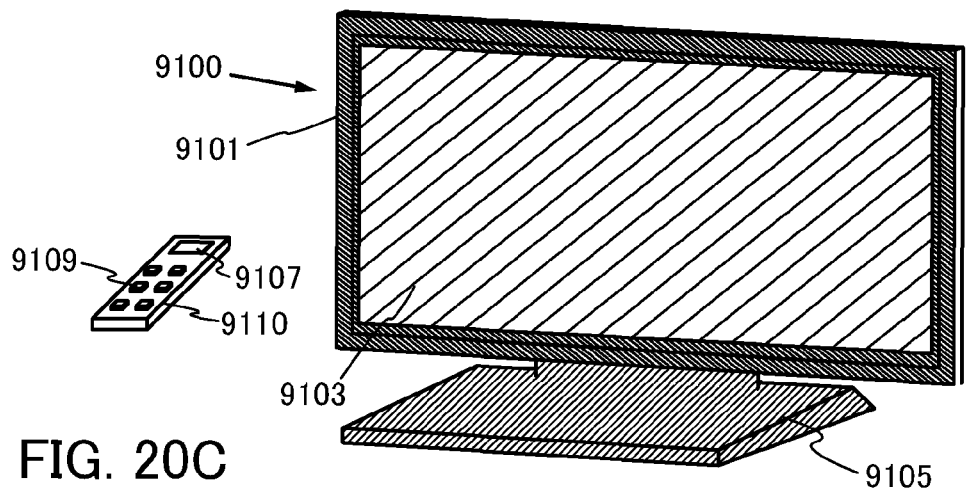
Figure 20C:
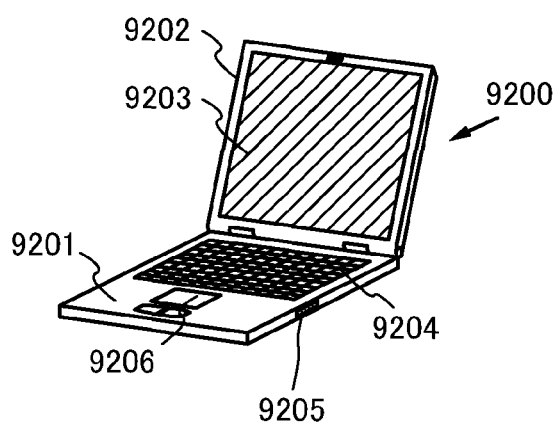

FIG. 20A illustrates an example of a mobile phone 9000. The mobile phone 9000 includes two housings 9030 and 9031. The housing 9031 includes a display panel 9032, a speaker 9033, a microphone 9034, a pointing device 9036, a camera lens 9037, an external connection terminal 9038, and the like. In addition, the housing 9030 includes a solar cell 9040 having a function of charge of the portable information terminal, an external memory slot 9041, and the like. In addition, an antenna is incorporated in the housing 9031. The display device described in the above embodiments is used for the display panel 9032, whereby the display quality of the mobile phone can be improved.

The display panel 9032 is provided with a touch panel. A plurality of operation keys 9035 which is displayed as images is illustrated by dashed lines in FIG. 20A. Note that a boosting circuit by which a voltage output from the solar cell 9040 is increased to be sufficiently high for each circuit is also included.

In the display panel 9032, the display direction can be appropriately changed depending on a usage pattern. Further, the mobile phone is provided with the camera lens 9037 on the same surface as the display panel 9032, and thus it can be used as a video phone. The speaker 9033 and the microphone 9034 can be used for videophone calls, recording and playing sound, and the like as well as voice calls. Moreover, the housings 9030 and 9031 in a state where they are developed as illustrated in FIG. 20A can shift by sliding so that one is lapped over the other; therefore, the size of the mobile phone can be reduced, which makes the mobile phone suitable for being carried.

The external connection terminal 9038 can be connected to an AC adapter and various types of cables such as a USB cable, and charging and data communication with a personal computer or the like are possible. Moreover, a large amount of data can be stored by inserting a storage medium into the external memory slot 9041 and can be moved.

FIG. 20B illustrates a television device 9100. In the television device 9100, a display portion 9103 is incorporated in a housing 9101 and an image can be displayed on the display portion 9103. Note that the housing 9101 is supported by a stand 9105 here.

The television device 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television device 9100 illustrated in FIG. 20B is provided with a receiver, a modem, and the like. With the receiver, general television broadcasts can be received in the television device 9100. Further, when the television device 9100 is connected to a communication network by wired or wireless connection via the modem, one-way (from a transmitter to a receiver) or two-way (between a transmitter and a receiver or between receivers) data communication can be performed.

Any of the display devices described in the above embodiments can be used for the display portions 9103 and 9107. Thus, the television device can have high display quality.

FIG. 20C illustrates a computer 9200. The computer 9200 includes a main body 9201, a housing 9202, a display portion 9203, a keyboard 9204, an external connection port 9205, a pointing device 9206, and the like.

Any of the display devices described in the above embodiments can be used for the display portion 9203. Thus, a computer can have high display quality.

The display portion 9203 has a touch-input function. When a user touches displayed buttons which are displayed on the display portion 9203 of the computer 9200 with his/her fingers or the like, the user can carry out operation of the screen and input of information. Further, when the table may be made to communicate with home appliances or control the home appliances, the display portion 9203 may function as a control device which controls the home appliances by operation on the screen. For example, with the use of the touch panel described in the above embodiment, the display portion 9203 can have a touch-input function.

Figure 21:
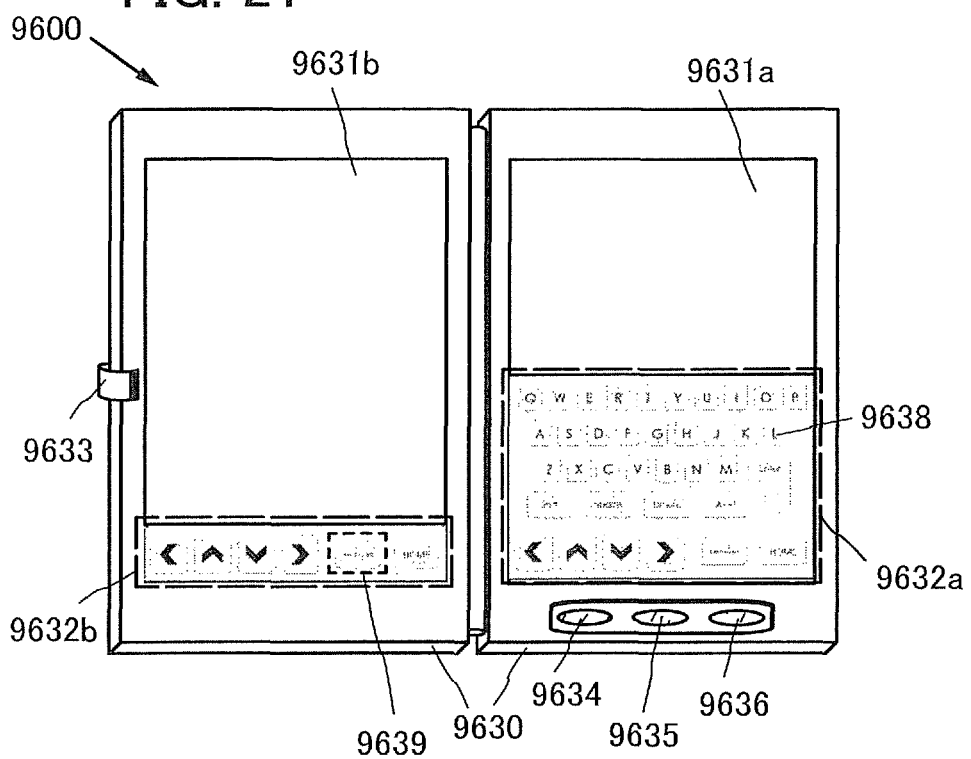
FIG. 21 shows an example of an electronic device.

FIG. 21 illustrates a foldable tablet terminal 9600. In FIG. 21, the tablet terminal 9600 is opened and includes a housing 9630, a display portion 9631a, a display portion 9631b, a display-mode switching button 9634, a power button 9635, a power-saving-mode switching button 9636, and a clip 9633.

Any of the display devices described in the above embodiments can be used for the display portion 9631a and the display portion 9631b. Thus, the display quality of the tablet terminal 9600 can be improved.

Part of the display portion 9631a can be a touch panel region 9632a and data can be input when a displayed operation key panel 9638 is touched. Although a structure in which a half region in the display portion 9631a has only a display function and the other half region also has a touch panel function is illustrated as an example, the structure of the display portion 9631a is not limited thereto. The whole area of the display portion 9631a may have a touch screen function. For example, the while area of the display portion 9631a can display keyboard buttons and serve as a touch screen while the display portion 9631b can be used as a display screen.

Like the display portion 9631a, part of the display portion 9631b can be a touch screen region 9632b. When a keyboard display switching button 9639 displayed on the touch panel is touched with a finger, a stylus, or the like, a keyboard can be displayed on the display portion 9631b.

Touch input can be performed concurrently on the touch screen regions 9632a and 9632b.

The display-mode switching button 9634 can switch display orientation (e.g., between landscape mode and portrait mode) and select a display mode (switch between monochrome display and color display), for example. The power-saving-mode switching button 9636 can control display luminance in accordance with the amount of external light in use of the tablet terminal 9600 detected by an optical sensor incorporated in the tablet terminal 9600. The tablet terminal 9600 may include another detection device such as a sensor for detecting orientation (e.g., a gyroscope or an acceleration sensor) in addition to the optical sensor.

Although the display portion 9631a and the display portion 9631b have the same display area in FIG. 21, one embodiment of the present invention is not limited to this example. The display portion 9631a and the display portion 9631b may have different areas or different display quality.

For example, one of them may be a display panel that can display higher-definition images than the other.

This embodiment can be implemented in appropriate combination with any of the structures described in the other embodiments, example, and reference example.

Example

In this example, the transistor of one embodiment of the present invention is fabricated and the initial electrical characteristics of the transistor are described. A manufacturing process of the transistor is described with reference to FIGS. 3A to 3E.

First, a glass substrate was used as the substrate 101, a 100-nm-thick tungsten film was formed by a sputtering method, a resist mask was formed over the tungsten film by a photolithography process, and part of the tungsten film was etched with the use of the resist mask, so that the gate electrode 110 was formed.

Next, the gate insulating film 106 was formed over the gate electrode 110. In this example, the gate insulating film 106 has a four-layer structure. The gate insulating film 106 includes a 50-nm-thick first silicon nitride film as a first layer, a 300-nm-thick second silicon nitride film as a second layer, a 50-nm-thick third silicon nitride film as a third layer, and a 50-nm-thick silicon oxynitride film as a fourth layer.

The first silicon nitride film was formed under the following conditions: silane with a flow rate of 200 sccm, nitrogen with a flow rate of 2000 sccm, and ammonia with a flow rate of 100 sccm were supplied to a reaction chamber of a plasma CVD apparatus as the source gas; the pressure in the reaction chamber was controlled to 100 Pa, and the power of 2000 W was supplied with the use of a 27.12 MHz high-frequency power source.

The second silicon nitride film was formed under the conditions which are different from the conditions of the source gas of the first silicon nitride film in that the flow rate of ammonia was 2000 sccm.

The third silicon nitride film was formed under the following conditions: silane with a flow rate of 200 sccm and nitrogen with a flow rate of 5000 sccm were supplied to the reaction chamber of the plasma CVD apparatus as the source gas; the pressure in the reaction chamber was controlled to 100 Pa, and the power of 2000 W was supplied with the use of a 27.12 MHz high-frequency power source.

The silicon oxynitride film was formed under the following conditions: silane with a flow rate of 20 sccm and dinitrogen monoxide with a flow rate of 3000 sccm were supplied to the reaction chamber of the plasma CVD apparatus as the source gas; the pressure in the reaction chamber was controlled to 40 Pa, and the power of 100 W was supplied with the use of a 27.12 MHz high-frequency power source.

In each of the forming processes of the first to third silicon nitride films and the silicon oxynitride film, the substrate temperature was 350° C.

FIG. 3A can be referred to for the structure obtained through the steps up to here.

Next, the multilayer film 103 overlapping with the gate electrode 110 with the gate insulating film 106 provided therebetween was formed.

Here, a 35-nm-thick first In—Ga—Zn oxide film was formed over the gate insulating film 106 by a sputtering method, and then, a 20-nm-thick second In—Ga—Zn oxide film was formed over the first In—Ga—Zn oxide film by a sputtering method.

Next, a resist mask was formed over the second In—Ga—Zn oxide film by a photolithography process, and the first In—Ga—Zn oxide film and the second In—Ga—Zn oxide film were partly etched with the resist mask. After that, the first heat treatment was performed, so that the multilayer film 103 was formed.

The first In—Ga—Zn oxide film was formed under the following conditions: a sputtering target where In:Ga:Zn=1:1:1 (atomic ratio) was used; argon with a flow rate of 50 sccm and oxygen with a flow rate of 50 sccm were supplied as a sputtering gas into a reaction chamber of a sputtering apparatus; the pressure in the reaction chamber was controlled to 0.3 Pa; and a direct-current power of 5 kW was supplied. Note that the first In—Ga—Zn oxide film was formed at a substrate temperature of 170° C.

The second In—Ga—Zn oxide film was formed under the following conditions: a sputtering target where In:Ga:Zn=1:3:2 (atomic ratio) was used; argon with a flow rate of 90 sccm and oxygen with a flow rate of 10 sccm were supplied as a sputtering gas into the reaction chamber of the sputtering apparatus; the pressure in the reaction chamber was controlled to 0.3 Pa; and a direct-current power of 5 kW was supplied. Note that the second In—Ga—Zn oxide film was formed at a substrate temperature of 100° C.

As the first heat treatment, heat treatment at 450° C. under a nitrogen atmosphere for one hour was performed, and then heat treatment at 450° C. under a mixed atmosphere of nitrogen and oxygen for one hour was performed.

FIG. 3B can be referred to for the structure obtained through the steps up to here.

Next, the source electrode 104a and the drain electrode 104b were formed to be in contact with the multilayer film 103.

A conductive film was formed over the gate insulating film 106 and the multilayer film 103. As the conductive film, a 400-nm-thick aluminum film was formed over a 50-nm-thick tungsten film, and a 100-nm-thick titanium film was formed over the aluminum film. Then, a resist mask was formed over the conductive film by a photolithography process, and then, the conductive film is partly etched using the resist mask, so that the source electrode 104a and the drain electrode 104b were formed.

Next, after the substrate was moved to a reaction chamber under reduced pressure and heated at 220° C., the substrate was moved to a reaction chamber filled with dinitrogen monoxide. Then, the multilayer film 103 was exposed to oxygen plasma which was generated in such a manner that an upper electrode provided in the reaction chamber was supplied with high-frequency power of 150 W with the use of a 27.12 MHz high-frequency power source.

FIG. 3C can be referred to for the structure obtained through the steps up to here.

Next, a 20-nm-thick third In—Ga—Zn oxide film was formed as the oxide film 105 over the multilayer film 103, the source electrode 104a, and the drain electrode 104b.

The third In—Ga—Zn oxide film was formed under the following conditions: a sputtering target where In:Ga:Zn=1:3:2 (atomic ratio) was used; argon with a flow rate of 90 sccm and oxygen with a flow rate of 10 sccm were supplied as a sputtering gas into the reaction chamber of the sputtering apparatus; the pressure in the reaction chamber was controlled to 0.3 Pa; and a direct-current power of 5 kW was supplied. Note that the third In—Ga—Zn oxide film was formed at a substrate temperature of 100° C.

For the structure obtained through the steps up to here, FIG. 3D can be referred to. Note that in this example, the second heat treatment described in Embodiment 1 was not performed.

Next, after the above plasma treatment, the oxide insulating film 107b was formed over the oxide film 105 without exposure to the air, the third heat treatment was performed, and the nitride insulating film 108 was formed over the oxide insulating film 107b, whereby the insulating film 120 was formed. A 400-nm-thick silicon oxynitride film was formed as the oxide insulating film 107b. A 100-nm-thick silicon nitride film was formed as the nitride insulating film 108. In this example, the oxide insulating film 107a was not formed.

As the oxide insulating film 107b, a 400-nm-thick silicon oxynitride film was formed by a plasma CVD method under the conditions as follows: silane with a flow rate of 200 sccm and dinitrogen monoxide with a flow rate of 4000 sccm were used as the source gas; the pressure in the reaction chamber was 200 Pa; the substrate temperature was 220° C.; and the high-frequency power of 1500 W was supplied to the parallel plate electrodes with the use of a 27.12 MHz high-frequency power source.

As the third heat treatment, heat treatment at 350° C. in a mixed atmosphere of nitrogen and oxygen for one hour was performed.

As the nitride insulating film 108, a silicon nitride film was formed by a plasma CVD method under the conditions as follows: silane with a flow rate of 50 sccm, nitrogen with a flow rate of 5000 sccm, and ammonia with a flow rate of 100 sccm were used as the source gas, the pressure in the reaction chamber was 100 Pa, the substrate temperature was 350° C., and the high-frequency power of 1000 W was supplied to parallel plate electrodes.

Through the above steps, a transistor which is one embodiment of the present invention was formed. Further, in this example, 20 transistors having the same structure were formed on the substrate. Note that in each of the fabricated transistors, the channel length (L) is 6 μm and the channel width (W) is 50 μm.

Next, initial Vg–Id characteristics of the fabricated transistors were measured. Here, change in characteristics of current flowing between a source electrode and a drain electrode (hereinafter referred to as the drain current), that is, Vg–Id characteristics were measured under the following conditions: the substrate temperature was 25° C., the potential difference between the source electrode and the drain electrode (hereinafter referred to as the drain voltage) was 1 V or 10 V, and the potential difference between the source electrode and the gate electrode (hereinafter referred to as the gate voltage) were changed from −20 V to +15 V.

Figure 31:
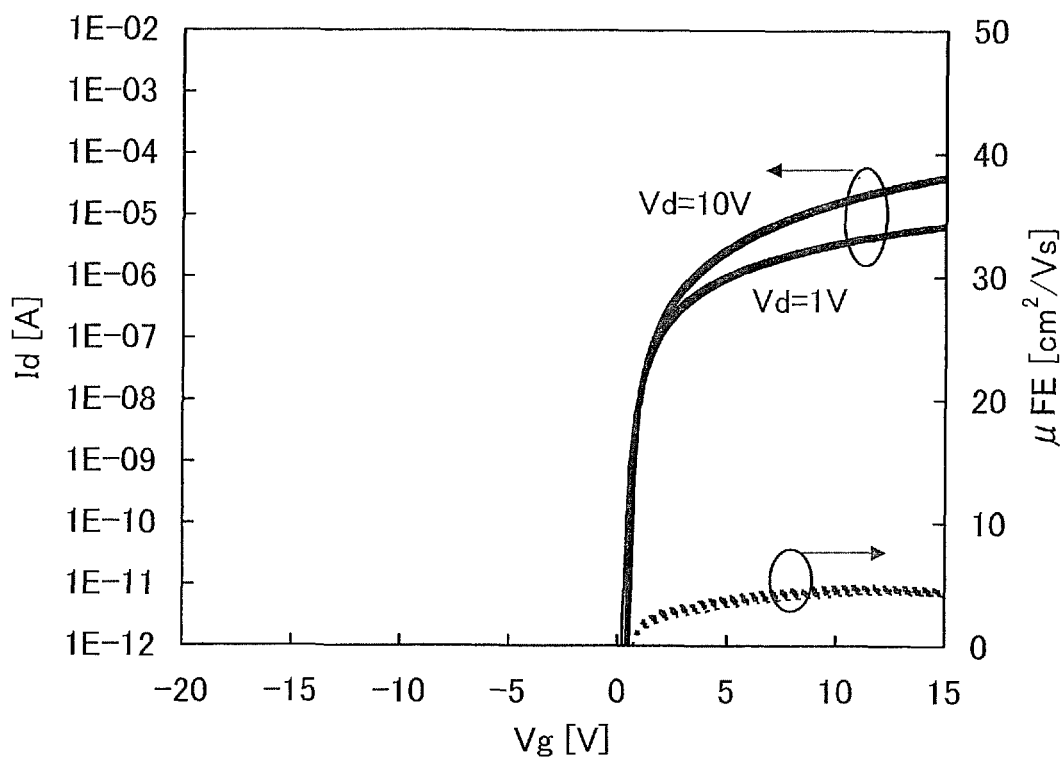
FIG. 31 shows $V_g$–$I_d$ characteristics of a transistor.

FIG. 31 shows Vg–Id characteristics of the fabricated transistors. In FIG. 31, the horizontal axis indicates the gate voltage Vg and the vertical axis indicates the drain current Id. Further, the solid lines indicate the Vg–Id characteristics at the drain voltages Vd of 1 V and 10 V, and the dashed line indicates the field-effect mobility with respect to the gate voltages at the drain voltage Vd of 10 V. Note that the field effect mobility was obtained by operation of each sample in a saturation region.

According to FIG. 31, it was confirmed that the transistor of one embodiment of the present invention operates without causing defects.

Reference Example

Results of physical property analysis of the multilayer film 103 described in Embodiment 2 are described.

[Silicon Concentration in Multilayer Film]

First, the silicon concentration in each of the films included in the multilayer film 103 is described with reference to FIG. 22.

Here, a sample in which the multilayer film 103 was formed over a silicon wafer was fabricated and the silicon concentration in the multilayer film was measured by time-of-flight secondary ion mass spectrometry (ToF-SIMS).

The oxide film 103c was formed over the silicon wafer. The oxide film 103c is an oxide film formed by a sputtering method using an In—Ga—Zn oxide (having an atomic ratio of In:Ga:Zn=1:3:2) target. Note that an argon gas (flow rate: 30 sccm) and an oxygen gas (flow rate: 15 sccm) were used as a sputtering gas, the pressure was set to 0.4 Pa, the substrate temperature was set to 200° C., and a DC power of 0.5 kW was applied.

The oxide semiconductor film 103a was formed over the oxide film 103c. The oxide semiconductor film 103a is an oxide semiconductor film formed by a sputtering method using an In—Ga—Zn oxide (having an atomic ratio of In:Ga:Zn=1:1:1) target. Note that an argon gas (flow rate: 30 sccm) and an oxygen gas (flow rate: 15 sccm) were used as a sputtering gas, the pressure was set to 0.4 Pa, the substrate temperature was set to 300° C., and a DC power of 0.5 kW was applied.

The oxide film 103b was formed over the oxide semiconductor film 103a. The oxide film 103b is an oxide film formed by a sputtering method using an In—Ga—Zn oxide (having an atomic ratio of In:Ga:Zn=1:3:2) target. Note that an argon gas (flow rate: 30 sccm) and an oxygen gas (flow rate: 15 sccm) were used as a sputtering gas, the pressure was set to 0.4 Pa, the substrate temperature was set to 200° C., and a DC power of 0.5 kW was applied.

After that, heat treatment was performed at 450° C. for two hours, so that Sample A was obtained. In addition, as a comparative example, Sample B in which heat treatment is not performed after the formation of the oxide film 103b was prepared. ToF-SIMS was performed on Sample A and Sample B. FIG. 22 shows the secondary ion intensities of In, Ga, and Zn in a depth direction, and the silicon concentration [atoms/cm$^3$] in a depth direction which was converted from the secondary ion intensity of SiO$_3$. In the multilayer film 103 of each of Sample A and Sample B, the thickness of the oxide semiconductor film 103a was 10 nm and the thickness of the oxide film 103b was 10 nm.

Figure 22:
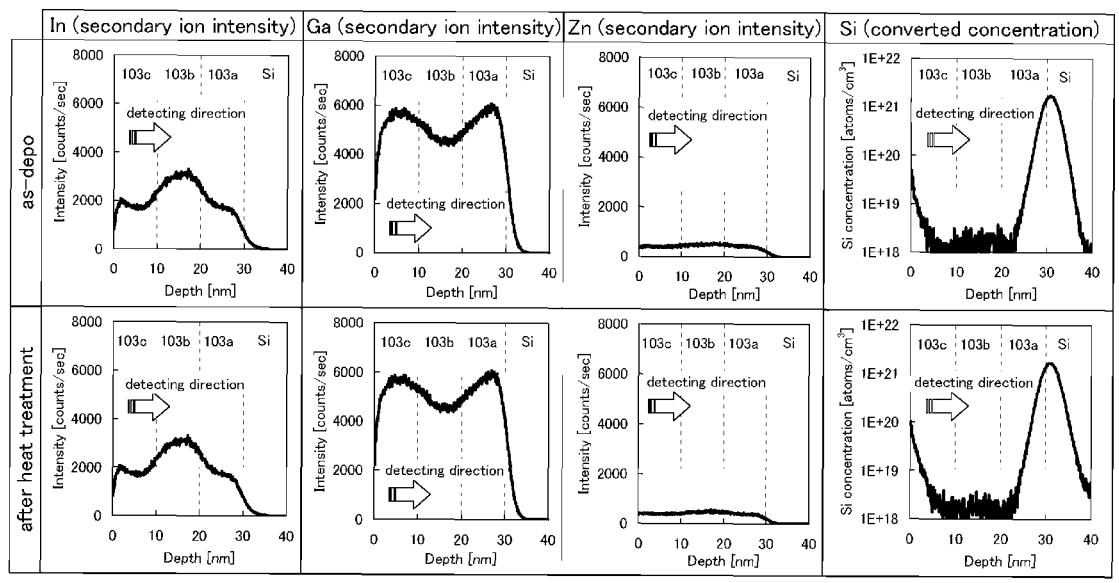
FIG. 22 shows time-of-flight secondary ion mass spectrometry (ToF-SIMS) results of a multilayer film.

FIG. 22 shows that the compositions of the films included in the multilayer film 103 are changed depending on the compositions of the respective targets used at the time of the deposition. Note that the compositions of the films cannot be simply compared using FIG. 22.

FIG. 22 indicates that the interface between the silicon wafer and the oxide semiconductor film 103a of the multilayer film 103 and the top surface of the oxide film 103b have high SiO$_3$ concentrations. Moreover, FIG. 22 shows that the concentration of SiO$_3$ in the oxide semiconductor film 103a is about $1\times10^{18}$ atoms/cm$^3$, which is the lower limit of detection in ToF-SIMS. This is probably because, owing to the existence of the oxide films 103b and 103c, the oxide semiconductor film 103a is not influenced by silicon due to the silicon wafer or the surface contamination.

Further, comparison of the sample subjected to the heat treatment with an as-deposited sample (the sample not subjected to heat treatment, referred to as "as-depo" in FIG. 22) indicates that silicon is not likely to be diffused through the heat treatment though entry of silicon occurs at the time of deposition.

Since the oxide semiconductor film 103a was provided between the oxide film 103b and the oxide film 103c so as not to be in direct contact with the insulating film containing silicon such as the gate insulating film 106, silicon in the insulating film can be prevented from entering the oxide semiconductor film 103a.

[CPM Measurement of Localized Level]

Next, results of measurement of the density of localized levels of the multilayer film 103 by a constant photocurrent method are described. The density of localized levels in the multilayer film 103 is reduced, whereby the transistor using the multilayer film 103 can have stable electrical characteristics.

In order that the transistor has high field-effect mobility and stable electrical characteristics, the absorption coefficient due to localized levels of the multilayer film 103 measured by CPM is preferably lower than $1\times10^{-3}$ cm$^{-1}$, further preferably lower than $3\times10^{-4}$ cm$^{-1}$.

The measured sample was a sample in which the multilayer film 103 was formed over the silicon wafer.

The oxide film 103c was formed over the silicon wafer. The oxide film 103c is an oxide film formed by a sputtering method using an In—Ga—Zn oxide (having an atomic ratio of In:Ga:Zn=1:3:2) target. Note that an argon gas (flow rate: 30 sccm) and an oxygen gas (flow rate: 15 sccm) were used as a formation gas, the pressure was set to 0.4 Pa, the substrate temperature was set to 200° C., and a DC power of 0.5 kW was applied.

The oxide semiconductor film 103a was formed over the oxide film 103c. The oxide semiconductor film 103a is an oxide semiconductor film formed by a sputtering method using an In—Ga—Zn oxide (having an atomic ratio of In:Ga:Zn=1:1:1) target. Note that an argon gas (flow rate: 30 sccm) and an oxygen gas (flow rate: 15 sccm) were used as a formation gas, the pressure was set to 0.4 Pa, the substrate temperature was set to 200° C., and a DC power of 0.5 kW was applied.

The oxide film 103b was formed over the oxide semiconductor film 103a. The oxide film 103b is an oxide film formed by a sputtering method using an In—Ga—Zn oxide (having an atomic ratio of In:Ga:Zn=1:3:2) target. Note that an argon gas (flow rate: 30 sccm) and an oxygen gas (flow rate: 15 sccm) were used as a formation gas, the pressure was set to 0.4 Pa, the substrate temperature was set to 200° C., and a DC power of 0.5 kW was applied.

Here, in order to improve the accuracy of the CPM measurement, the multilayer film 103 needs to have a certain thickness. Specifically, the thicknesses of the oxide film 103c, the oxide semiconductor film 103a, and the oxide film 103b which are included in the multilayer film 103 were set to 30 nm, 100 nm, and 30 nm, respectively.

Figure 23A:
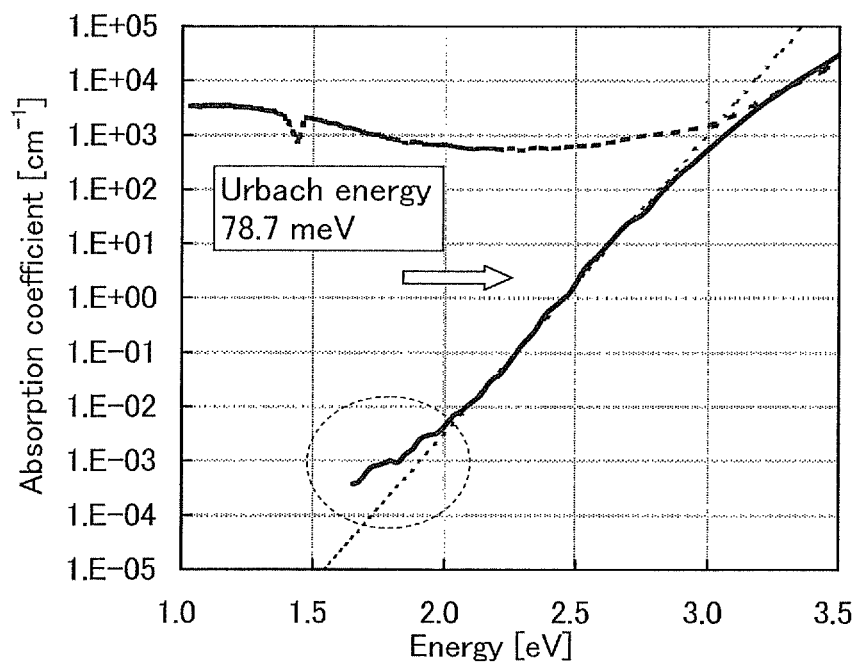
FIGS. 23A and 23B show CPM measurement results of a multilayer film.
Figure 23B:
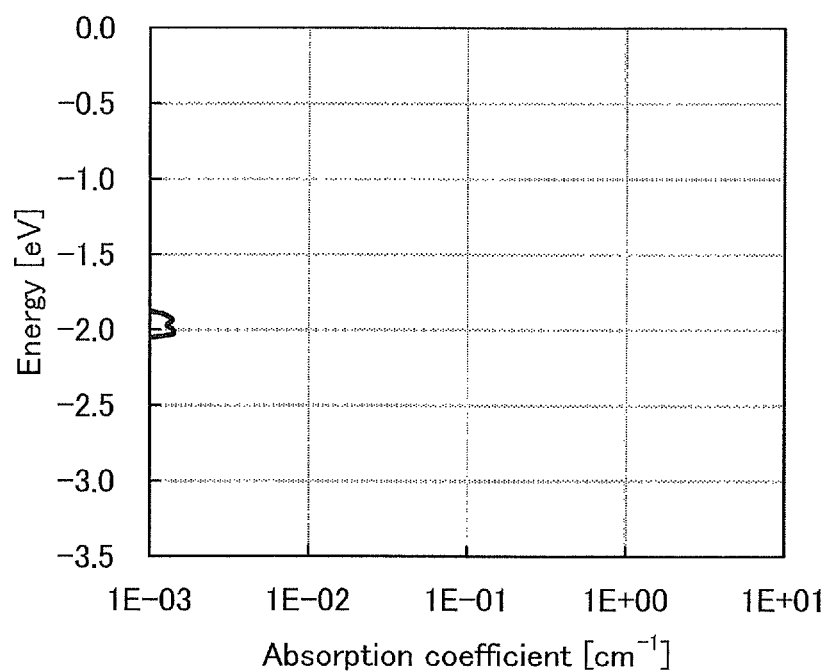

FIG. 23A shows results of fitting the absorption coefficient (dotted line) measured using a spectrophotometer and the absorption coefficient (solid line) measured by CPM in the range of energy higher than or equal to the energy gap of each layer in the multilayer film 103. Note that the Urbach energy obtained based on the absorption coefficient measured by CPM was 78.7 meV. The integral value of the absorption coefficient in the energy range was derived in such a manner that a background (thin dotted line) was subtracted from the absorption coefficient measured by CPM in the energy range shown with a dashed line circle in FIG. 23A (see FIG. 23B). As a result, the absorption coefficient due to the localized levels of this sample was found to be $2.02\times10^{-4}$ cm$^{-1}$.

The localized levels obtained here are probably due to an impurity or a defect. From the above, the multilayer film 103 has an extremely low density of levels due to an impurity or a defect. That is, the transistor including the multilayer film 103 has high field-effect mobility and stable electrical characteristics.

This application is based on Japanese Patent Application serial no. 2012-261919 filed with Japan Patent Office on Nov. 30, 2012, the entire contents of which are hereby incorporated by reference.

What is claimed is:

1. A semiconductor device comprising:
   a first gate electrode;
   a first insulating film over the first gate electrode;
   an oxide semiconductor film comprising gallium over the first insulating film;
   a first oxide film over and in contact with the oxide semiconductor film;
   a source electrode and a drain electrode over the first oxide film;
   a second oxide film over and in contact with the first oxide film, the source electrode, and the drain electrode;
   a second insulating film over the second oxide film; and
   a second gate electrode over the second insulating film,
   wherein each of the first oxide film and the second oxide film comprises indium, gallium, and zinc,
   wherein in a channel length direction the oxide semiconductor film is smaller than the first gate electrode, and
   wherein in a channel width direction the oxide semiconductor film is smaller than the first gate electrode.

2. The semiconductor device according to claim 1, wherein a taper angle of an end portion of the oxide semiconductor film is smaller than a taper angle of an end portion of the first oxide film.

3. The semiconductor device according to claim 1, wherein in the channel length direction, a length of the first gate electrode is larger than a length of the second gate electrode.

4. The semiconductor device according to claim 1, wherein the oxide semiconductor film, the first oxide film, and the second oxide film each comprise same metal elements.

5. The semiconductor device according to claim 1,
   wherein electron affinity of the second oxide film is the same as electron affinity of the first oxide film, and
   wherein the electron affinity of the second oxide film is lower than electron affinity of the oxide semiconductor film.

6. The semiconductor device according to claim 1,
   wherein electron affinity of the second oxide film is lower than electron affinity of the first oxide film, and
   wherein the electron affinity of the second oxide film is lower than electron affinity of the oxide semiconductor film.

7. The semiconductor device according to claim 1, wherein the second insulating film contains excess oxygen.

8. The semiconductor device according to claim 1, wherein the second insulating film is a stack of an oxide insulating film and a nitride insulating film.

9. A semiconductor device comprising:
   a first gate electrode;
   a first insulating film over the first gate electrode;
   a first oxide film over the first insulating film;
   an oxide semiconductor film comprising gallium over the first oxide film;
   a second oxide film over and in contact with the oxide semiconductor film;
   a source electrode and a drain electrode over the second oxide film;

a third oxide film over and in contact with the second oxide film, the source electrode, and the drain electrode;

a second insulating film over the third oxide film; and a second gate electrode over the second insulating film, wherein each of the first oxide film, the second oxide film, and the third oxide film comprises indium, gallium, and zinc, wherein in a channel length direction the oxide semiconductor film is smaller than the first gate electrode, and wherein in a channel width direction the oxide semiconductor film is smaller than the first gate electrode.

10. The semiconductor device according to claim 9, wherein a taper angle of an end portion of the oxide semiconductor film is smaller than a taper angle of an end portion of the first oxide film and a taper angle of an end portion of the second oxide film.

11. The semiconductor device according to claim 9, wherein in the channel length direction, a length of the first gate electrode is larger than a length of the second gate electrode.

12. The semiconductor device according to claim 9, wherein the oxide semiconductor film, the first oxide film, the second oxide film, and the third oxide film each comprise same metal elements.

13. The semiconductor device according to claim 9,
wherein electron affinity of the third oxide film is the same as electron affinity of the first oxide film and electron affinity of the second oxide film, and
wherein the electron affinity of the third oxide film is lower than electron affinity of the oxide semiconductor film.

14. The semiconductor device according to claim 9,
wherein electron affinity of the third oxide film is lower than electron affinity of the first oxide film and electron affinity of the second oxide film, and
wherein the electron affinity of the first oxide film and the electron affinity of the second oxide film are lower than electron affinity of the oxide semiconductor film.

15. The semiconductor device according to claim 9,
wherein electron affinity of the third oxide film is the same as electron affinity of the second oxide film,
wherein the electron affinity of the third oxide film is higher than electron affinity of the first oxide film, and
wherein the electron affinity of the third oxide film is lower than electron affinity of the oxide semiconductor film.

16. The semiconductor device according to claim 9,
wherein electron affinity of the third oxide film is the same as electron affinity of the first oxide film,
wherein the electron affinity of the third oxide film is lower than electron affinity of the second oxide film, and
wherein the electron affinity of the third oxide film is lower than electron affinity of the oxide semiconductor film.

17. The semiconductor device according to claim 9, wherein the second insulating film contains excess oxygen.

18. The semiconductor device according to claim 9, wherein the second insulating film is a stack of an oxide insulating film and a nitride insulating film.

* * * * *